(12) United States Patent
Hayano et al.

(10) Patent No.: US 6,706,452 B2
(45) Date of Patent: Mar. 16, 2004

(54) METHOD OF MANUFACTURING PHOTOMASK AND METHOD OF MANUFACTURING SEMICONDUCTOR INTEGRATED CIRCUIT DEVICE

(75) Inventors: Katsuya Hayano, Akishima (JP); Norio Hasegawa, Hinode (JP)

(73) Assignee: Hitachi, Ltd., Tokyo (JP)

( * ) Notice: Subject to any disclaimer, the term of this patent is extended or adjusted under 35 U.S.C. 154(b) by 162 days.

(21) Appl. No.: 10/026,772

(22) Filed: Dec. 27, 2001

(65) Prior Publication Data

US 2002/0081502 A1 Jun. 27, 2002

(30) Foreign Application Priority Data

Dec. 27, 2000 (JP) ........................................ 2000-399210

(51) Int. Cl.⁷ ............................... G03F 9/00; G03C 5/00
(52) U.S. Cl. ........................... 430/5; 430/312; 430/314; 430/315; 430/328; 430/394; 430/942; 430/945
(58) Field of Search ........................... 430/5, 296, 312, 430/315, 328, 394, 942, 945

(56) References Cited

U.S. PATENT DOCUMENTS

| 4,684,971 A | 8/1987 | Payne |
| 5,376,483 A | 12/1994 | Rolfson |
| 5,378,585 A | 1/1995 | Watanabe |
| 5,389,474 A | 2/1995 | Iguchi et al. |
| 5,418,092 A | 5/1995 | Okamoto |
| 5,556,724 A | 9/1996 | Tarumoto et al. |
| 5,741,613 A | 4/1998 | Moon et al. |
| 5,948,572 A | 9/1999 | Liu et al. |
| 5,989,760 A | 11/1999 | Mangat et al. |

FOREIGN PATENT DOCUMENTS

| JP | 56-30129 | 3/1981 |
| JP | 59-22050 | 2/1984 |
| JP | 5-289307 | 11/1993 |
| JP | 2000-17196 | 1/2000 |

OTHER PUBLICATIONS

Patent Abstracts of Japan 2000017196 A Jan. 18, 2000.
Nikkei Microdevices, Apr. 2000, issued on Apr. 1, 2000, pps. 145–146.
Nikkei Microdevices, May 2000, issued on May 1, 2000, pps. 143–152.

*Primary Examiner*—Christopher G. Young
(74) *Attorney, Agent, or Firm*—Antonelli, Terry, Stout & Kraus, LLP

(57) ABSTRACT

Disclosed is a technique capable of connecting patterns of a master mask easily. Integrated circuit patterns are transferred onto pattern transfer regions of a product mask by the reduced projection exposure using a plurality of IP masks. Thereafter, the patterns of the adjacent pattern transfer regions are connected by a light-shielding pattern made of an organic film, which is formed by the exposure using an energy beam.

37 Claims, 45 Drawing Sheets

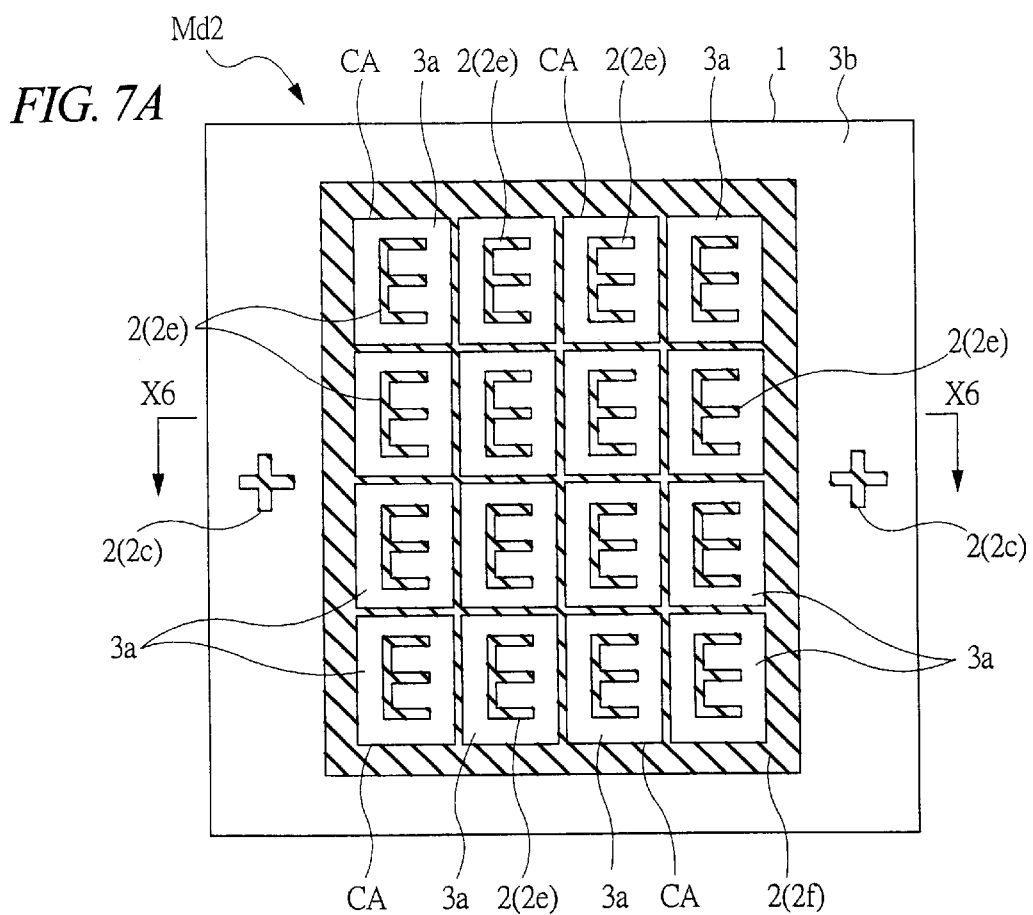
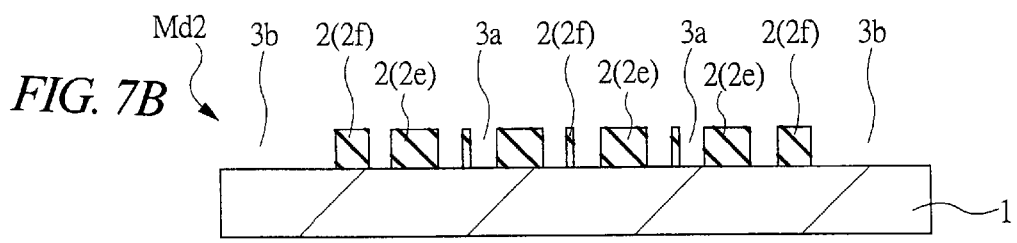
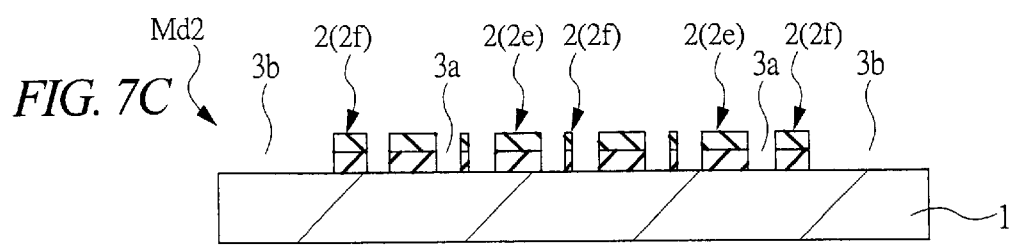
FIG. 7A
FIG. 7B
FIG. 7C

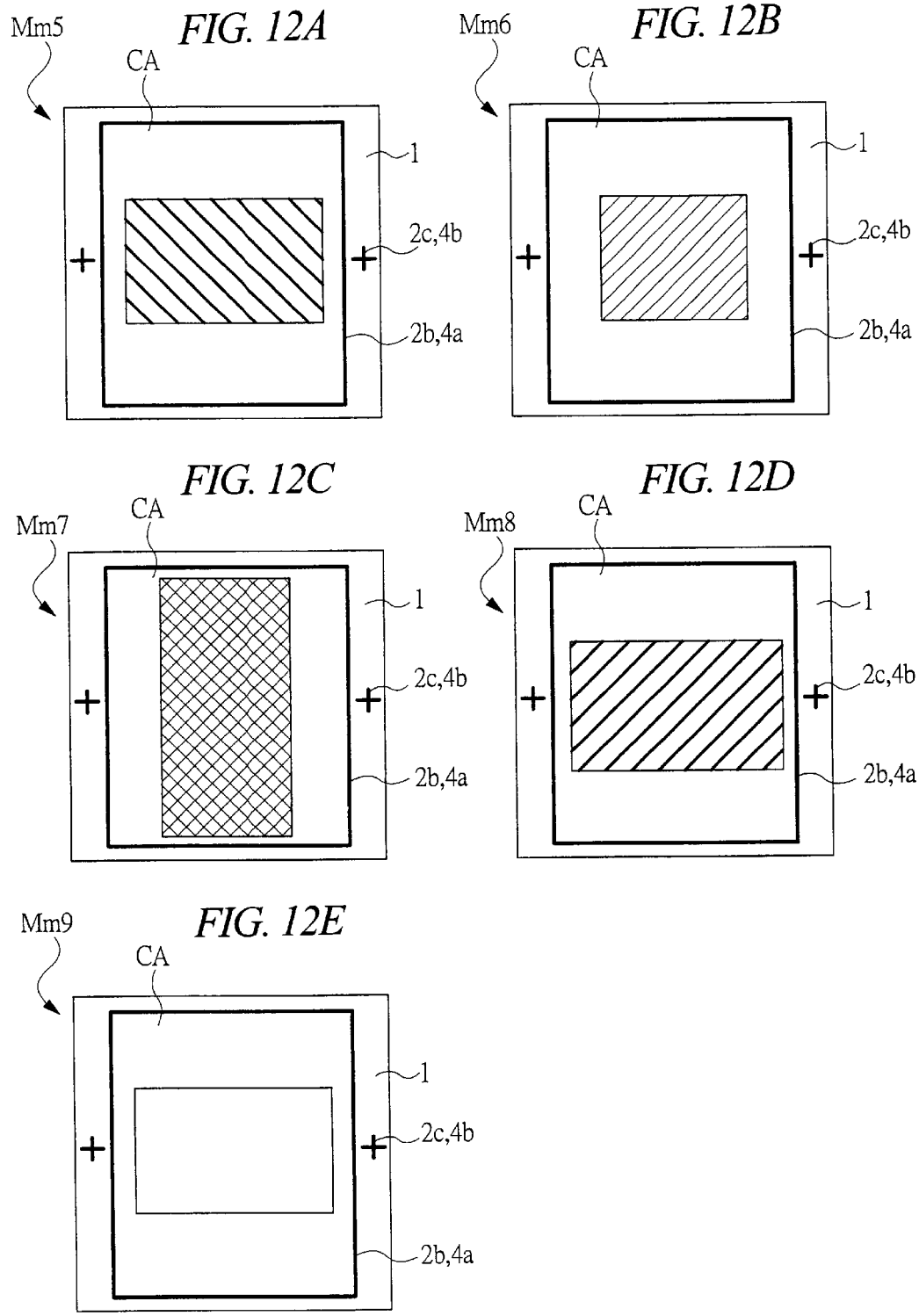

FIG.14A
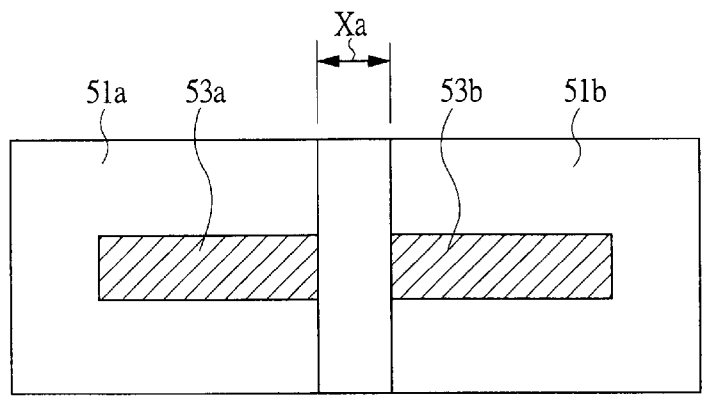
FIG.14B  Xa > 0
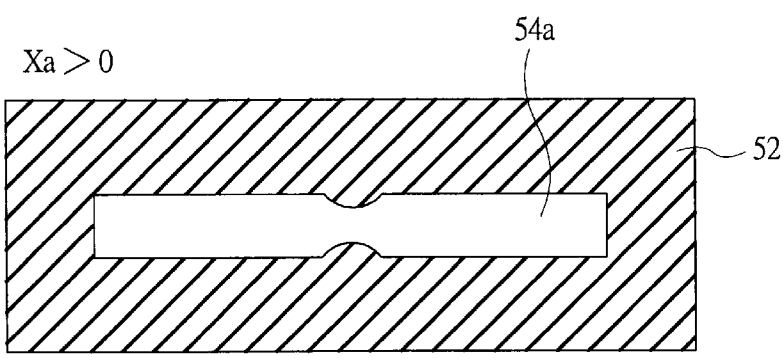
FIG.14C  Xa < 0
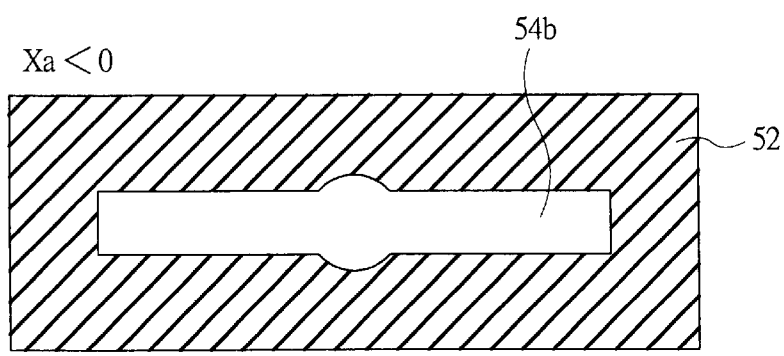

METHOD OF MANUFACTURING PHOTOMASK AND METHOD OF MANUFACTURING SEMICONDUCTOR INTEGRATED CIRCUIT DEVICE

TECHNICAL FIELD OF THE INVENTION

The present invention relates to a method of manufacturing a photomask and a technique for manufacturing a semiconductor integrated circuit device. Particularly, the present invention relates to a technique effectively applicable to a photolithography (hereinafter, referred to as lithography) technique, in which a predetermined pattern is transferred onto a semiconductor wafer (hereinafter, referred to as a wafer) by the exposure using a photomask (hereinafter, referred to as a mask) in a manufacturing process of a semiconductor integrated circuit device.

BACKGROUND OF THE INVENTION

With the increasing demand for further scaling down of dimensions and the integration of patterns such as an element and circuit wiring, the increase in the mask cost has become a problem. This is caused by the various factors as follows: since the scaling down of dimensions and the high accuracy are required also in mask patterns even under the circumstance where the market size of the mask manufacturing field is small and the mask manufacturing is not commercially viable, a costly pattern writing apparatus and an inspection apparatus are required and the equipment cost and the running cost thereof become enormous; it becomes necessary to introduce novel technologies such as a phase shift technology and an optical proximity correction technology; and the defect rate of the mask is increased due to the scaling down of the pattern. With the improvement in the performance of the semiconductor integrated circuit device, the total number of masks required to manufacture one semiconductor integrated circuit device tends to increase. This tendency also causes an important problem to be solved, that is, how to reduce the mask cost.

Techniques for solving such problems are disclosed in, for example, pp. 145 and 146 of "Nikkei Micro Device, April-2000 issue" issued on Apr. 1, 2000, by the Nikkei Business Publications, Inc., pp. 142 to 152 of "Nikkei Micro Device, May-2000 issue" issued on May 1, 2000, by the Nikkei Business Publications, Inc., and Japanese Patent Application Laid-Open No. 2000-17196. In these descriptions, disclosed are techniques in which a mask serving as a master (master mask) having high writing accuracy in dimensions is manufactured, patterns of the master mask are transferred onto a daughter mask using a reduced projection exposure apparatus, and the pattern is transferred onto a wafer using the daughter mask. Specifically, masks (master mask and daughter mask) are manufactured according to the process as follows.

Firstly, a mask substrate for a master mask is prepared. On this mask substrate, for example, a metal film such as chromium and a resist film are deposited in this order from below. Subsequently, after a pattern twenty times as large as the design rule is written on the resist film on the master mask, the lower metal film is patterned by the etching method using a resist pattern formed by the development as an etching mask, and thus the master mask is manufactured. Thereafter, a mask substrate for the daughter mask, which is identical to that for the master mask, is prepared. Subsequently, after the mask pattern of the master mask is written on a resist film of the mask substrate for the daughter mask using the reduced projection exposure apparatus such as an i-beam stepper, the metal film is etched similarly to the case of the master mask, and thus the daughter mask is manufactured. In this technique, the costly electron beam writing system is not required. Therefore, the reduction of the mask cost can be promoted.

SUMMARY OF THE INVENTION

However, the inventors of the present invention found out that the manufacturing technique of the mask (master mask and daughter mask) described above had a problem as follows.

Specifically, in the case where patterns are transferred onto one daughter mask using a plurality of master masks, it is very difficult to connect the patterns transferred using the plurality of master masks to each other.

An object of the present invention is to provide a technique capable of connecting the patterns transferred using the master masks to each other.

Another object of the present invention is to provide a technique capable of improving the reliability of the connection between the patterns transferred using the master masks.

Still another object of the present invention is to provide a technique capable of improving the reliability of a semiconductor integrated circuit device.

Still another object of the present invention is to provide a technique capable of improving the defect rate of a semiconductor integrated circuit device.

Other objects and novel characteristics of the present invention will be apparent according to the description and the accompanying drawings of this specification.

The outline of the typical one of the inventions disclosed in this application will be described as follows.

Specifically, the present invention includes the steps of: transferring a first pattern onto a photosensitive organic film of a second mask by the reduced projection exposure using a first mask; and transferring a second pattern by the exposure using an energy beam onto the photosensitive organic film of the second mask between the regions transferred using the first mask.

Also, the present invention includes the steps of: transferring a first pattern onto a photosensitive first organic film of a second mask by the reduced projection exposure using a first mask; performing the development to the photosensitive first organic film, thereby forming the first pattern made of the first organic film, then patterning a lower metal film using the first pattern as an etching mask; depositing a photosensitive second organic film on a mask substrate of the second mask; transferring a second pattern by the exposure using an energy beam onto the photosensitive second organic film of the second mask between the regions transferred using the first mask; and performing the development to the second organic film, thereby forming the second pattern made of the second organic film.

Also, the present invention includes the steps of: transferring a first pattern onto a photosensitive organic film of a second mask by the reduced projection exposure using a first mask; transferring a second pattern by the exposure using an energy beam onto the photosensitive organic film of the second mask between the regions transferred using the first mask; and performing the development to the photosensitive organic film, thereby forming the first and second patterns, then patterning a lower metal film using the first and second patterns as etching masks.

Also, the present invention includes:

(a) a step of preparing a set of first masks;

(b) a step of preparing one mask substrate of a second mask;

(c) a step of depositing a photosensitive organic film on the one mask substrate of the second mask;

(d) a first exposure step in which each pattern in integrated circuit patterns of the plurality of first masks is transferred onto a photosensitive organic film on the one mask substrate of the second mask by the reduced projection exposure, whereby a plurality of first regions corresponding to each of the integrated circuit pattern regions of the plurality of first masks are arranged in an integrated circuit pattern region of the one mask substrate of the second mask while interposing second regions between the adjacent first regions;

(e) a second exposure step in which an energy beam is selectively irradiated onto the photosensitive organic film in the second region of the second mask, thereby writing a predetermined pattern on the photosensitive organic film; and (f) a step of performing the development to the photosensitive organic film, thereby forming a pattern made of the photosensitive organic film on the second mask.

Also, the present invention includes the step of: transferring a pattern onto a wafer by the reduced projection exposure using the second mask.

Also, the present invention includes the step of: processing a lower film of a mask using the pattern as a mask, which is transferred onto the wafer by the reduced projection exposure using the second mask.

Also, the present invention includes the step of: introducing predetermined impurities into the wafer using the pattern as a mask, which is transferred onto the wafer by reduced projection exposure using the second mask.

BRIEF DESCRIPTION OF THE DRAWINGS

FIG. 7A is a plan view of another photomask used in the method of manufacturing a semiconductor integrated circuit device according to the embodiment of the present invention, FIG. 7B is a cross-sectional view taken along the line X6—X6 of FIG. 7A, and FIG. 7C is a cross-sectional view showing a structure of a modification example of FIG. 7B;

FIG. 12A to FIG. 12E are general plan views of examples of the photomasks used for manufacturing the semiconductor integrated circuit device of FIG. 11, namely, FIG. 12A shows a mask used in the transfer of circuit region 10$a$ of FIG. 11, FIG. 12B shows a mask used in the transfer of circuit region 10$b$ of FIG. 11, FIG. 12C shows a mask used in the transfer of circuit region 10$c$ of FIG. 11, FIG. 12D shows a mask used in the transfer of circuit region 10$d$ of FIG. 11, and FIG. 12E shows a mask used in the transfer of circuit region 10$e$ of FIG. 11;

FIGS. 14A to 14C are explanatory diagrams showing dislocation in connecting the adjacent pattern transfer regions on a photomask, which has been studied by the inventors of the present invention, namely, FIG. 14A is an enlarged plan view of a portion between different pattern transfer regions of a product mask, and FIG. 14B is a plan view of a resist pattern transferred using the product mask shown in FIGS. 14A and 14C is also a plan view of a resist pattern transferred using the product mask shown in FIG. 14A;

FIG. 17A is an enlarged plan view showing the principal portion of the semiconductor wafer of FIG. 15, and FIG. 17B is a cross-sectional view of FIG. 17A;

DESCRIPTION OF THE PREFERRED EMBODIMENTS

Figure 1:
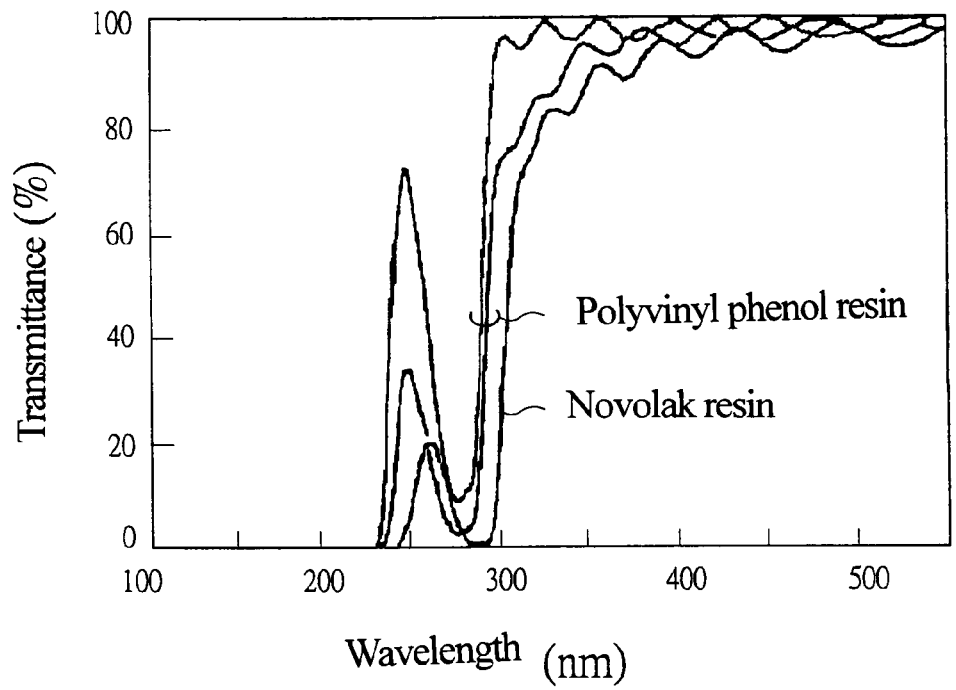
FIG. 1 is a graph showing light transmittance of a resist film formed on a photomask used in a method of manufacturing a semiconductor integrated circuit device according to an embodiment of the present invention with respect to lights of various exposure wavelengths.

In advance of the detail description of the present invention in this application, technical terms employed in this application will be described as follows.

1. IP (Intellectual Property): A circuit block or a functional block capable of reusing a circuit functional block, which has already been designed and which operation has been verified, as a design property. To be concrete, a macro cell can be enumerated.

2. Macro Cell: A circuit block or a functional block, which is superior to a basic cell in performance, is large scale, and is dedicated to a specific application. The macro cell is classified into a hard macro cell having a fixed mask pattern and a soft macro cell in which library data is limited to the net list representation and the mask pattern thereof is created in every design decision. As the macro cell, a standard cell (polycell) showing a small-scale logic gate and having a constant height, a module cell such as: RAM (Random Access Memory) having a regular layout structure and automatically generated in accordance with an input parameter by a module generator; a ROM (Read Only Memory); PLA (Programmable Logic Array); a multiplier; an accumulator; and a data path, a CPU (Central Processing Unit), an analog cell, I/O (Input/Output) cell and the like are enumerated. With respect to the macro cell, in addition to the mask pattern data, data such as cell frame data and terminal data for automatic wiring, and functional model, logic model, delay parameter and the like for simulation are registered to a design system (computer or the like) as a cell library. Such data are easily read out from the cell library and used in such a case of the simulation or the like. As an example of the RAM, DRAM (Dynamic RAM), SRAM (Static RAM), and FRAM (Ferroelectric RAM) are enumerated. In addition, as an example of the ROM, mask POM, flash memory (EEPROM; Electric Erasable Programmable ROM) and the like are enumerated.

3. Mask (Photomask): A mask made by forming a pattern for shielding light and a pattern for shifting a phase of light on a mask substrate. It includes a reticle having a pattern several times as large as a pattern of the actual size formed thereon. A first main surface of the mask indicates a pattern surface on which the pattern for shielding light and the pattern for shifting the phase of light are formed, and a second main surface of the mask indicates the other side of the first main surface (i.e., a reverse surface).

4. Product Mask: A kind of above-described mask, which is called a daughter mask or an intermediate mask and is used to transfer a pattern onto a substrate to be transferred such as a wafer.

5. Master Mask: A kind of above-described mask, which is used to transfer the pattern onto the product mask, and on which a pattern several times as large as that of the product mask is formed. IP (Intellectual Property) mask in the embodiments is also one of the master masks.

6. Normal Mask: A kind of above-described mask. It indicates a normal mask in which a mask pattern is formed of a light-shielding pattern made of metal and a transparent pattern on a mask substrate.

7. Resist Mask: A kind of above-described mask. It indicates a mask having a light-shielding member (light-shielding film, light-shielding pattern, and light-shielding region or the like) made of an organic film on a mask substrate. Specifically, the resist mask in this application is the one obtained by performing the patterning of a film having a photosensitive resist as a base by the exposure using an energy beam such as electron beam (ion beam) and light (ultraviolet light such as vacuum ultraviolet light, far ultraviolet light, and near ultraviolet light and visible light) or the photolithography technique. A light-blocking film completely or partly blocks visible light and ultraviolet light such as vacuum ultraviolet light, far ultraviolet light, and near ultraviolet light. Photosensitivity is an inherent attribute of the resin itself, and an emulsion mask or the like in which added composition such as silver halide mainly forms the photosensitivity is not included in the resist mask mentioned here in principle. However, it goes without saying that a variety of additives including the foregoing may be contained in the resist mask.

8. The pattern surfaces of the masks (normal mask and resist mask mentioned above) are classified into the regions below. A region in which integrated circuit pattern to be transferred is arranged is referred to as an "integrated circuit pattern region", and an outer peripheral region thereof is referred to as a "peripheral region". A plurality of chip regions are arranged in this integrated circuit pattern region.

9. When "light-shielding member", "light-shielding region", "light-shielding film", and "light-shielding pattern" are mentioned, it means that they have an optical property that exposure light irradiated onto the regions thereof is penetrated by 40% or less. Generally, the one capable of penetrating the light by several % to not more than 30% is used. On the other hand, if "transparent", "transparent film", "transparent region", and "transparent pattern" are mentioned, it means that they have an optical property that exposure light irradiated onto the regions is penetrated by 60% or more. Generally, the one capable of penetrating the light by 90% or more is used.

10. Wafer: A wafer includes a single crystal silicon substrate (having an approximately flat, round shape in general), a sapphire substrate, a glass substrate, other insulating or semi-insulating substrate, a semiconductor substrate, and a substrate made by combination thereof, which are used in the fabrication of an integrated circuit. In addition, a semiconductor integrated circuit device in this application is not limited to the one made on the semiconductor or insulating substrate such as the silicon wafer and the sapphire substrate, and it includes the one made on other insulating substrate such as glass, for example, TFT (Thin Film Transistor) and STN (Super-Twisted-Nematic) liquid crystal unless clearly specified to the contrary.

11. Device Surface: A main surface of a wafer. It indicates a surface on which a device pattern corresponding to a plurality of chip regions is formed by the lithography.

12. Transferred Pattern: A pattern transferred onto a wafer by a mask. Concretely, it indicates a photoresist pattern (hereinafter, referred to as a resist) or a pattern actually formed on a wafer by using a photoresist pattern as a mask.

13. Resist Pattern: A film pattern formed by patterning a photosensitive resin film (resist film) by the photolithography method. Note that this pattern includes a mere resist film having no openings with respect to the portion concerned.

14. Normal Illumination: An undeformed illumination. It indicates an illumination having relatively uniform light intensity distribution.

15. Deformed Illumination: An illumination whose illuminance at the central portion is lowered. It includes oblique illumination, annular illumination, multi-pole illumination such as 4-pole illumination and 5-pole illumination, or a super resolution technique by a pupil filter equivalent to the foregoing illuminations.

16. Scanning Exposure: An exposure method in which thin slit-shaped exposure band is moved (scanning) relatively and continuously on a wafer and a mask in the orthogonal direction to the longitudinal direction of the slit (may be moved in the diagonal direction), and then a circuit pattern on the mask is transferred onto a desired position on the wafer. The apparatus performing this exposure method is a scanner.

17. Step and Scan Exposure: An exposure method for performing the exposure to the entire portion to be exposed on a wafer by using the scanning exposure and a stepping exposure in combination. It represents a narrower concept of the scanning exposure.

18. Step and Repeat Exposure: An exposure method in which a wafer is repeatedly stepped relative to a projected image of a circuit pattern on a mask, and thus the circuit pattern on the mask is transferred onto a desired position on the wafer. The apparatus performing this exposure method is a stepper.

In the embodiments described below, the description will be made after being divided into a plurality of sections or embodiments when required as a matter of convenience. However, these sections or embodiments are not irrelevant to each other unless clearly specified to the contrary, and the one relates to the entire or a part of the other as a modification example, details, or a supplementary explanation thereof.

Also, in the embodiments described below, when referring to the number of an element (including number of pieces, values, amount, range, or the like), the number of the element is not limited to a specific number unless clearly specified or except the case where the number is apparently limited to a specific number in principle. The number larger or smaller than the specified number is applicable.

Further, in the embodiments described below, it goes without saying that the components (including element steps) are not always indispensable unless clearly specified or except the case where the components are apparently indispensable in principle.

Similarly, in the embodiments described below, when the shape of the components, positional relation thereof, and the like are mentioned, the substantially approximate and similar shapes and the like are included therein unless clearly specified to the contrary or except the case where it can be conceived that they are apparently excluded in principle. This condition is also applicable to the numerical value and the range described above.

Also, the components having the same function are added by the same reference symbol in the entire drawings for describing the embodiments, and repetitive descriptions thereof are omitted.

Also, in the drawings used in the embodiments, the light-shielding members (light-shielding film, light-shielding pattern, light-shielding region, and the like) are hatched so as to make the drawings easy to see even in the plan view.

Hereinafter, the embodiments of the present invention will be described in detail based on the drawings.

(First Embodiment)

The method of manufacturing a semiconductor integrated circuit device according to the embodiment has been made in order to manufacture a desired semiconductor integrated circuit device by transferring a pattern of an IP mask (first photomask) onto a product mask (second photomask) using a reduced projection exposure apparatus, and then transferring the pattern of the product mask onto a wafer using the reduced projection exposure apparatus.

Firstly, the description will be made for a basic structure of the method of manufacturing a semiconductor integrated circuit device. In this embodiment, basically, both of a normal mask and a resist mask, alternatively, either of them are used as an IP mask, and a resist mask is used as a product mask.

The basic resist mask is a technology utilizing the property of an organic film such as a resist film, that is, a mask effect (light-reducing or light-shielding effect) to exposure light such as ArF excimer laser (wavelength: 193 nm). FIG. 1 shows a spectral transmittance of a standard electron beam resist film, for example, polyphenol resin or novolak resin used in the mask writing or the like. Also, in FIG. 1, the spectral transmittance in the case of setting the film thickness of the electron beam resist films as about 100 nm is exemplified. The electron beam resist films have light transmittance of about 0 for, for example, the light having the wavelength of about 150 to 230 nm. Therefore, it can be understood that the electron beam resist films have sufficient mask effect to, for example, ArF excimer laser having the wavelength of 193 nm, $F^2$ laser having the wavelength of 157 nm, and the like. Note that the mask using the resist film as a light-shielding member is disclosed in Japanese Patent Application Laid-Open No. 5-289307.

Next, an example of the IP mask constituted of the resist mask will be described with reference to FIGS. 2 to 5. FIGS. 2A, 3A, 4A, and 5A are general plan views of IP masks Mm1 to Mm4. FIGS. 2B, 3B, 4B, and 5B are cross-sectional views taken along the lines X1—X1, X2—X2, X3—X3, and X4—X4 of FIGS. 2A, 3A, 4A, and 5A, respectively. FIGS. 2C, 3C, 4C, and 5C are cross-sectional views of modification examples. Note that though FIGS. 2A, 3A, 4A, and 5A are plan views, the light-shielding members therein are hatched so as to make the drawings easy to see. In this case, the light-shielding member made of an organic film is hatched with thick lines and the light-shielding member made of metal is hatched with thin lines. Also, in FIGS. 2 to 5, the patterns of the IP masks Mm1 to Mm4 are schematically shown as the alphabet E so as to simplify the description. In an actual case, lines and a rectangular pattern for forming wiring and electrodes, a hole pattern for forming a thorough hole and a contact hole, and a pattern for forming a mask used in the impurity introduction are formed. In addition, in FIGS. 2 to 5, the cases where one integrated circuit pattern region CA is arranged on each of the IP masks Mm1 to Mm4 are exemplified. However, the arrangement of the integrated circuit pattern region CA is not limited to these, and a plurality of integrated circuit pattern regions CA may be arranged. Also, in FIGS. 2 to 5, the case where one integrated circuit pattern region CA corresponds to a forming region of one semiconductor chip (hereinafter, referred to as chip) is exemplified.

In the IP masks Mm1 to Mm4, for example, patterns four to five times as large as those of later-described product masks are formed. Since the patterns of the IP masks Mm1 to Mm 4 are four or five times as large as those of the product masks, high pattern forming accuracy and high dimensional precision can be achieved. Also, since variance in dimension can be reduced by the extent proportional to the reduction rate in the transfer of the pattern onto the product mask, the dimensional precision on the product mask can be made extremely high. In addition, the occurrence of the defects can be reduced. Accordingly, it becomes possible to manufacture the products requiring higher dimensional precision of the pattern. The magnification is set depending on that of the reduced projection exposure apparatus used to form the product mask, and is not particularly limited to that described above. A mask substrate 1 constituting each of the IP masks Mm1 to Mm4 is made of, for example, a transparent synthetic quartz glass substrate having a thickness of about 6 mm in the shape of a parallelogram.

The IP mask Mm1 of FIG. 2 exemplifies the case where light-shielding patterns 2 (2a, 2b, and 2c) on a first main surface of the mask substrate 1 are all constituted of organic films. The light-shielding patterns 2 have a characteristic of absorbing (light-shielding or light-reducing) exposure light such as g-beam (wavelength: 436 nm), i-beam (wavelength: 365 nm), KrF excimer laser (wavelength: 248 nm), ArF excimer laser (wavelength: 193 nm), and $F_2$ laser (wavelength: 157 nm). Also, the light-shielding patterns 2 have an approximately the same mask effect as a light-shielding member made of metal such as chromium. The light-shielding pattern 2a is a pattern for transferring the integrated circuit pattern onto the product mask and is arranged on a transparent region 3a of the integrated circuit pattern region CA in the central portion of the first main surface of the mask substrate 1. The light-shielding pattern 2b is a pattern for defining the area of the integrated circuit pattern region CA and is arranged in the peripheral region of the integrated circuit pattern region CA so as to edge the outer periphery of the same. In this IP mask Mm1, the light-shielding pattern 2b is formed in the stripe shape and the outer peripheral region thereof serves as a transparent region 3b. The light-shielding patterns 2c exemplified by a flat-cross shape arranged in the transparent region 3b serve as alignment marks used in aligning the two dimensional position between the IP mask Mm1 and the reduced projection exposure apparatus. A joint surface of a base of a pellicle is joined while being contacted to the mask substrate 1 in the outer periphery of the light-shielding pattern 2b. Therefore, the occurrence of problems such as the exfoliation of the pellicle and the generation of the foreign object at the time of detachment of the pellicle can be avoided.

Figure 2A:
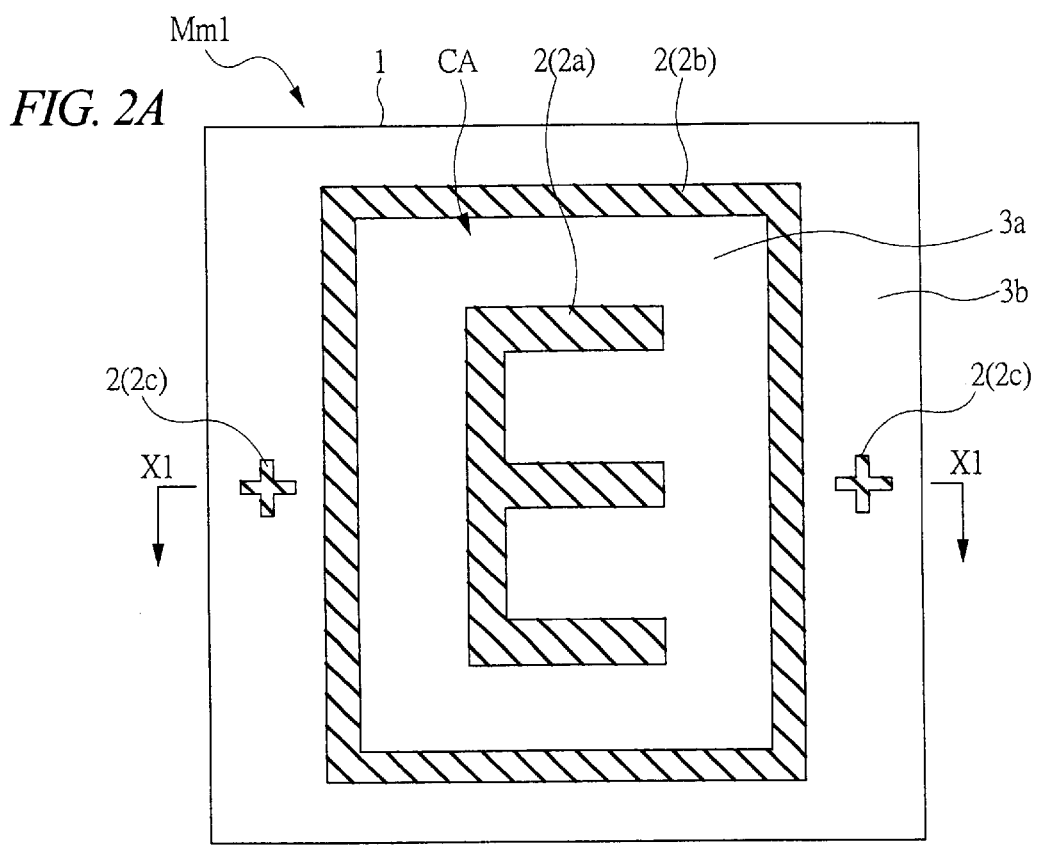
FIG. 2A is a plan view of the photomask used in the method of manufacturing a semiconductor integrated circuit device according to the embodiment of the present invention.
Figure 2B:
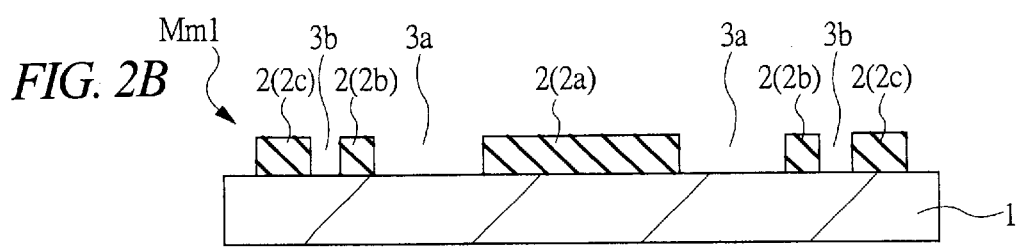
FIG. 2B is a cross-sectional view taken along the line X1—X1 of FIG. 2A.

FIG. 2B exemplifies the case where the light-shielding patterns 2 are formed of a single film of the electron beam resist film. As a material of the electron beam resist film, a substance mainly made of, for example, copolymer of α-methylstyrene and α-chloroacrylic acid, novolak resin and quinone diazide, novolak resin and polymethylpentene-1-sulfone, and chloromethyl-polystyrene is used. A so-called chemical amplification resist made by mixing an inhibitor and an acid generator into phenol resin such as polyvinyl phenol resin or novolak resin is also used. Any substances can be used as the material of the light-shielding resist film used in this embodiment if they have a light-shielding property for a light source of the projection exposure apparatus and a photosensitivity to the light source of the pattern writing apparatus in the mask manufacturing process, that is, photosensitivity to the electron beam or the light having the wavelength of 230 nm or longer. Therefore, the material of the light-shielding resist film is not limited to the foregoing substances and various changes can be made therein. In the case where the polyphenol resin or novolak resin is deposited to the thickness of about 100 nm, since the light transmittance for the light having the wavelength of about 150 nm to 230 nm is almost 0, it can be understood that such resin has sufficient mask effect to, for example, the ArF excimer laser, $F^2$ laser, and the like. Although vacuum-ultraviolet light having the wavelength of 200 nm or shorter is employed as an object in this embodiment, the light used therein is not limited to this. The exposure light having the wavelength of longer than 200 nm such as g-beam, i-beam, and KrF excimer laser is also applicable thereto. In this case, it is necessary that other electron beam resist film material is used or that an absorbing member having a light-absorbing property to the exposure light or a light-shielding member having a light-shielding property to the exposure light is added to the resist film. By so doing, even if the light-shielding patterns 2 are formed of a single film of the electron beam resist film, the light-shielding patterns 2 can have a sufficient mask effect to the exposure light having the wavelength of 200 nm or longer, for example, g-beam, i-beam, and KrF excimer laser. Note that the technique for forming a light-shielding pattern by the use of an organic film is disclosed in Japanese Patent Application No. 11-185221 (filed on Jun. 30, 1999) by the inventors of this application.

Figure 2C:
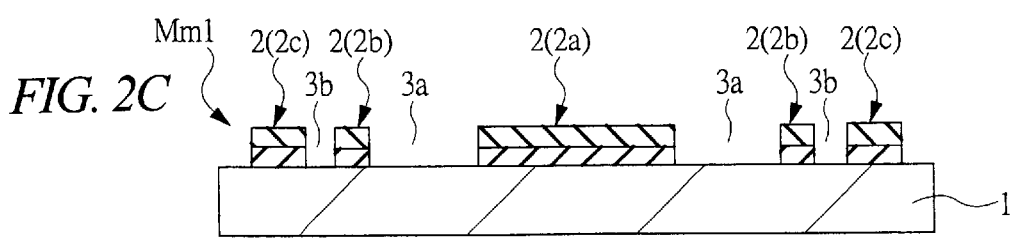
FIG. 2C is a cross-sectional view showing a structure of a modification example of FIG. 2B.

Also, exemplified in FIG. 2C is the case where the light-shielding patterns 2 are formed of a layered film made by depositing the electron beam resist film described in FIG. 2 B on a light-absorbing organic film. The light-absorbing organic film is made of, for example, an antireflection film such as polyimide resin and is made of a material having a light-absorbing property, light-reducing property, or a light-shielding property to the exposure light having the wavelength of 200 nm or longer. Therefore, the light-shielding patterns 2 can have a sufficient mask effect to the exposure light having the wavelength of 200 nm or longer. The light-shielding pattern 2 having the layered structure as described above is manufactured in such a manner as follows. Firstly, a predetermined pattern is written using an electron beam on an electron beam resist film. Subsequently, development thereof is performed to form a resist pattern of the electron beam resist film. At this time, a light-absorbing organic film as a lower layer is patterned self-aligningly using the resist pattern as a mask. Note that a technique for forming a light-shielding film by the use of a layered film made of a light-absorbing organic film and a photosensitive organic film is disclosed in Japanese Patent Applications No. 2000-328159 and No. 2000-328160 (both filed on Oct. 27, 2000) by the inventors of this application.

Figure 3A:
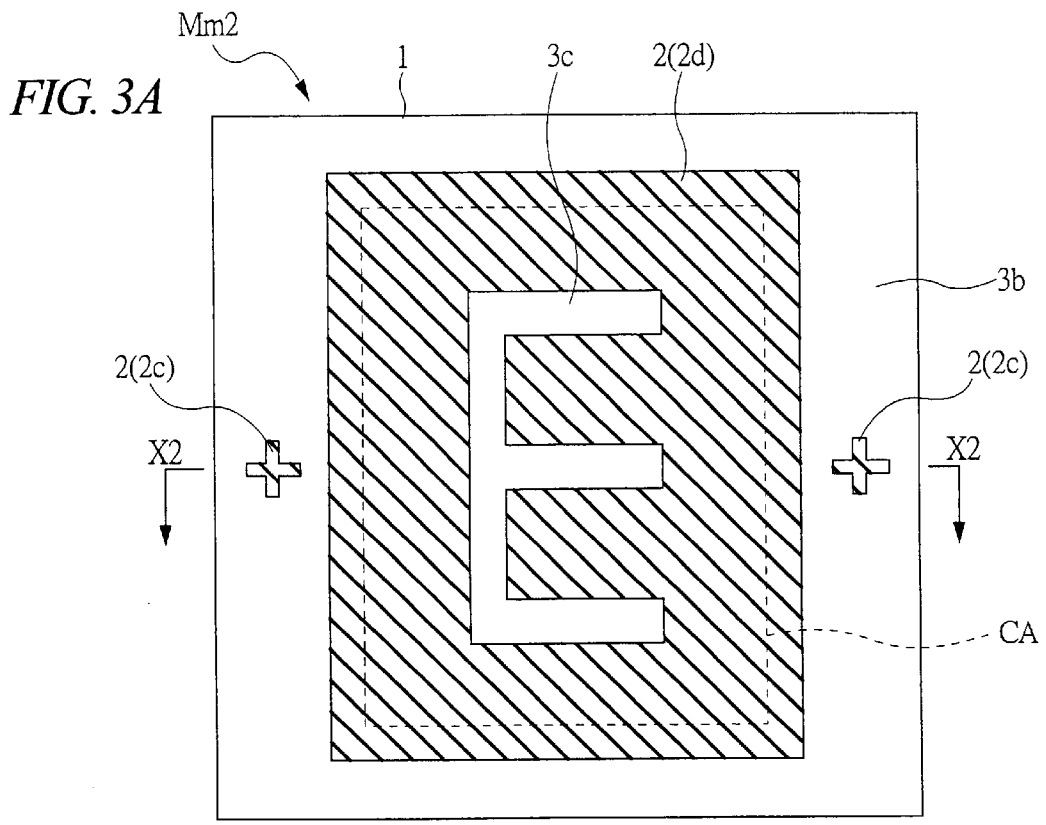
FIG. 3A is a plan view of another photomask used in the method of manufacturing a semiconductor integrated circuit device according to the embodiment of the present invention.
Figure 3B:
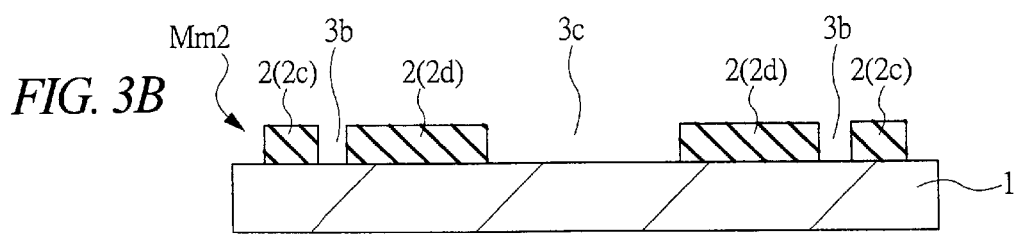
FIG. 3B is a cross-sectional view taken along the line X2—X2 of FIG. 3A.
Figure 3C:
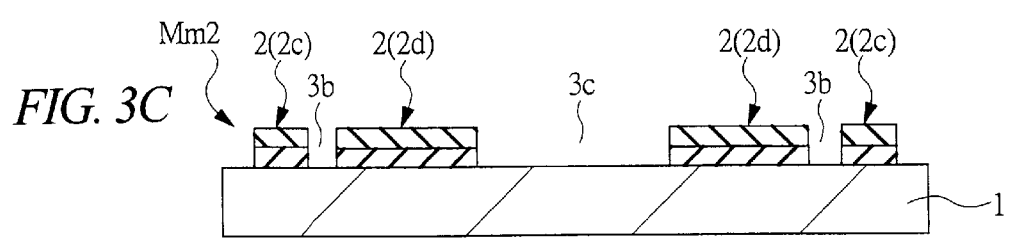
FIG. 3C is a cross-sectional view showing a structure of a modification example of FIG. 3B.

The IP mask Mm2 in FIG. 3 exemplifies the case where the light-shielding patterns 2 (2c and 2d) on the first main surface of the mask substrate 1 are all made of organic films, and the case where the arrangement of the transparent region and the light-shielding region is reversed in comparison to the IP mask Mm 1 in FIG. 2. A light-shielding pattern 2d is arranged at a central portion of the first main surface of the mask substrate 1 in this IP mask Mm2. The light-shielding pattern 2d is a pattern covering most of the integrated circuit pattern region CA and has an outer periphery protruding to the peripheral region. A transparent pattern 3c defined by the light-shielding pattern 2d is a pattern for transferring the integrated circuit pattern onto the product mask and is arranged in the integrated circuit pattern region CA at the central portion of the first main surface of the mask substrate 1. A joint surface of a base of a pellicle is joined while being contacted to the mask substrate 1 in the outer periphery of the light-shielding pattern 2d. FIG. 3B shows the case where the light-shielding patterns 2 (2c and 2d) are formed of a single film of the electron beam resist film similarly to the foregoing. FIG. 3C shows the case where the light-shielding patterns 2 (2c and 2d) are formed of a layered film constituted of the light-absorbing organic film and the electron beam resist film. Note that in order to transfer the patterns identical to each other onto a wafer using the IP masks Mm1 and Mm2, respectively, a positive resist film may be coated on the wafer when using the IP mask Mm1, and a negative resist film may be coated on the wafer when using the IP mask Mm2.

The IP mask Mm3 in FIG. 4 exemplifies the case where a light-shielding pattern 2 (2a) made of an organic film and a light-shielding patterns 4 (4a and 4b) made of metal are arranged on the first main surface of the mask substrate 1. In this IP mask Mm3, the light-shielding patterns 4a and 4b (They correspond to the light-shielding patterns 2b and 2c of the IP mask Mm1 of FIG. 2, respectively.) are made of, for example, a metal film such as a single film of chromium (Cr) or a layered film of chromium and chromium oxide ($CrO_x$).

Figure 4A:
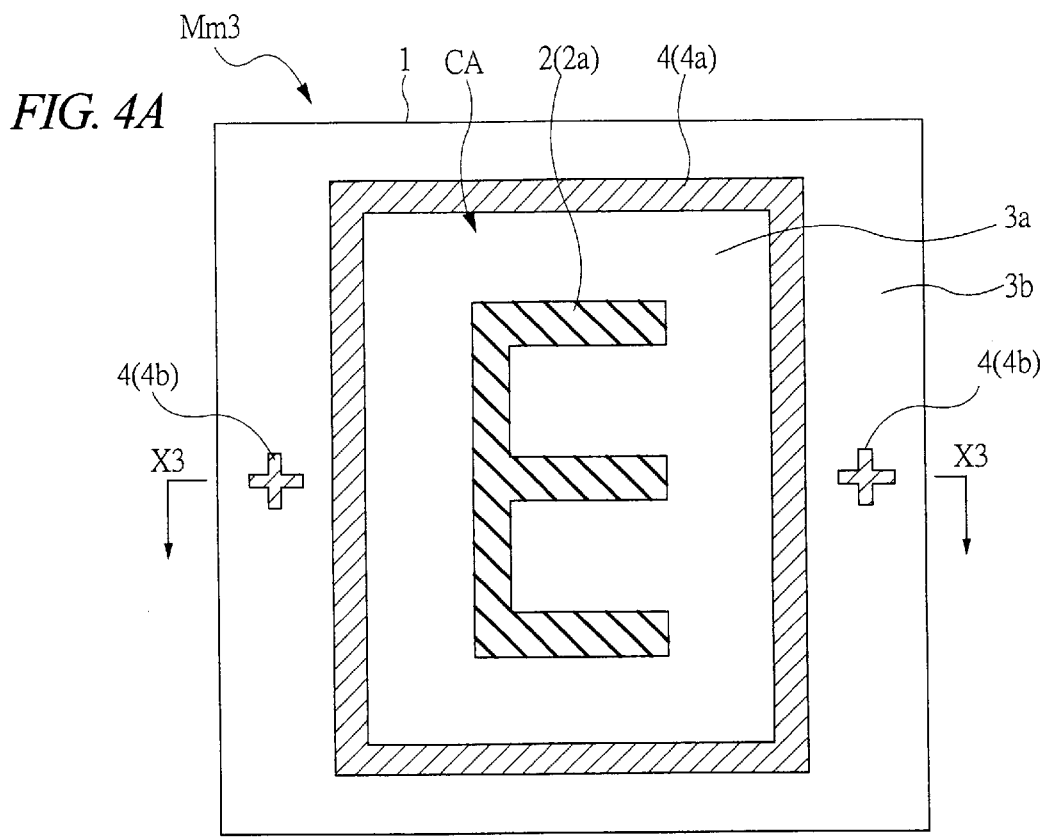
FIG. 4A is a plan view of another photomask used in the method of manufacturing a semiconductor integrated circuit device according to the embodiment of the present invention.
Figure 4B:
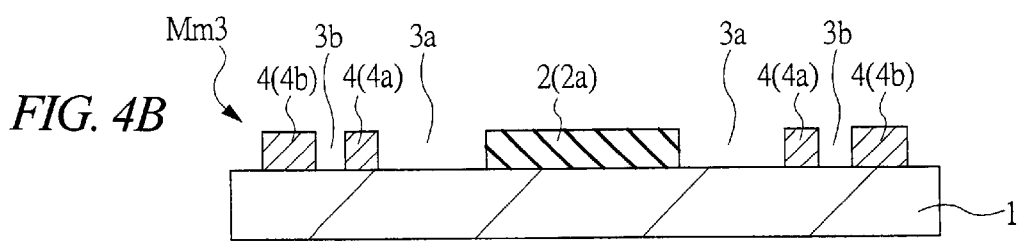
FIG. 4B is a cross-sectional view taken along the line X3—X3 of FIG. 4A.
Figure 4C:
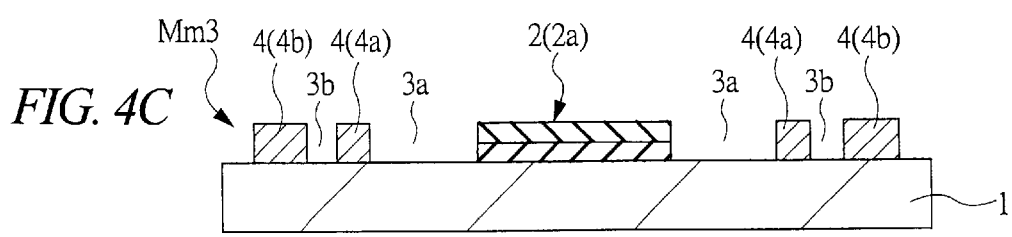
FIG. 4C is a cross-sectional view showing a structure of a modification example of FIG. 4B.

However, the material of the light-shielding pattern 4 is not limited to the chromium and the like, and various materials can be used. For example, refractory metal such as tungsten, molybdenum, tantalum, and titanium, nitride such as tungsten nitride, refractory metal silicide (compound) such as tungsten silicide (WSi$_x$) and molybdenum silicide (MoSi$_x$), or a layered film thereof can be used. With respect to the resist mask, the mask substrate 1 thereof is washed and used again (reproduction) in some cases after removing the light-shielding pattern 2 made of an organic film. Therefore, the refractory metal such as tungsten is preferable for the material of the light-shielding pattern 4 because the refractory metal has high oxidation resistance, high abrasion resistance, and high exfoliation resistance. The light-shielding patterns 4b exemplified by a flat-cross shape serve as alignment marks used in aligning the two dimensional position between the IP mask Mm3 and the reduced projection exposure apparatus. Since the alignment mark is constituted of metal, sufficient light-shielding effect can be obtained even in the case where helium-neon (He—Ne) gas laser having the wavelength of 633 nm is used as the light source for the alignment. Also, contrast between the light-shielding region and the transparent region can be obtained sufficiently. Therefore, position detection can be performed accurately and the pattern transfer accuracy can be improved. A joint surface of a base of a pellicle is joined while being contacted to the mask substrate 1 in the outer periphery of the light-shielding pattern 4a. FIG. 4B shows the case where the light-shielding pattern 2 (2a) is formed of a single film of the electron beam resist film similarly to the foregoing. FIG. 4C shows the case where the light-shielding pattern 2 (2a) is formed of a layered film constituted of the light-absorbing organic film and the electron beam resist film. In this IP mask Mm3, the amount of time to manufacture the mask can be reduced in comparison to the IP masks Mm1 and Mm2 shown in FIGS. 2 and 3 because the light-shielding patterns 4a and 4b in the peripheral region are not required to be exposed in the reproduction. Note that also in this IP mask Mm3 having a structure like this, the patterns in the integrated circuit pattern regions can be reversed similarly to the case described in FIG. 3. In addition, the reproduction technique of the resist mask is disclosed in, for example, Japanese Patent Application No. 2000-246506 (filed on Aug. 15, 2000) by the inventors of this application.

Figure 5A:
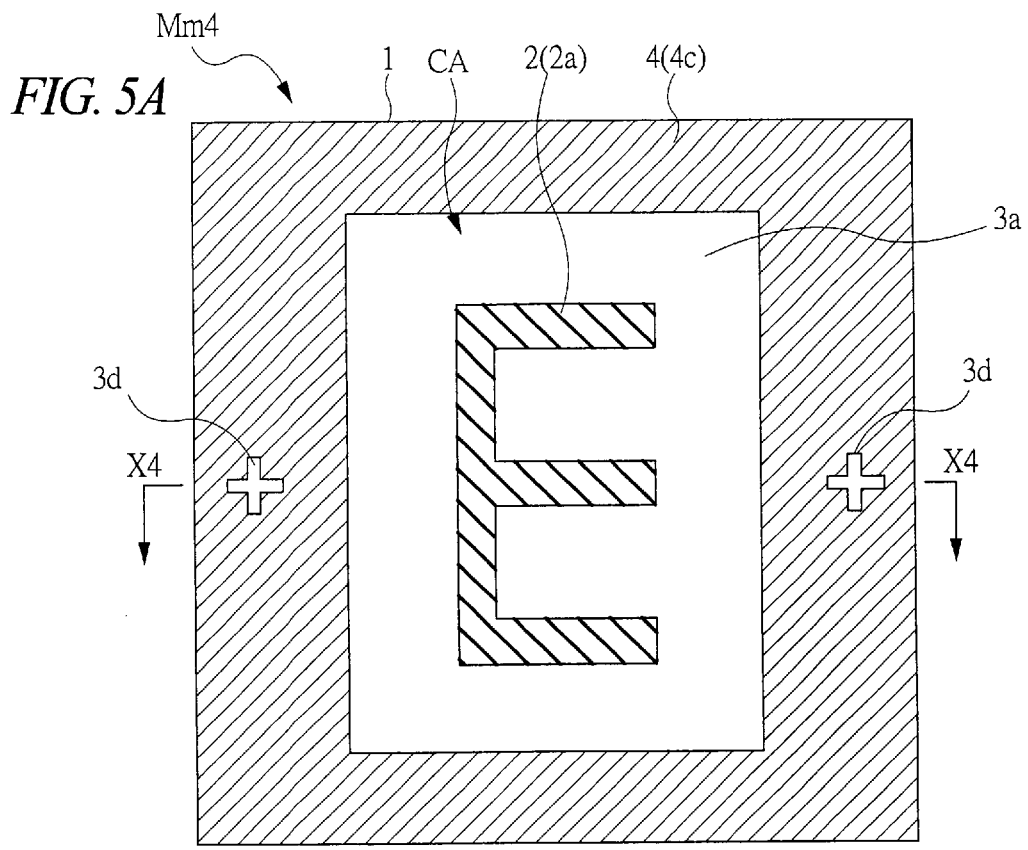
FIG. 5A is a plan view of another photomask used in the method of manufacturing a semiconductor integrated circuit device according to the embodiment of the present invention.
Figure 5B:
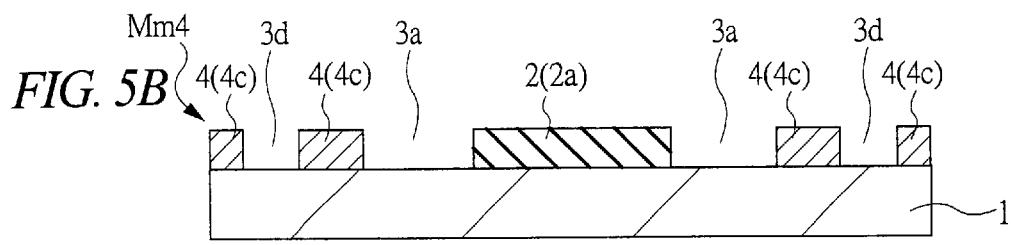
FIG. 5B is a cross-sectional view taken along the line X4—X4 FIG. 5A.
Figure 5C:
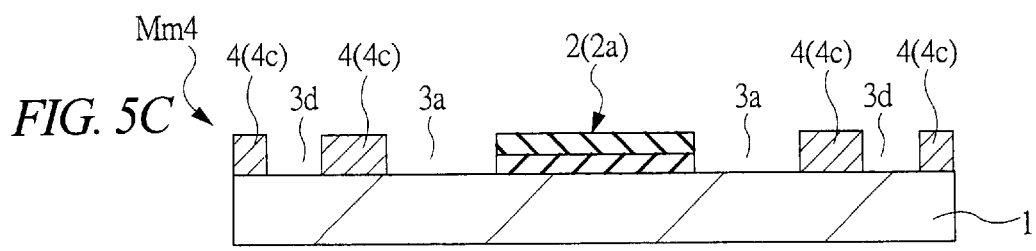
FIG. 5C is a cross-sectional view showing a structure of a modification example of FIG. 5B.

The IP mask Mm4 in FIG. 5 exemplifies the case where the light-shielding pattern 4c made of metal covers most of the peripheral region on the first main surface of the mask substrate 1. The light-shielding pattern 4c is made of the same metal as the light-shielding pattern 4a described above. The fine transparent patterns 3d exemplified by the flat-cross shape defined by the light-shielding pattern 4c are formed in parts of the light-shielding pattern 4c. The transparent patterns 3d serve as alignment marks used in the two-dimensional alignment between the IP mask Mm4 and the reduced projection exposure apparatus. Also in this case, a sufficient light-shielding effect can be obtained when helium-neon gas laser having the wavelength of 633 nm is used as the light source for the alignment. Also, contrast between the light-shielding region and the transparent region can be obtained sufficiently. Therefore, position detection can be performed accurately and the pattern transfer accuracy can be improved. A joint surface of a base of a pellicle is joined while being contacted to the light-shielding pattern 4c. FIG. 5B shows the case where the light-shielding pattern 2 (2a) is formed of a single film of the electron beam resist film similarly to the foregoing. FIG. 5C shows the case where the light-shielding pattern 2 (2a) is formed of a layered film of the light-absorbing organic film and the electron beam resist film. Note that also in this IP mask Mm4 having a structure like this, the patterns in the integrated circuit pattern regions can be reversed similarly to the case described in FIG. 3.

In the case where the IP mask is constituted of the resist mask as described above, the advantages as follows can be obtained.

First, a development period and a manufacturing time of the semiconductor integrated circuit device can be reduced. Since the IP mask is used only once or a few times (especially, in a customized product), taking much time to manufacture the IP mask causes the waste of time. To the contrary, in the IP mask of this embodiment, since the light-shielding pattern is constituted of an organic film, the necessity of the etching process for the metal film can be removed in the formation of the mask pattern. Therefore, the amount of time required to manufacture the IP mask is greatly reduced in comparison to the case of the normal mask.

Second, since the dimensional precision of the pattern to be transferred onto the product mask (or onto a wafer) can be improved, the improvement in performance and integration of the semiconductor integrated circuit device can be achieved. The reason therefor is as follows. Since the etching of the metal film is not performed, but the organic film is patterned by the exposure and the development to form the mask pattern in the IP mask of this embodiment. Therefore, the occurrence of the dimensional error caused by the etching to form the mask pattern can be prevented.

Third, the IP mask having high reliability can be manufactured with low defect rate. The reason therefor is as follows. Since the etching is not performed in the pattern formation, the occurrence of the defects is greatly reduced.

Fourth, since the manufacturing cost of the mask (broader concept including IP mask and product mask) can be reduced, the cost of the semiconductor integrated circuit device can be reduced. The reason therefor is as follows. In addition that the above-described third advantage can be obtained, since the light-shielding pattern is constituted of an organic film in the IP mask of this embodiment, the etching step of the metal film in the formation of the mask pattern can be omitted, and thus the material cost, the fuel cost, and the equipment cost required to perform the etching can be saved. Also, the mask substrate can be recycled by removing the light-shielding pattern made of an organic film. Since the IP mask is used only once or a few times (especially, in a customized product), this advantage is quite effective to achieve the cost reduction of the semiconductor integrated circuit device.

In the case of the resist mask as described above, there is a possibility that the film quality and the light transmittance to the irradiation of the exposure light are changed. However, since the IP mask is used for the exposure only once or a few times, the resist mask has a sufficient resistance to the exposure of this extent even if the resist mask is used as the IP mask. Therefore, the change of the film quality and the light transmittance is small enough to be ignored. With this respect, the resistance can be ensured if the IP mask is constituted of the normal mask. Accordingly, little change is caused in the film quality and the light transmittance of the metal film to the irradiation of the exposure light. Therefore, if the IP mask is used for the exposure several times, it is preferable that the IP mask is constituted of the normal mask.

Figure 6A:
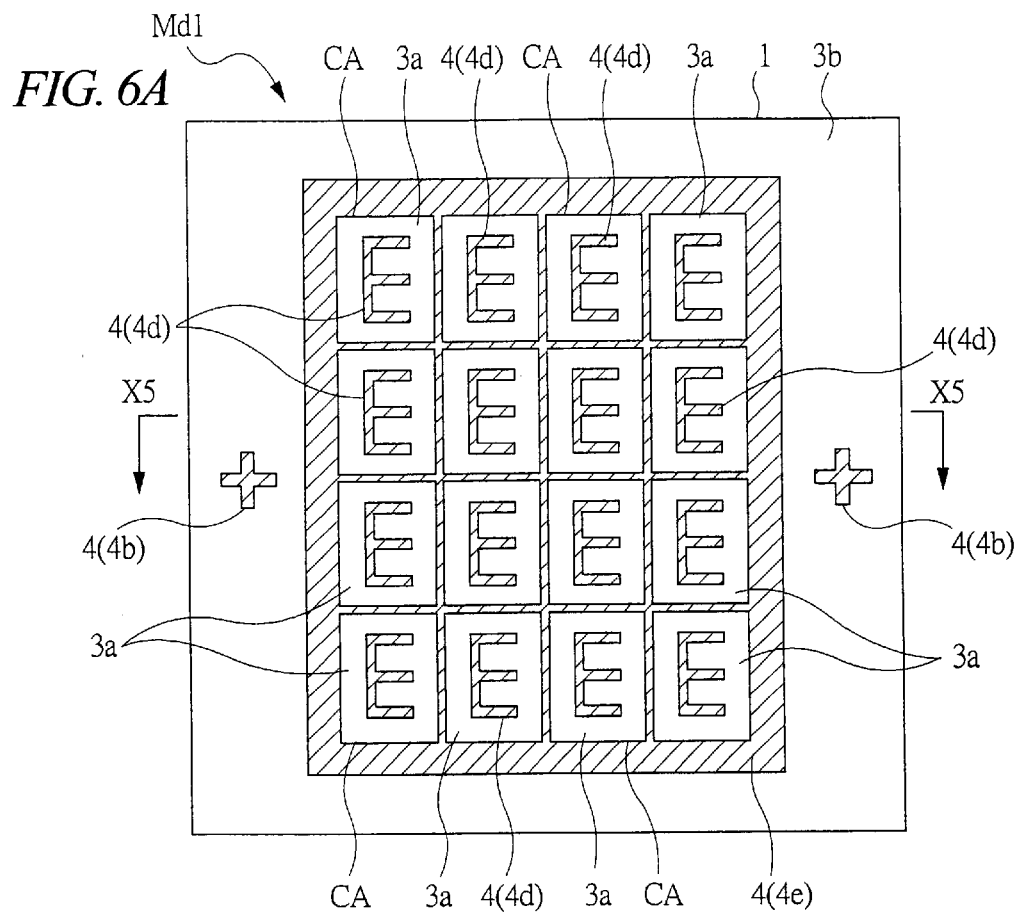
FIG. 6A is a plan view of another photomask used in the method of manufacturing a semiconductor integrated circuit device according to the embodiment of the present invention.
Figure 8A:
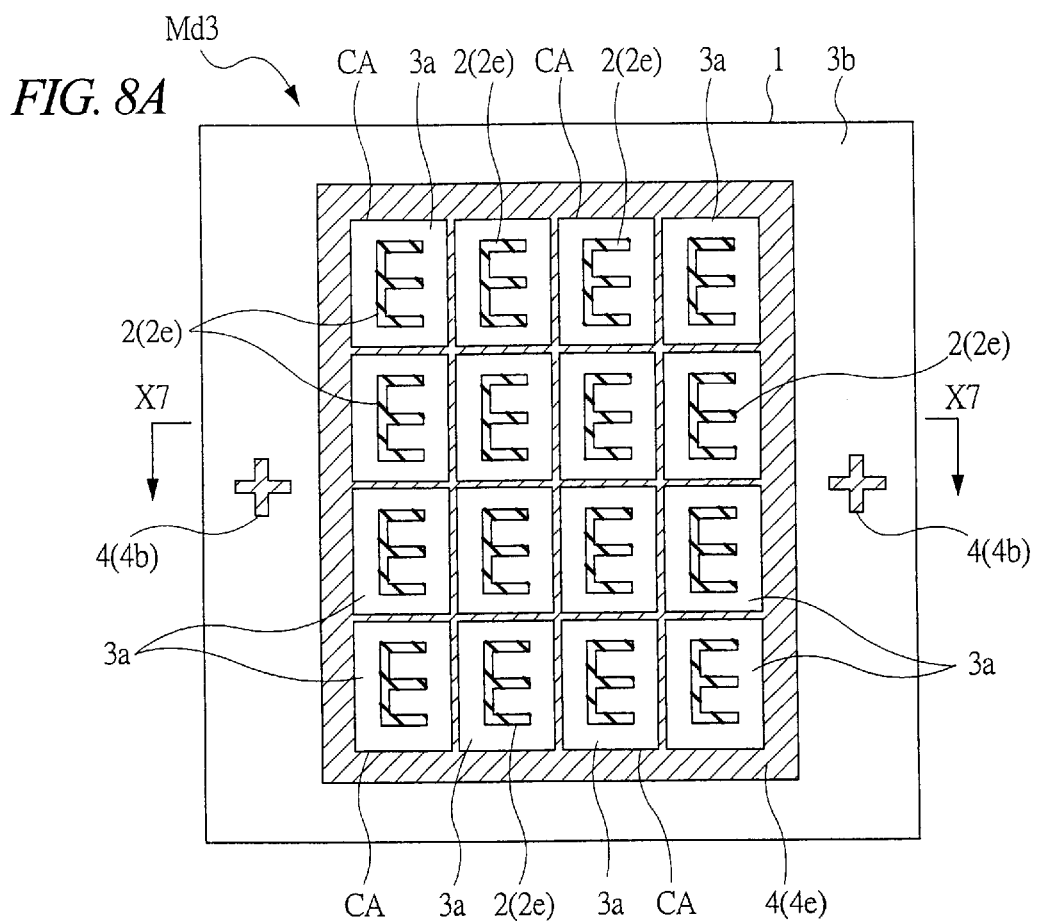
FIG. 8A is a plan view of another photomask used in the method of manufacturing a semiconductor integrated circuit device according to the embodiment of the present invention.

Next, description will be made for the product mask. FIGS. 6 to 8 show an example thereof. The planar, entire dimensions of product masks Md1 to Md3 are almost the same as those of the IP masks Mm1 to Mm4. In FIGS. 6 to 8, the case where the magnification is set to four times is exemplified. Specifically, 16 integrated circuit pattern regions CA (obtained by 4×4=16) are arranged. Since the product masks Md1 to Md3 are manufactured using the IP masks Mm1 to Mm4, each pattern of the integrated circuit pattern regions CA is schematically shown as the alphabet E in conformity to the IP masks Mm1 to Mm 4. Also in this case, one integrated circuit pattern region CA corresponds to a forming region of one chip. Although FIGS. 6A, 7A, and 8A are plan views, the light-shielding members therein are hatched so as to make the drawings easy to see. In this case, the light-shielding member made of an organic film is hatched with thick lines and the light-shielding member made of metal is hatched with thin lines.

Figure 6B:
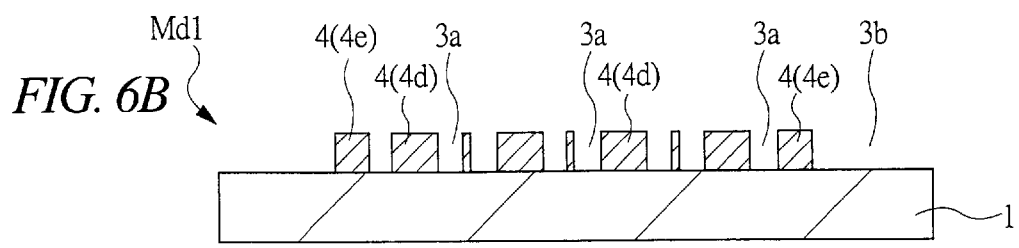
FIG. 6B is a cross-sectional view taken along the line X5—X5 of FIG. 6A.

In FIG. 6, the case where the product mask Md1 is constituted of the normal mask is exemplified. In this embodiment, the normal mask is not used as the product mask as described later. In this case, however, the normal mask is used for describing the structure of the product mask. FIG. 6A is a general plan view of the product mask Md1 and FIG. 6B is a cross-sectional view taken along the line X5—X5 of FIG. 6A. The product mask Md1 is constituted of the normal mask. Specifically, light-shielding patterns 4(4b, 4d, and 4e) on the first main surface of the mask substrate 1 are constituted of, for example, a single film of chromium or a layered film of chromium and chromium oxide laminated thereon. The light-shielding pattern 4d is a pattern made by transferring the light-shielding pattern 2a or the transparent pattern 3c of the IP masks Mm1 to Mm4 and is a pattern for transferring the integrated circuit pattern onto a wafer. The light-shielding pattern 4d is arranged in each of the transparent regions 3a of the integrated circuit pattern region CA. The patterns in the integrated circuit pattern regions CA can be reversed similarly to the case described in FIG. 3. The light-shielding pattern 4e is a pattern defining an area of the integrated circuit pattern region CA and is arranged so as to edge the outer periphery of the integrated circuit pattern region CA. Also in the case of the product mask Md1, the peripheral region of the mask substrate 1 can be designed to have a structure as shown in FIG. 5.

In the product mask Md1 described above, a joint surface of a base of a pellicle is joined while being contacted to the mask substrate 1 in the outer periphery of the light-shielding pattern 4e. Since the number of use of the product mask Md1 is larger than that of the IP mask, it is effective in terms of the improvement of the durability (lifetime) of the product mask Md1 to use the normal mask as the product mask Md1.

FIGS. 7 and 8 exemplify a product mask constituted of the resist mask. FIG. 7A is a general plan view of a product mask Md2, and FIG. 7B is a cross-sectional view taken along the line X6—X6 of FIG. 7A. This product mask Md2 is constituted of the resist mask. Specifically, the light-shielding patterns 2 (2c, 2e, and 2f) on the first main surface of the mask substrate 1 are constituted of the organic films. The light-shielding pattern 2e is a pattern made by transferring the light-shielding pattern 2a or the transparent pattern 3c of the IP masks Mm1 to Mm4 and is a pattern for transferring the integrated circuit pattern onto a wafer. The light-shielding pattern 2e is arranged in each of the transparent regions 3a of the integrated circuit pattern region CA. The patterns in the integrated circuit pattern regions CA can be reversed similarly to the case described in FIG. 3. The light-shielding pattern 2f is a pattern defining an area of the integrated circuit pattern region CA and is arranged so as to edge the outer periphery of the integrated circuit pattern region CA. In the product mask Md2 described above, a joint surface of a base of a pellicle is joined while being contacted to the mask substrate 1 in the outer periphery of the light-shielding pattern 2f. FIG. 7B shows the case where the light-shielding patterns 2 of the product mask Md2 are constituted of a single film of the electron beam resist film. FIG. 7C shows the case where the light-shielding patterns 2 of the product mask Md2 are constituted of a layered film of the light-absorbing organic film and the electron beam resist film.

In the product mask Md2 as described above, it becomes possible to further enhance the first and second advantages obtained by using the IP mask as the resist mask. Specifically, the development period and the manufacturing time of the semiconductor integrated circuit device can be further reduced. In addition, since the dimensional precision of the pattern transferred onto the product mask (or onto a wafer) can be further improved, the further improvement in performance and integration of the semiconductor integrated circuit device can be achieved. Also, the product mask having high reliability can be manufactured with low defect rate. Moreover, since the cost of the mask (broader concept including IP mask and product mask) can be further reduced, the cost of the semiconductor integrated circuit device can be further reduced.

Figure 8B:
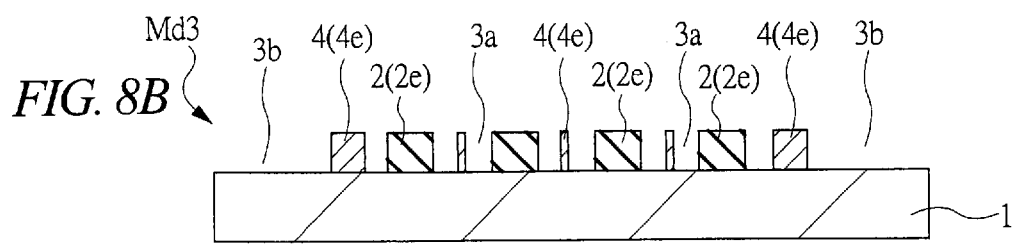
FIG. 8B is a cross-sectional view taken along the line X7—X7 of FIG. 8A.
Figure 8C:
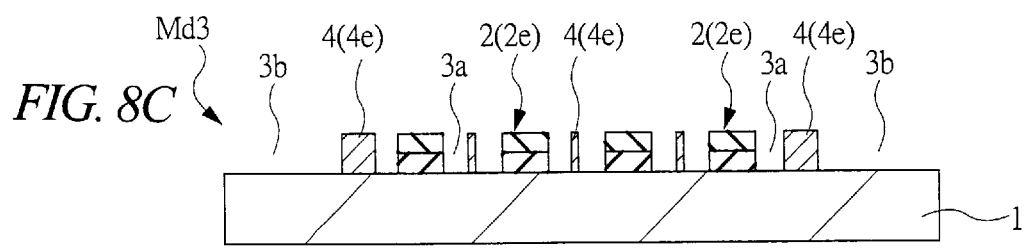
FIG. 8C is a cross-sectional view showing a structure of a modification example of FIG. 8B.

FIG. 8A is a general plan view of the product mask Md3. FIG. 8B is a cross-sectional view taken along the line X7—X7 of FIG. 8A. The product mask Md3 exemplifies the case where the light-shielding pattern 2 (2e) made of an organic film and the light-shielding patterns 4 (4b and 4d) made of metal are arranged on the first main surface of the mask substrate 1. In this product mask Md3, the light-shielding patterns 4b and 4e (They correspond to the light-shielding patterns 2c and 2f of the product mask Md2 of FIG. 7, respectively.) are constituted of, for example, a metal film such as a single film of chromium and a layered film of chromium and chromium oxide. Note that similarly to the case described in FIG. 4, the material of the light-shielding pattern 4 in this case may be selected from the refractory metal, the nitride, refractory metal silicide (compound) and a layered film thereof. With respect to the resist mask, especially, the mask substrate 1 thereof is washed and used again (reproduction) in some cases after removing the light-shielding pattern 2 made of an organic film. Therefore, the refractory metal is preferable for the material of the light-shielding pattern 4 because the refractory metal has high oxidation resistance, high abrasion resistance, and high exfoliation resistance. Also in this product mask Md3 having a structure like this, the patterns in the integrated circuit pattern regions can be reversed similarly to the cases described in FIG. 3. In the product mask Md3 described above, a joint surface of a base of a pellicle is joined while being contacted to the mask substrate 1 in the outer periphery of the light-shielding pattern 4e. Similarly to the foregoing, FIG. 8B shows the case where the light-shielding pattern 2 (2e) is constituted of a single film of the electron beam resist film. FIG. 8C shows the case where the light-shielding pattern 2 (2e) is constituted of a layered film of the light-absorbing organic film and the electron beam resist film.

In this product mask Md3, in addition to the advantages obtained by using the product mask Md2 shown in FIG. 7, an advantage of reducing the manufacturing time of the mask can be obtained because it is not necessary to exposure the light-shielding patterns 4b and 4e in the peripheral region in the reproduction in comparison to the product mask Md2 of FIG. 7.

Figure 9A:
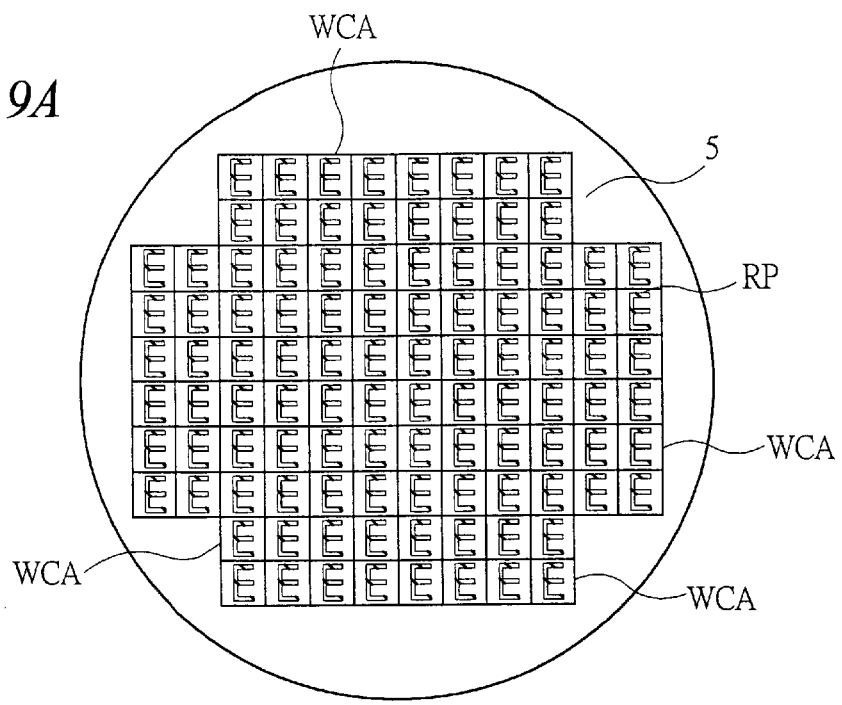
FIG. 9A is a plan view of a semiconductor wafer in a manufacturing process of the semiconductor integrated circuit device according to the embodiment of the present invention.
Figure 9B:
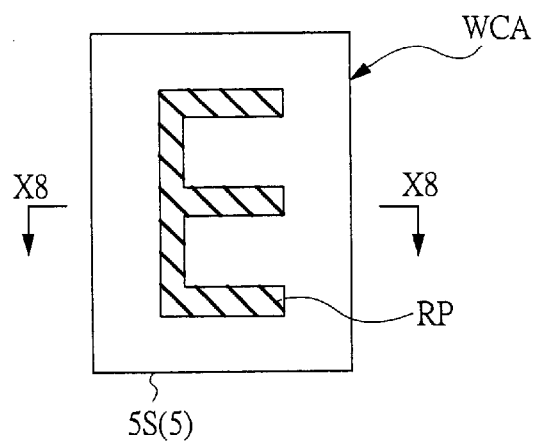
FIG. 9B is an enlarged plan view of a semiconductor chip forming region of the semiconductor wafer of FIG. 9A.
Figure 9C:
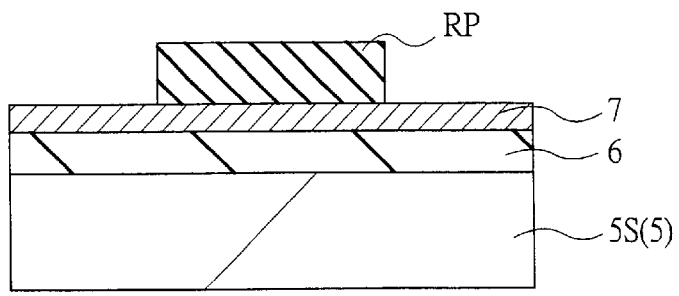
FIG. 9C is a cross-sectional view taken along the line X8—X8 of FIG. 9B.

FIG. 9 exemplifies a pattern transferred onto a wafer 5 by the reduced projection exposure using the product masks Md1 to Md3 described above. FIG. 9A is a general plan view of the wafer 5, FIG. 9B is an enlarged plan view of a chip forming region WCA of FIG. 9A, and FIG. 9C is a cross-sectional view taken along the line X8—X8 of FIG. 9B. Although FIGS. 9A and 9B are plan views, the components shown therein are hatched so as to make them easy to see.

A semiconductor substrate 5S of the wafer 5 is made of, for example, semiconductor such as single crystal silicon (Si) and predetermined integrated circuit devices are formed on a device surface (main surface) thereof. A plurality of chip forming regions WCA are arranged on the device surface of the wafer 5. A resist pattern RP transferred by the exposure using the product masks Md1 to Md3 is transferred onto each of the chip forming regions WCA. In this example, the case where an insulating film 6 made of, for example, silicon oxide is deposited on the device surface of the semiconductor substrate 5S and a metal film 7 made of, for example, aluminum or aluminum alloy is deposited thereon is exemplified. The resist pattern RP is formed on the metal film 7.

Figure 10:
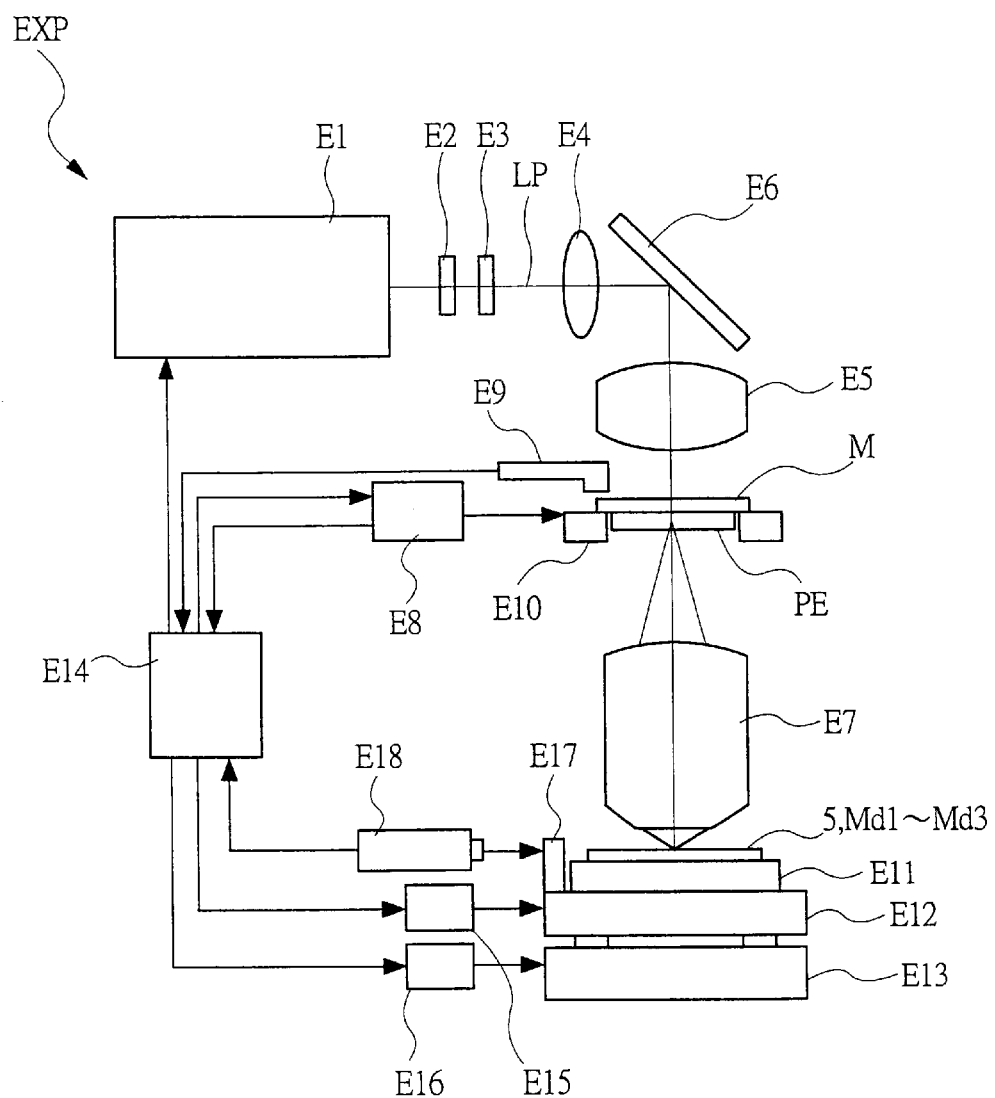
FIG. 10 is an explanatory diagram of an example of an exposure apparatus used in the method of manufacturing a semiconductor integrated circuit device according to the embodiments of the present invention.

Next, an example of the reduced projection exposure apparatus used in the fabrication of the product masks Md1 to Md3 and in the transfer step of the resist pattern PR onto the wafer 5 will be described based on FIG. 10. Note that only the constituents necessary to describe the function of the exposure apparatus are shown in FIG. 10. However, other constituents essential to the ordinary exposure apparatuses (scanner and stepper) are similar to those within a usual scope.

An exposure apparatus EXP shown in FIG. 10 is, for example, a scanning type reduced projection exposure apparatus (scanner) having a reduction rate of 4:1. The exposure condition of the exposure apparatus EXP is as follows. Specifically, KrF excimer laser having the exposure wavelength of about 248 nm is used as exposure light Lp, numerical aperture NA of an optical lens is set to 0.65, a shape of illumination is round, and a coherency value ($\sigma$: sigma) is set to 0.7. As a mask M, any one of the IP masks Mm1 to Mm4 and the product masks Md1 to Md3 is used. However, the exposure light Lp is not limited to the foregoing and various modifications can be made thereto. For example, g-beam, i-beam, ArF excimer laser, or $F_2$ gas laser may be used.

Light emitted from an exposure light source E1 transmits through a fly eye lens E2, an aperture E3, a condenser lenses E4 and E5, and a mirror E6 to illuminate the mask M (a reticle in this case). Among the optical conditions, the coherency is controlled by adjusting the size of the aperture E3. A pellicle PE is provided on the mask M so as to prevent a pattern transfer failure due to adhesion of foreign matters. A mask pattern written on the mask M is projected via a projection lens E7 onto the product masks Md1 to Md3 or the wafer 5 serving as a process substrate. The mask M is placed on a mask stage E10 controlled by mask position control means E8 and a mirror E9, and the mask center and the optical axis of the projection lens E7 are accurately aligned.

The product masks Md1 to Md3 or the wafer 5 is put on a sample stage E11 by vacuum suction. The sample stage E11 is mounted on a Z stage E12, which is movable in the vertical direction (Z direction) to a substrate placing surface of the sample stage E11. Further, the Z stage E12 is mounted on an XY stage E13, which is movable in the horizontal direction to the substrate placing surface of the sample stage E11. The Z stage E12 and the XY stage E13 are driven by drive means E15 and E16, respectively, in response to control commands sent from a main control system E14. Therefore, the sample stage E11 can be moved to any desired exposure position. The position of the sample stage E11 is correctly monitored by a laser measuring device E18 as a position of a mirror E17 fixed to the Z stage E13. Also, the surface position of the product masks Md1 to Md3 or the wafer 5 is measured by focus position detection means provided in the normal exposure apparatus. The Z stage E12 is driven according to the measurement, thereby enabling the surface of the wafer 5 to always align the image forming surface of the projection lens E7.

The mask M is driven synchronously with the product masks Md1 to Md3 or the wafer 5 depending on the reduction rate, and while the exposure region scans on the mask M, the mask pattern is reduced and transferred onto the product masks Md1 to Md3 or the wafer 5. At this time, the surface position of the product masks Md1 to Md3 or the wafer 5 is also driven dynamically relative to the scanning of the product masks Md1 to Md3 or the wafer 5 by the above-described drive means. When the circuit pattern on the mask M is aligned to the circuit pattern formed on the wafer 5 to perform the exposure, a position of a mark pattern formed on the wafer 5 is detected using an alignment detection optical system and the wafer 5 is aligned according to the detection, and then the circuit pattern on the mask M is transferred. The main control system E14 is electrically connected to a network apparatus, which enables the remote monitoring of the state of the exposure apparatus EXP.

According to this embodiment, improvement in the mask accuracy can be achieved. Consequently, the irregularity of the pattern can be reduced by about 40%. Thus, the operation speed of the chip can be increased, and high value-added device chips can be manufactured with low defect rate. Also, since the variance in dimensions on the wafer resulting from the variance in dimensions of the mask can also be reduced, the defect rate in the manufacturing process of a product can be reduced to two-thirds.

Figure 11:
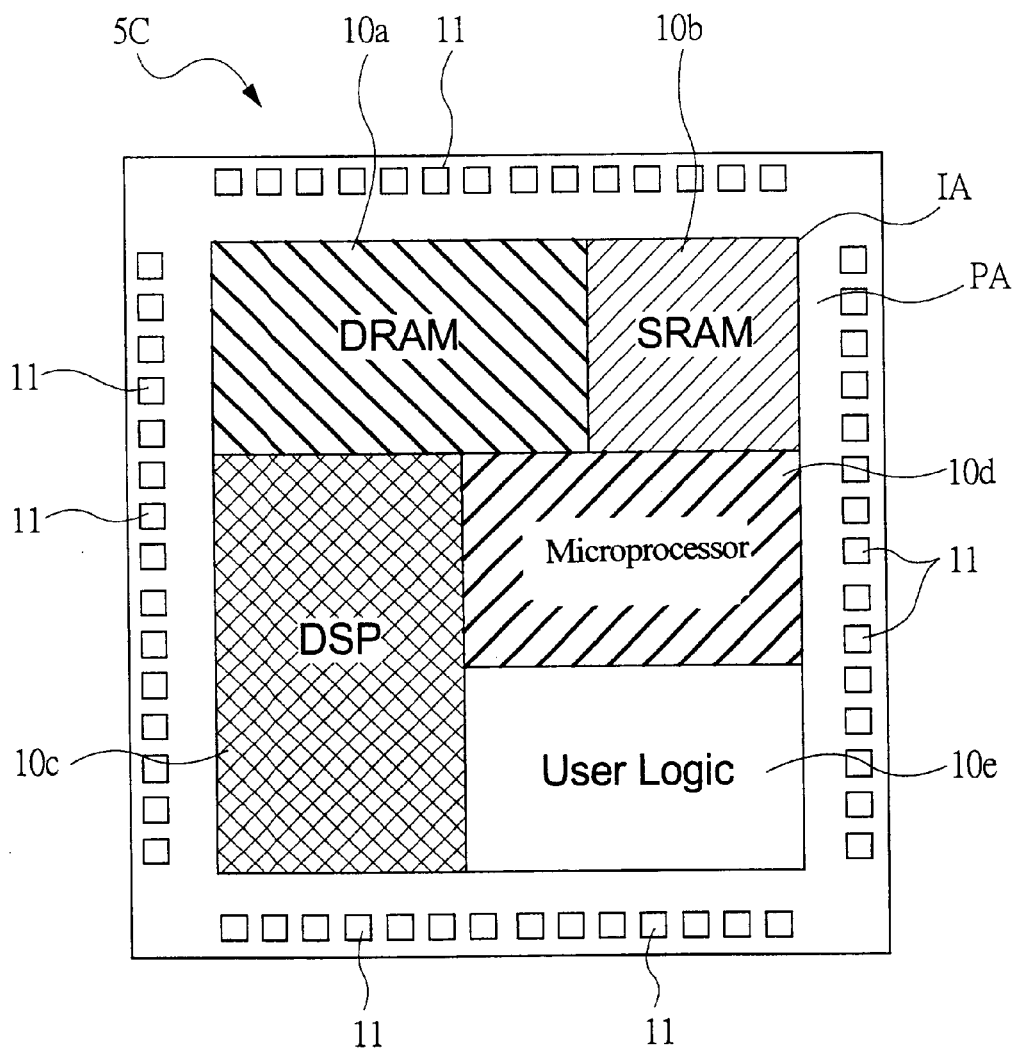
FIG. 11 is a general plan view of an example of a semiconductor chip constituting the semiconductor integrated circuit device according to another embodiment of the present invention.

Next, a concrete example of a method of manufacturing the semiconductor integrated circuit device will be described. In this example, the case where the present invention is applied to the method of manufacturing a mixed device such as a system LSI will be described. FIG. 11 is a general plan view schematically showing a chip 5C, which exemplifies the system LSI. Note that circuit regions in FIG. 11 are hatched so as to distinguish the circuit regions from each other.

The chip 5C is obtained by cutting the chip forming region WCA (refer to FIG. 9) of the wafer 5 described in the first embodiment. A plurality of circuit regions 10a to 10e are arranged in an inner circuit region IA at the center of the device surface (main surface) of the chip 5C. In this example, the circuit region 10a shows a region where DRAM (Dynamic Random Access Memory) is formed, the circuit region 10b shows a region where SRAM (Static Random Access Memory) is formed, the circuit region 10c shows a region where DSP (Digital Signal Processor) is formed, the circuit region 10d shows a region where a microprocessor is formed, and the circuit region 10 e shows a region where a user logic is formed. In an outer peripheral region PA of the inner circuit region IA, input/output circuits (input circuit, output circuit and bidirectional circuit) and a plurality of outer terminals 11 are arranged. The outer terminal 11 serves as an electrode for drawing out an electrode of the integrated circuit formed in the inner circuit region IA, and a bonding wire, a bump electrode or the like is connected to the outer terminal 11.

IP masks used for manufacturing the mixed device like this are shown in FIG. 12. Each of the IP masks Mm5 to Mm9 shown in FIGS. 12A to 12E is a mask used in the transfer of circuit regions 10a to 10e of FIG. 11. Both of the resist mask and the normal mask can be used as these IP masks Mm5 to Mm9. The specific structure where the resist masks are used as the IP masks Mm5 to Mm9 is the same as that described in the first embodiment shown in FIGS. 2 to 5. Therefore, the description thereof is omitted. Each of the IP masks Mm5 to Mm8 shown in FIGS. 12A to 12D is hatched in the same way as the circuit regions 10a to 10d so as to clarify that which patterns of the IP masks shown in FIG. 12 is transferred onto the circuit regions 10a to 10d on the chip 5c of FIG. 11. The IP mask Mm9 used in the transfer of the circuit region 10e for the user logic is not hatched similarly to the circuit region 10e shown in FIG. 11, which has the same meaning as above.

Figure 13A:
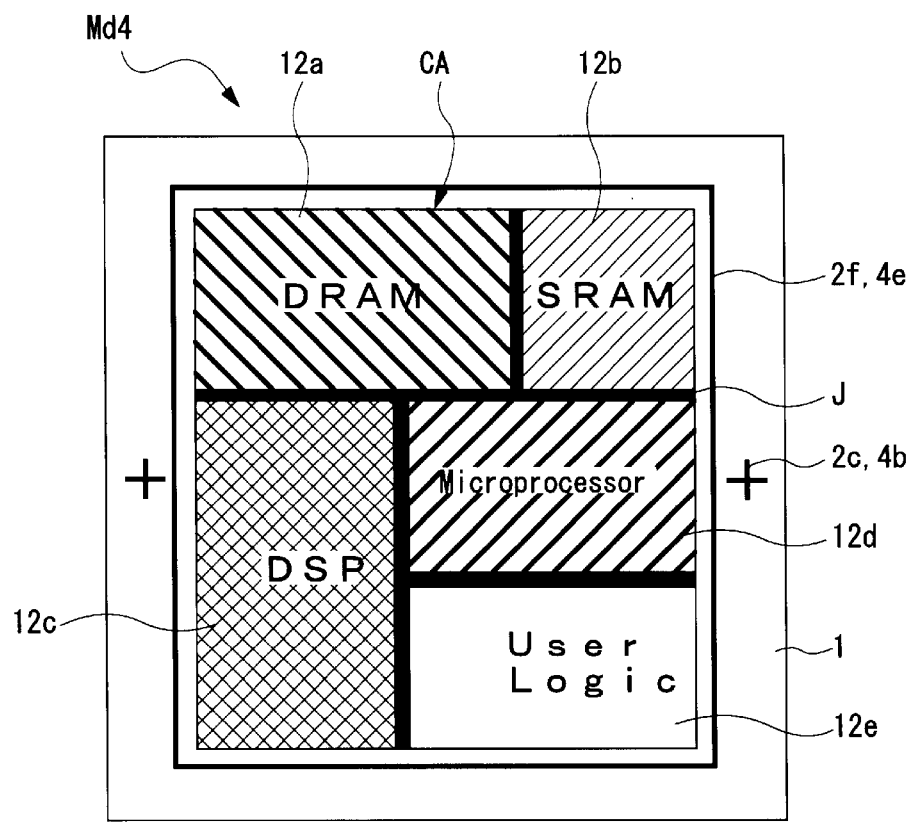
FIG. 13A is a general plan view of an example of a photomask used for manufacturing the semiconductor integrated circuit device of FIG. 11.
Figure 13B:
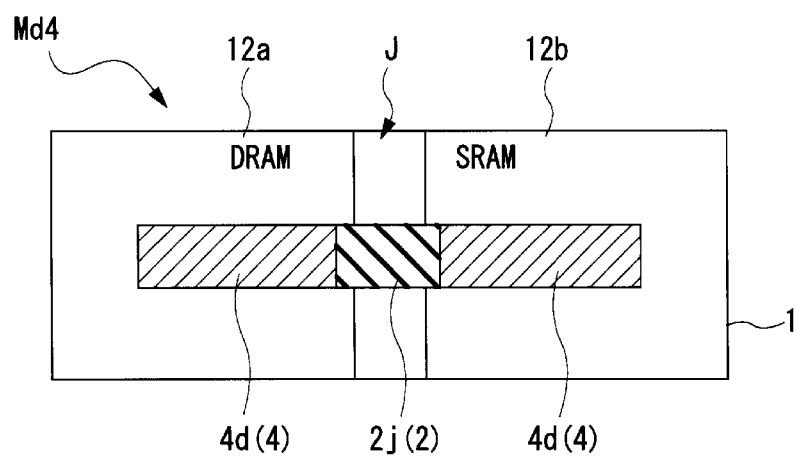
FIG. 13B is an enlarged plan view showing the principal portion of FIG. 13A.

Next, a product mask manufactured by the use of the IP masks Mm5 to Mm9 described above is shown in FIGS. 13A and 13B. FIG. 13A is a general plan view of a product mask Md4, and FIG. 13B is an enlarged plan view showing a connection region J (second region) between different pattern transfer regions in FIG. 13A. Each of the pattern transfer regions (first region) 12a to 12d of the product mask Md4 shown in FIG. 13A is hatched in the same way as the circuit regions 10a to 10d so as to clarify that which patterns of the product mask Md4 shown in FIG. 13A is transferred onto the circuit regions 10a to 10d of the chip 5c of FIG. 11. The pattern transfer region 12e of the product mask Md4 whose pattern is transferred onto the circuit region 10e for the user logic is not hatched similarly to the circuit region 10e shown in FIG. 11, which has the same meaning as above. In addition, in FIG. 13B, a light-shielding pattern made of metal is hatched.

In the integrated circuit pattern region CA of this product mask Md4, a plurality of pattern transfer regions 12a to 12e are arranged. The pattern transfer region 12a has a pattern formed by the transfer using the IP mask Mm5 shown in FIG. 12A and also has a pattern to be transferred onto the circuit region 10a shown in FIG. 11. The pattern transfer region 12b has a pattern formed by the transfer using the IP mask Mm6 shown in FIG. 12B and also has a pattern to be transferred onto the circuit region 10b shown in FIG. 11. The pattern transfer region 12c has a pattern formed by the transfer using the IP mask Mm7 shown in FIG. 12C and also has a pattern to be transferred onto the circuit region 10c shown in FIG. 11. The pattern transfer region 12d has a pattern formed by the transfer using the IP mask Mm8 shown in FIG. 12D and also has a pattern to be transferred onto the circuit region 10d shown in FIG. 11. The pattern transfer region 12e has a pattern formed by the transfer using the IP mask Mm9 shown in FIG. 12E and also has a pattern to be transferred onto the circuit region 10e shown in FIG. 11.

In this embodiment, the product mask Md4 is constituted of the resist mask. The light-shielding pattern 4 (4d) made of the metal film is arranged on the pattern transfer region 12a as exemplified in FIG. 13B. A light-shielding pattern 2 (2j) made of the organic film (electron beam resist film or the like) is arranged in the connection region J between each of the adjacent pattern transfer regions 12a to 12e. Specifically, the product mask Md4 is partly formed of the resist mask. The light-shielding pattern 2 (2j) is arranged so as to connect the light-shielding pattern 4d of the pattern transfer region 12a and the light-shielding pattern 4d of the pattern transfer region 12b to each other. Specifically, the light-shielding pattern 2j arranged in the connection region J serves as a pattern to connect the patterns formed in different pattern transfer regions 12a to 12e. Further, the light-shielding pattern 2j serves also as a pattern to connect the patterns formed in different circuit regions 10a, 10b, and the like on the wafer. The light-shielding pattern 2j is directly written using, for example, an energy beam such as the electron beam. As described above, the product mask Md4 in this embodiment is manufactured by both of the IP mask and the electron beam writing technique. Specifically, the IP mask is used to form the pattern of each circuit region in each chip forming region on the wafer, and the electron beam or the like is used to write the pattern of the connection portion between each circuit region in each chip forming region on the wafer. The reason therefor is as follows.

Specifically, if the pattern is transferred using only the IP mask, the connection between the patterns of each circuit region is difficult and dislocation occurs at the connection portion between the circuit regions. As a result, the pattern of the connection portion becomes thick or thin, resulting in the occurrence of failures such as disconnection and short circuit. FIG. 14 shows an example of such failures. FIG. 14A is an enlarged plan view of a portion between different pattern transfer regions 51a and 51b of a product mask 50, and FIGS. 14B and 14C are plan views of a resist pattern 52 transferred using the product mask shown in FIG. 14A. In this example, the case where the resist pattern 52 is formed of the negative resist film is exemplified.

In FIG. 14A, the case where the different pattern transfer regions 51a and 51b are arranged while being separated from each other at a distance of Xa therebetween. Light-shielding patterns 53a and 53b of the pattern transfer regions 51a and 51b are made of, for example, metal such as chromium. It is preferable that the light-shielding patterns 53a and 53b are connected to each other. FIG. 14B shows the case where the distance Xa is larger than 0. Specifically, the case where the IP masks are separated from each other is shown. In this case, a portion corresponding to the connection portion is made thin in an opening pattern 54a having a slit shape in two dimensions on the resist pattern 52. If the IP masks are further separated from each other, the opening pattern 54a is broken. On the other hand, FIG. 14C shows the case where the distance Xa is smaller than 0. Specifically, the case where the IP masks are overlapped on each other is shown. In this case, due to the increase in the amount of light, the portion corresponding to the connection portion is made thick in the opening pattern 54a having the slit shape in two dimensions on the resist pattern 52. If the overlapped area is expanded, the short-circuit occurs in the case where an adjacent pattern exists.

Therefore, in this embodiment, the light-shielding pattern 2j for connecting the patterns in the different pattern transfer regions on the product mask is formed of the organic film (electron beam resist film, or the like) and is directly written using the energy beam such as the electron beam. By doing so, it becomes possible to connect the patterns in the different pattern transfer regions easily and surely. Specifically, regardless of the extent of the dislocation between the different pattern transfer regions, the light-shielding pattern 2j of the connection region J can be formed easily so as to surely connect the patterns of the different pattern transfer regions and so as not to create any thinner portion and thicker portion in the transferred pattern on the wafer. Therefore, the reliability of the product mask can be improved. In addition, when the semiconductor integrated circuit device is manufactured using this product mask, the occurrence of failures such as disconnection and short circuit to the adjacent pattern can be reduced or prevented especially in the connection region of each pattern of the circuit regions 10a to 10e of the semiconductor integrated circuit device. Therefore, the reliability and the defect rate of the semiconductor integrated circuit device can be improved.

Figure 15:
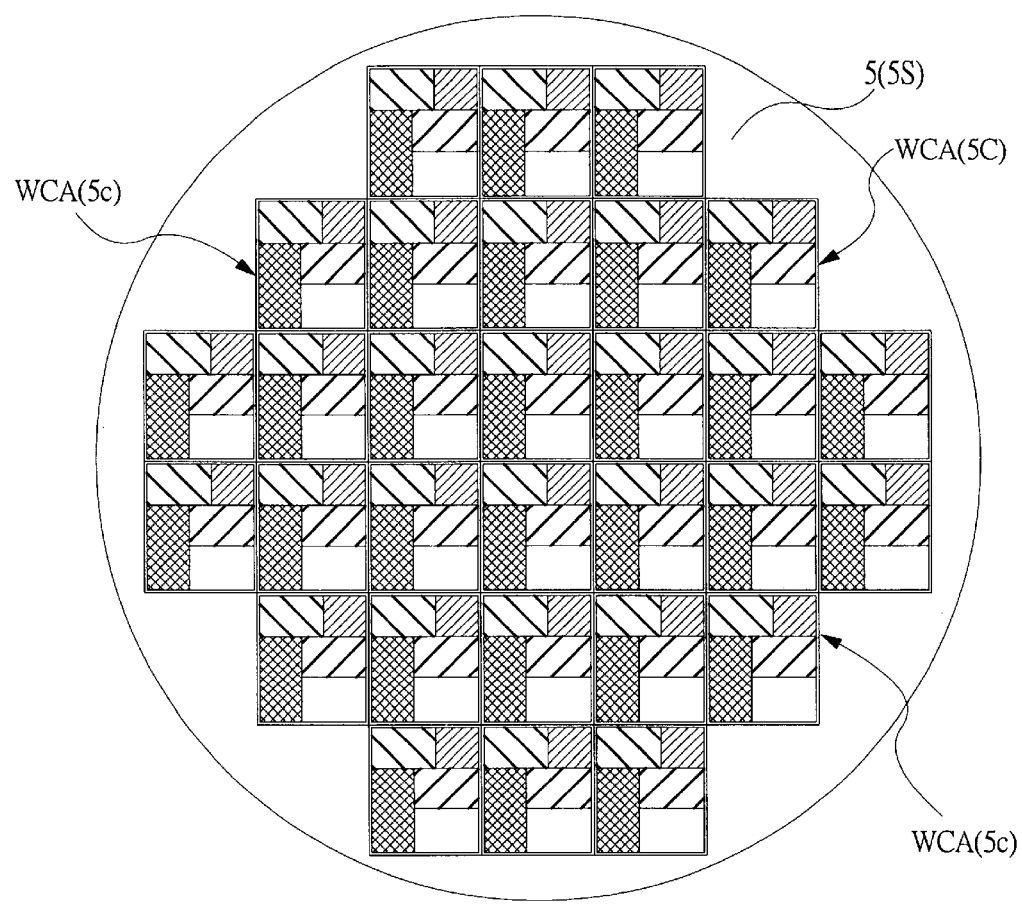
FIG. 15 is a general plan view of the semiconductor wafer in the manufacturing process of the semiconductor integrated circuit device according to another embodiment of the present invention.
Figure 16A:
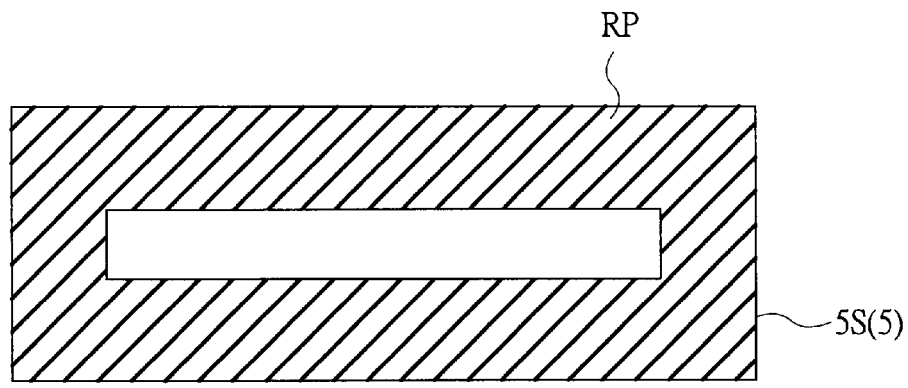
FIG. 16A is an enlarged plan view showing the principal portion of the semiconductor wafer of FIG. 15.
Figure 16B:
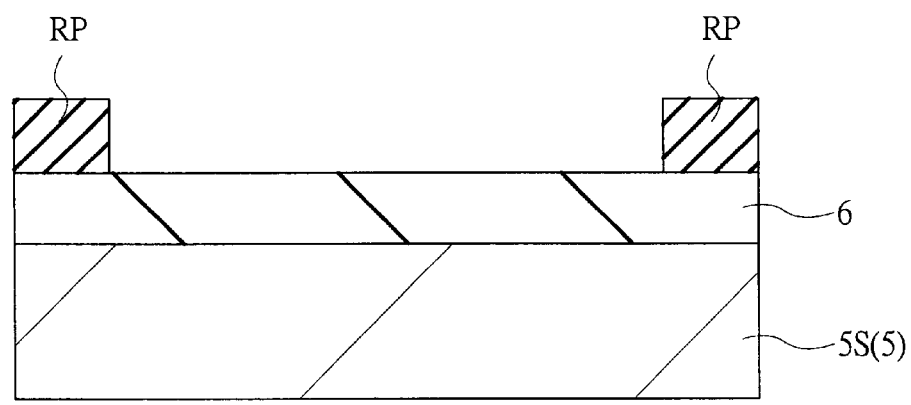
FIG. 16B is a cross-sectional view of FIG. 16A.
Figure 17A:
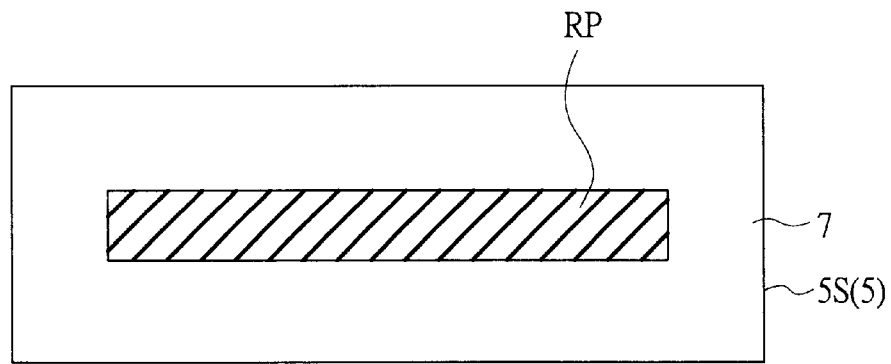
FIGS. 17A and 17B show a modification example of FIG. 16.
Figure 17B:
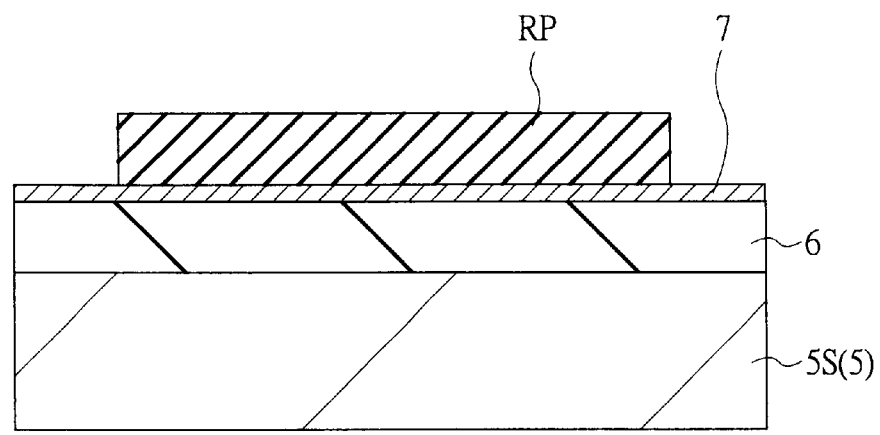

FIG. 15 schematically shows a pattern transferred onto the device surface of the wafer 5 using the product mask Md4. FIGS. 16 and 17 are enlarged plan views showing the principal portion of FIG. 15, which is the transferred pattern on the wafer including the connection region J of FIG. 13B. As shown in FIGS. 16 and 17, both of the desired resist patterns PR are appropriately formed without any thinner portion and thicker portion. Note that each of the chip forming regions WCA of FIG. 15 is hatched or not hatched similarly to those shown in FIG. 13A. Also, FIG. 16 shows the case where the resist pattern PR is formed of the negative resist film, and FIG. 17 shows the case where the resist pattern PR is formed of the positive resist film.

Figure 18:
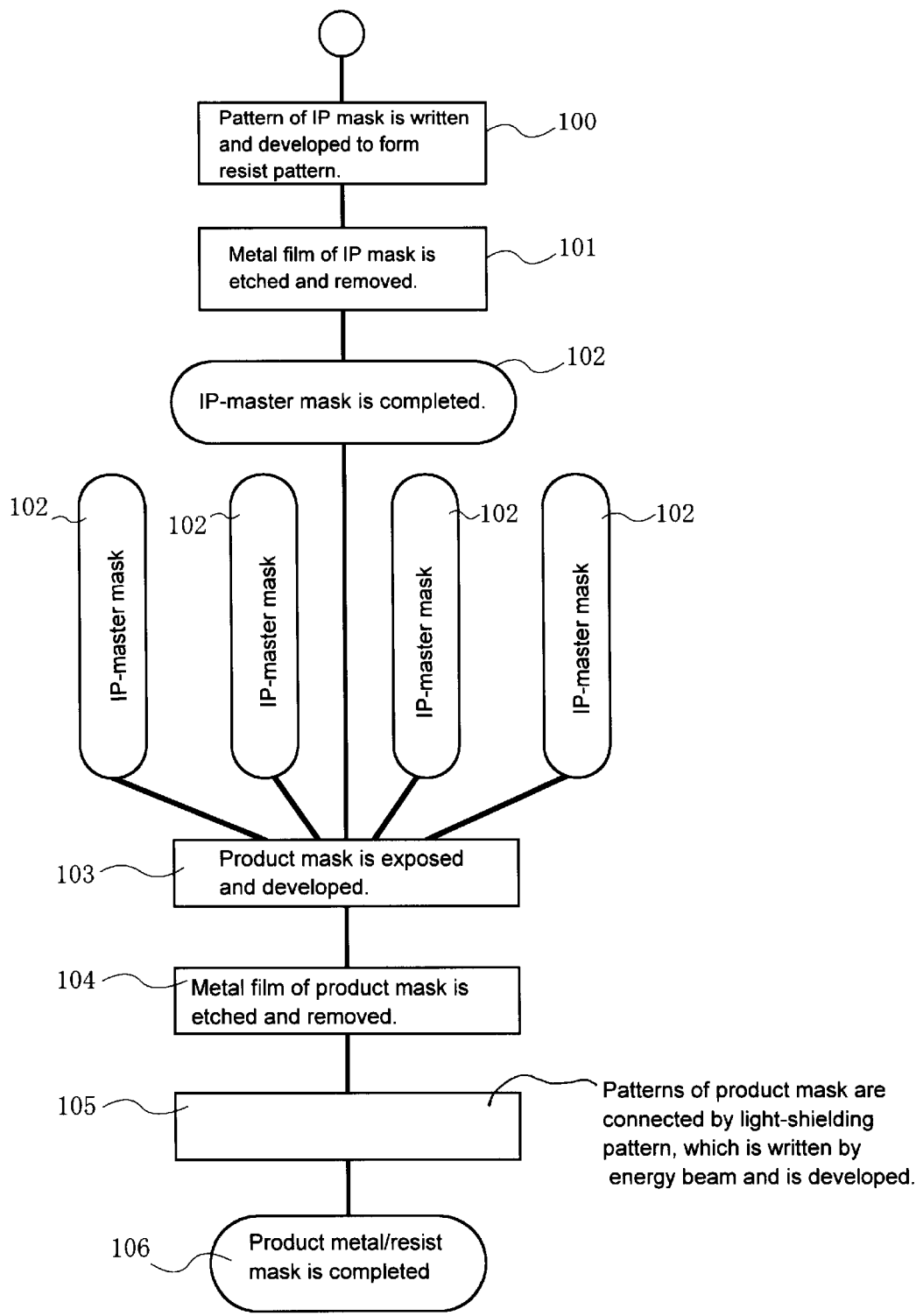
FIG. 18 is a flow chart showing a manufacturing process of the photomask used in the method of manufacturing a semiconductor integrated circuit device according to another embodiment of the present invention.
Figure 19A:
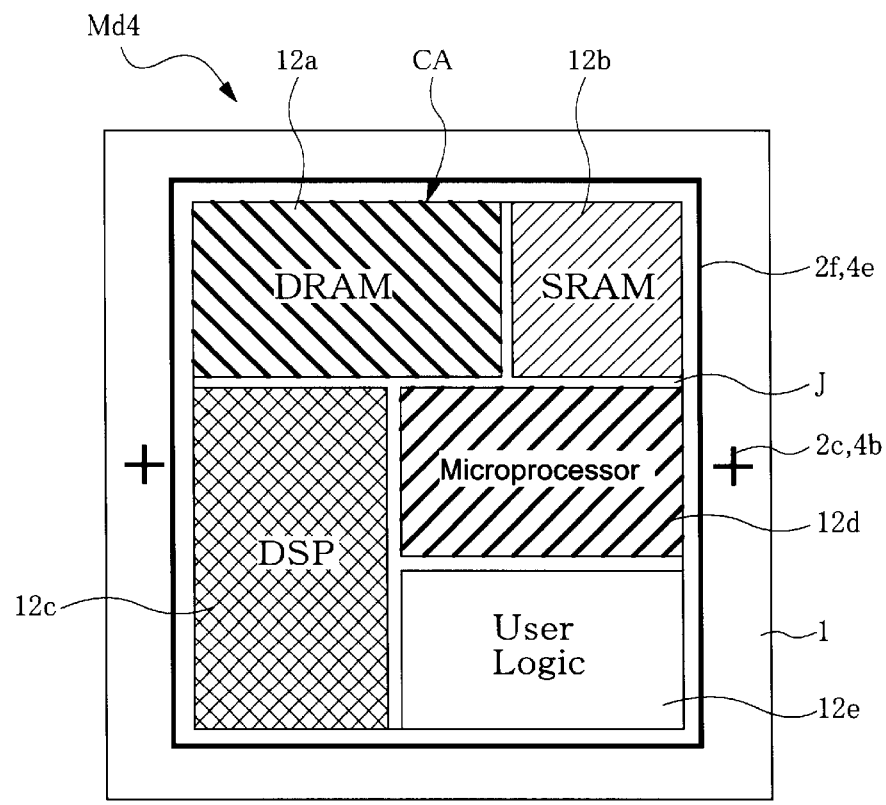
FIG. 19A is a general plan view of the photomask in the manufacturing process of FIG. 18.
Figure 19B:
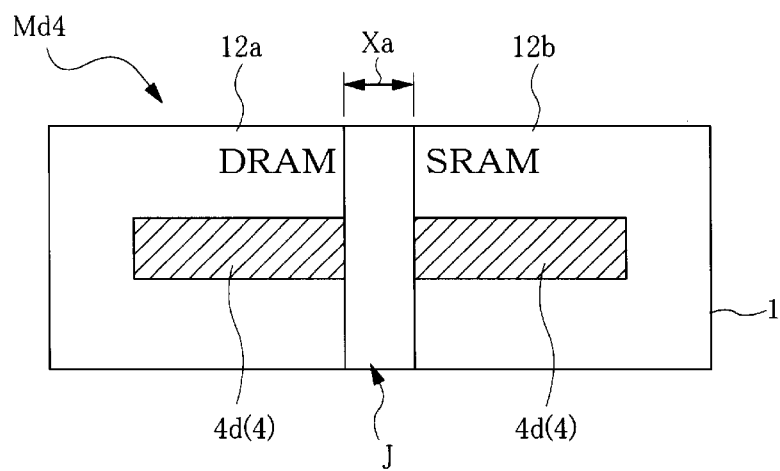
FIG. 19B is an enlarged plan view showing the principal portion of FIG. 19A.
Figure 20A:
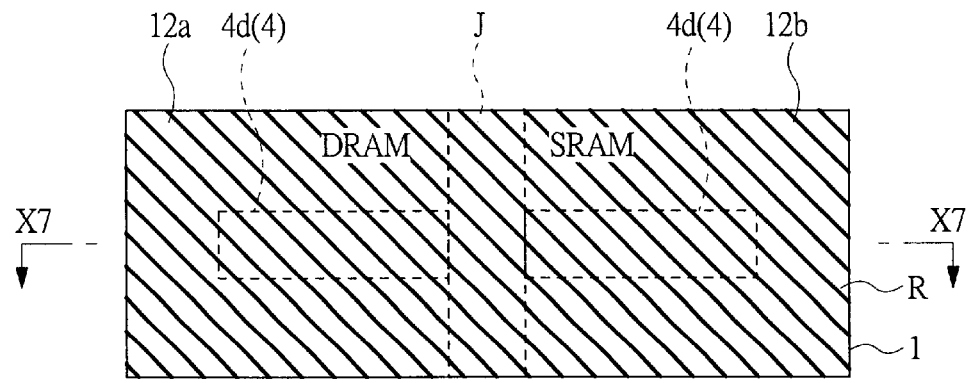
FIG. 20A is a plan view of the principal portion of the photomask in the manufacturing process of FIG. 18, which shows the next step of the step of FIG. 19.
Figure 20B:
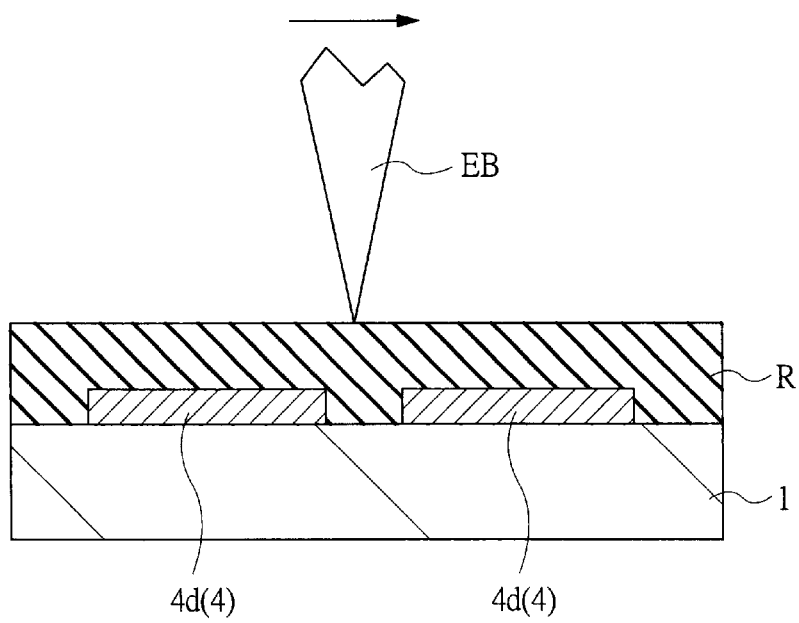
FIG. 20B is a cross-sectional view showing the principal portion of FIG. 20A.

Next, a concrete example of a manufacturing process of the mixed device like this will be described along a flow chart shown in FIG. 18 by the use of FIGS. 19 and 20. FIG. 19A is a plan view showing the product mask under fabrication, and FIG. 19B is an enlarged plan view of the connection region between the adjacent pattern transfer regions of FIG. 19A. FIG. 20A is an enlarged plan view of the connection region between the adjacent pattern transfer regions of the product mask under fabrication, and FIG. 20B is a cross-sectional view taken along the line X7—X7 of FIG. 20A.

First, the mask substrate 1 for use in the IP mask is prepared. A metal film formed of a single film of chromium or a layered film constituted of chromium and chromium oxide is deposited on a first main surface of the mask substrate 1, and a resist film is coated thereon. Subsequently, a predetermined pattern is written on the resist film by the electron beam or the like, and then the resist film is developed to form a resist pattern (step 100). Next, the lower metal film is etched and removed using the resist pattern as an etching mask to form a light-shielding pattern made of metal (step 101). According to the foregoing steps, a set of the IP masks (refer to FIG. 12) are manufactured using the normal masks (step 102).

Thereafter, the product mask is manufactured using the set of IP masks. In this embodiment, the product mask is manufactured as follows. First, a mask substrate for use in a product mask is prepared. A metal film formed of a layered film of chromium or chromium and chromium oxide or the like is deposited on a first main surface of the mask substrate, and the resist film is coated thereon. Subsequently, after the mask substrate for use in the product mask is set on the sample stage E11 of the exposure apparatus EXP, the mask substrate is exposed while setting the IP masks in turn on the mask stage E10 of the exposure apparatus EXP. Thereafter, the mask substrate is developed to form a resist pattern (step 103). In the formation of this resist pattern for use in the patterning of the metal pattern, i-beam, KrF excimer laser, ArF excimer laser, $F_2$ laser, or the like is used as the exposure light in this embodiment.

Subsequently, the lower metal film is etched and removed using the resist pattern formed in the step 103 as an etching mask, whereby forming the light-shielding pattern made of metal on the mask substrate in each pattern transfer region of the product mask. Thereafter, the resist pattern is removed (step 104). FIG. 19 shows the product mask Md4 in the step 104. In this embodiment, the adjacent pattern transfer regions 12a to 12e (pattern transfer regions 12a and 12b is exemplified here) are separated from each other at a distance of Xa in advance as shown in FIG. 19B. The light-shielding patterns 4d and d of the pattern transfer regions 12a and 12b are metal patterns formed in the step 104 and arranged to be separated from each other in this step.

Subsequently, after the electron beam resist film R, for example, is coated on the first main surface of the mask substrate 1 of the product mask Md4, the energy beam EB such as the electron beam is selectively irradiated onto the connection region J between the adjacent pattern transfer regions 12a to 12e, and the connection region J is developed as shown in FIG. 20 (step 105). By doing so, the light-shielding pattern 2j made of an organic film (electron beam resist film R or the like) is formed so as to connect the light-shielding patters 4d of the adjacent pattern transfer regions 12a to 12e as shown in FIG. 13B. As described above, the product mask Md4 exemplified in FIG. 13 is manufactured (step 106).

In this embodiment as described above, the patterns of the relatively large region are written using the IP masks, and on the other hand, the patterns of the connection regions, which are relatively small, used to connect the patterns, and require high dimensional precision, are written using the energy beam such as the electron beam. Therefore, both of the reduction of the manufacturing time of the mask and the improvement of the reliability of the mask can be achieved. For example, even if the relative positions of the arranged pattern transfer regions 12a and 12b are dislocated from each other in two dimensions, the light-shielding pattern 2j can be formed while taking into consideration the dislocation therebetween. Therefore, the shielding patterns 4d of the pattern transfer regions 12a and 12b are surely connected to each other, and the thinner portion and the thicker portion are not created in the transferred pattern on the wafer. Consequently, the reliability of the product mask can be improved.

Also, in the manufacturing of the product mask Md4, the necessity of the inspection for the dislocation between the connected pattern transfer regions 12a to 12e can be eliminated. In addition, the occurrence of the case where the mask must be manufactured again due to the dislocation therebetween can be prevented. According to these, the manufacturing time of the product mask can be greatly reduced, and the development period and a manufacturing time of the semiconductor integrated circuit device can be greatly reduced.

Moreover, the inspection apparatus for the dislocation between the pattern transfer regions 12a to 12e is not required. Also, since the occurrence of the case where the mask must be manufactured again due to the dislocation therebetween can be prevented, the equipment cost, the material cost, and the fuel cost or the like can be greatly reduced. Thus, the manufacturing cost of the mask can be reduced. Therefore, the manufacturing cost of the semiconductor integrated circuit device can be reduced.

Then, after setting the product mask on the exposure apparatus EXP, exposure is performed onto the resist film on the device surface of the wafer, thereby transferring a plurality of chip forming regions onto the device surface of the wafer. In this embodiment, since the occurrence of failures such as disconnection and short circuit to the adjacent pattern can be reduced or prevented in the connection region of each pattern of the circuit regions 10a to 10e of the semiconductor integrated circuit device, the reliability and the defect rate of the semiconductor integrated circuit device can be improved. Since the following manufacturing process of the semiconductor integrated circuit device according to this embodiment is identical to that of a usual semiconductor integrated circuit device, description thereof is omitted.

(Second Embodiment)

Figure 21:
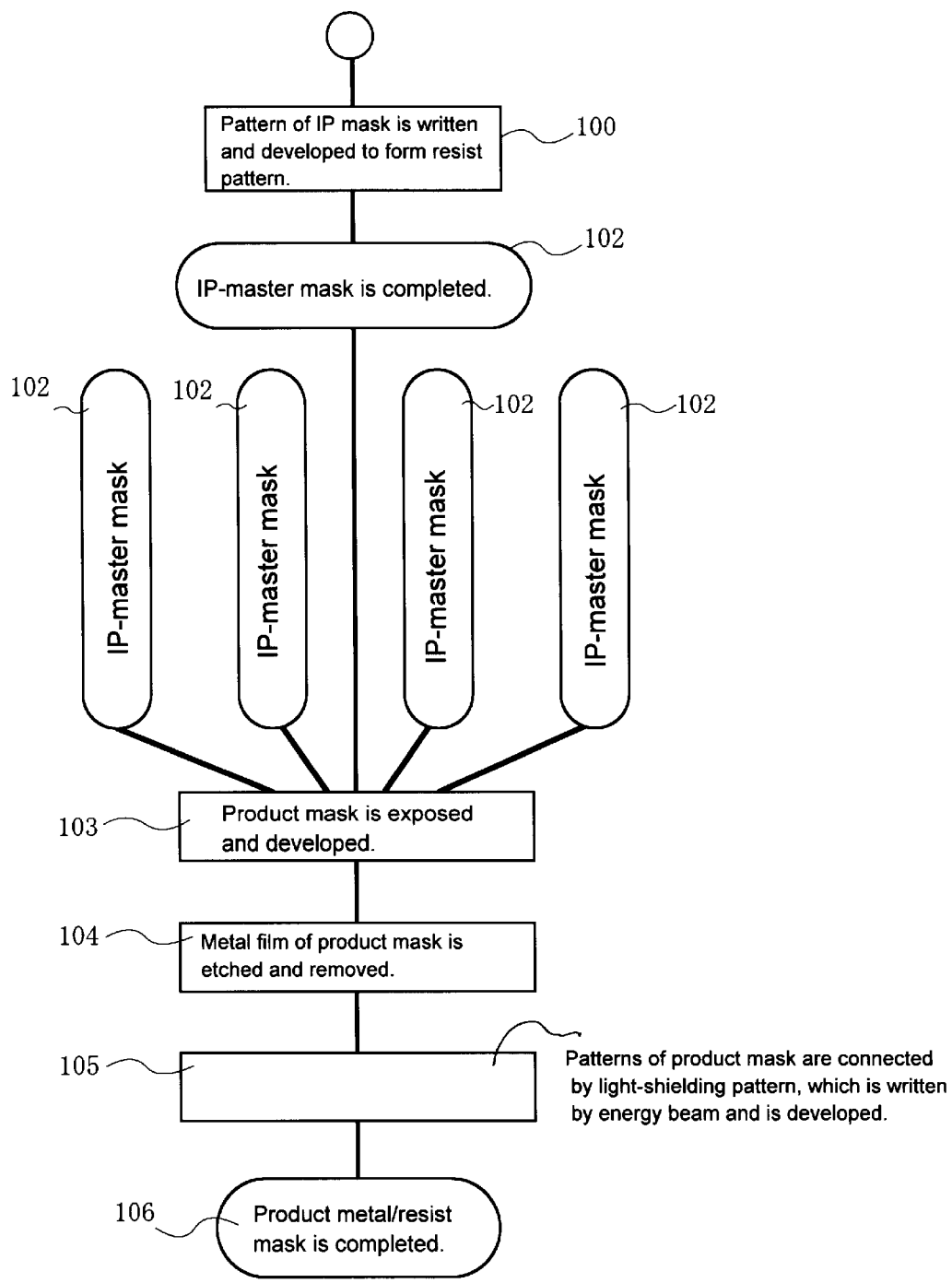
FIG. 21 is a flow chart showing a manufacturing process of the photomask used in the method of manufacturing a semiconductor integrated circuit device according to another embodiment of the present invention.

In the first embodiment, the case where the IP mask is constituted of a normal mask has been described. However, the IP mask is not limited to this. For example, the IP mask may be constituted of a resist mask, and FIG. 21 shows an example of a manufacturing process according to the manufacturing method of the mixed device (refer FIG. 11) in such a case. The manufacturing process in this case is identical to that of the mixed device shown in FIG. 18 except that the step for etching the metal film is eliminated in the manufacturing of the IP mask. In this example, since the step for etching the metal film is eliminated in the manufacturing of the IP mask, the manufacturing time of the IP mask can be reduced as described above. In addition, the dimensional precision of the pattern of the IP mask can be improved as described above. Also, the occurrence of failures can be reduced as described above. Furthermore, the manufacturing cost of the IP mask can be reduced as described above.

(Third Embodiment)

Figure 22A:
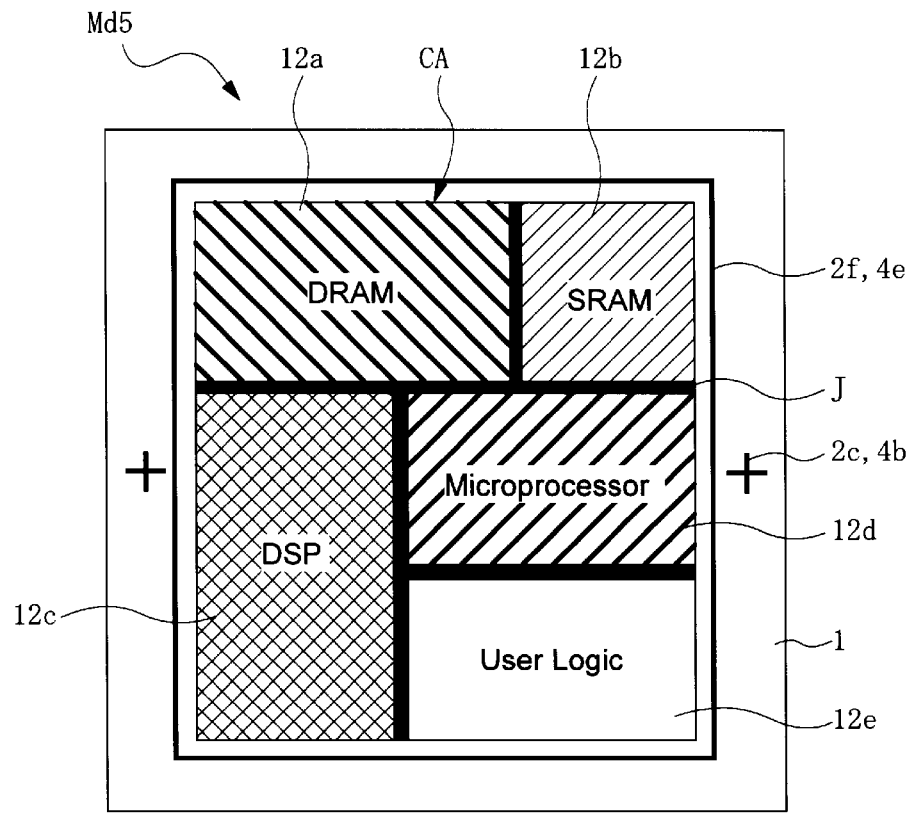
FIG. 22A is a general plan view of the photomask in the manufacturing process of FIG. 21.
Figure 22B:
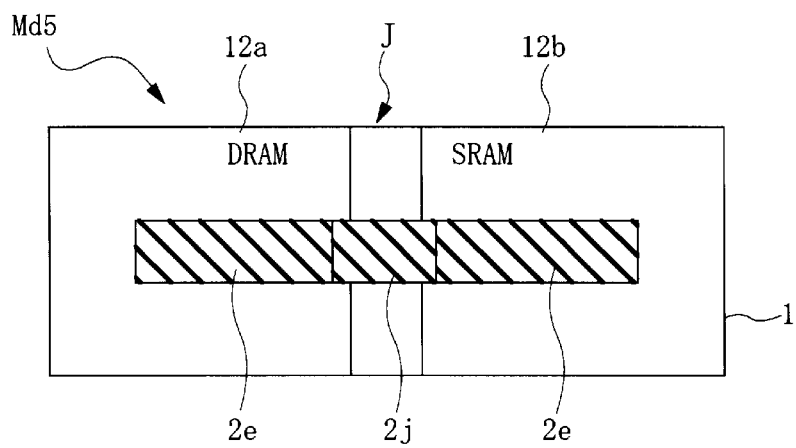
FIG. 22B is an enlarged plan view showing the principal portion of FIG. 22A.

In this embodiment, the case where the IP mask and the product mask are constituted of the resist mask will be described. An example of a product mask Md5 according to this embodiment is shown in FIG. 22. FIG. 22A is a general plan view of the product mask Md5, and FIG. 22B is an enlarged plan view of the connection region J between the different pattern transfer regions shown in FIG. 22A. Note that the product mask Md5 of FIG. 22A is hatched or not hatched in parts, which has the same meaning as described in the case of FIG. 13. In FIG. 22B, the light-shielding pattern made of an organic film is hatched.

The structure of the product mask Md5 is approximately the same as that of the product mask Md4 described in FIG. 13 except that the light-shielding pattern in the integrated circuit pattern region CA is all made of the organic film (electron beam resist film or the like). As shown in FIG. 22B, the light-shielding patterns 2e and 2e made of an organic film in the pattern transfer regions 12a and 12b are connected to each other by the light-shielding pattern 2j made of an organic film arranged in the connection region J. The light-shielding patterns 2e and 2j are made of the same organic film (electron beam resist film or the like) and are formed unitedly. However, the light-shielding pattern 2e and the light-shielding pattern 2j are exposed in the different ways. Specifically, the pattern writing of the light-shielding pattern 2e is performed by the exposure using the IP mask, and the pattern writing of the light-shielding pattern 2j is performed by the exposure using the energy beam such as the electron beam and the laser writer. Therefore, similarly to the description above, the light-shielding pattern 2j of the connection region J can be formed so as to surely connect the light shielding patterns 2e and 2e of the different pattern transfer regions 12a and 12b and so as not to create any thinner portion and thicker portion in the transferred pattern on the wafer. Thus, it becomes possible to improve the reliability of the product mask. Accordingly, when the semiconductor integrated circuit device is manufactured using the product mask, the occurrence of failures such as disconnection and short circuit to the adjacent pattern can be reduced or prevented especially in the connection region of each pattern of the circuit regions 10a to 10e of the semiconductor integrated circuit device. Therefore, the reliability and the defect rate of the semiconductor integrated circuit device can be improved. Note that, since the state of the pattern transferred onto the wafer by the exposure using the product mask Md5 is the same as that described in FIGS. 15 to 17, the description thereof is omitted.

Figure 23:
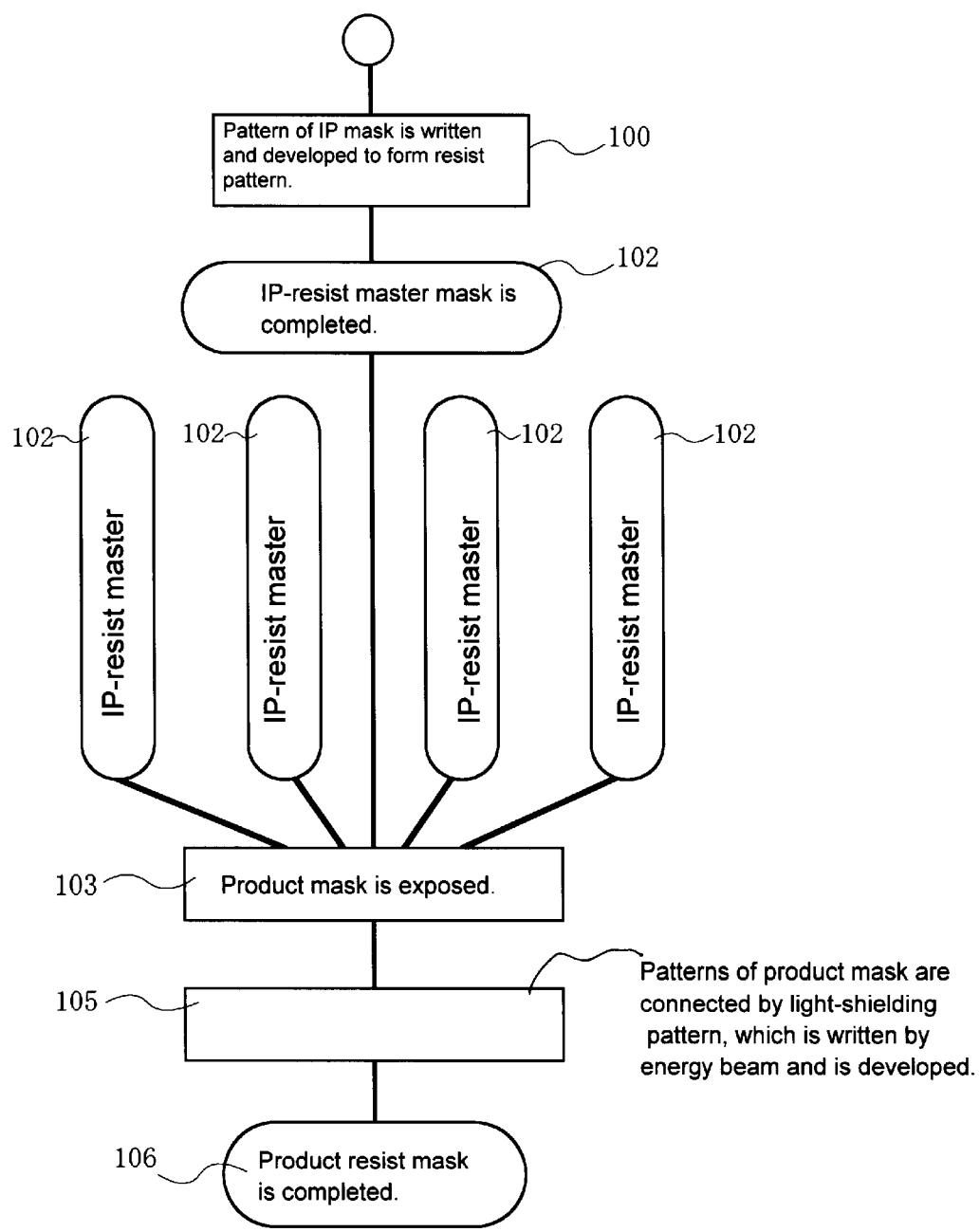
FIG. 23 is a flow chart showing a manufacturing process of the photomask used in the method of manufacturing a semiconductor integrated circuit device according to another embodiment of the present invention.
Figure 24A:
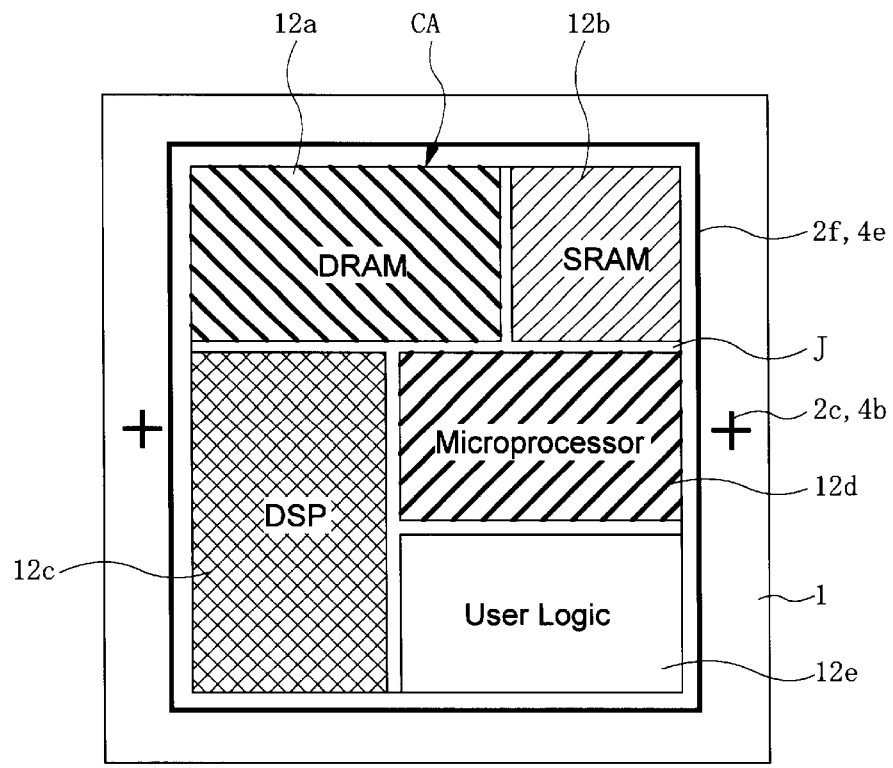
FIG. 24A is a general plan view showing the photomask in the manufacturing process of FIG. 23.
Figure 24B:
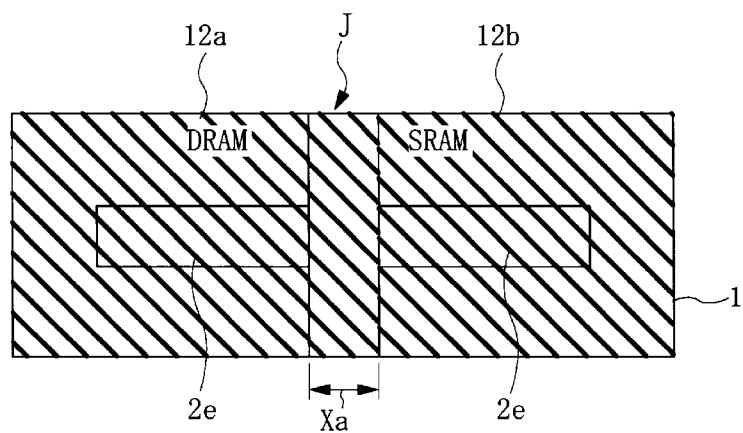
FIG. 24B is an enlarged plan view showing the principal portion of FIG. 24A.
Figure 25A:
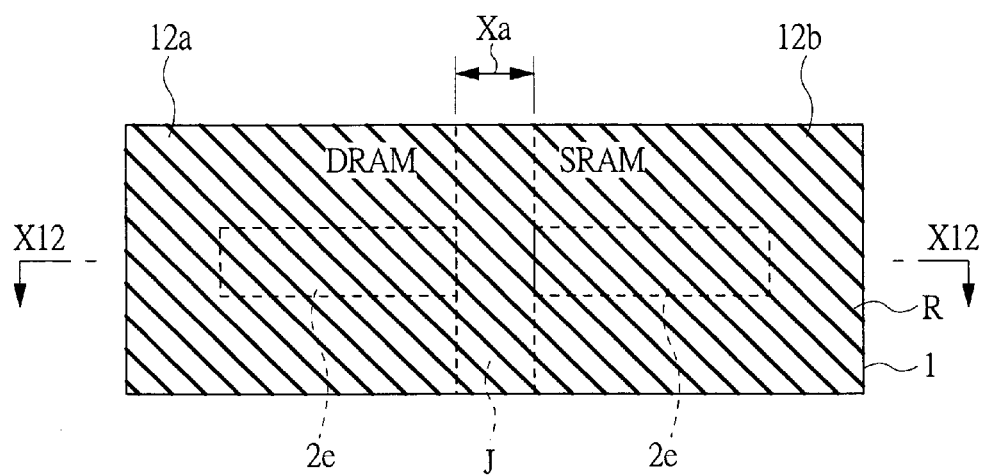
FIG. 25A is a plan view of the principal portion of the photomask in the manufacturing process of FIG. 23, which shows the next step of the step of FIG. 24.
Figure 25B:
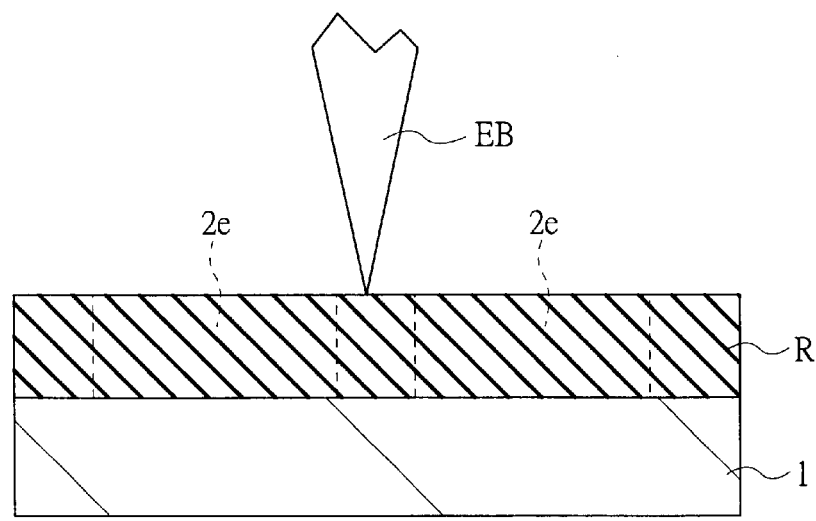
FIG. 25B is a cross-sectional view showing the principal portion of FIG. 25A.

Next, a concrete example of a manufacturing process of the mixed device like this will be described along a flow chart shown in FIG. 23 and by the use of FIGS. 24 and 25. FIG. 24A is a plan view showing the product mask under fabrication, and FIG. 24B is an enlarged plan view of the connection region between the adjacent pattern transfer regions of FIG. 24A. FIG. 25A is an enlarged plan view of the connection region between the adjacent pattern transfer regions of the product mask under fabrication, and FIG. 25B is a cross-sectional view taken along the line X12—X12 of FIG. 25A.

In this example, after performing the steps 100 to 102 of FIG. 21 as described in the second embodiment, the manufacturing process proceeds as follows.

First, a mask substrate for use in the product mask is prepared. A main surface of the mask substrate is not coated with a metal film but coated with, for example, an organic film such as the electron beam resist film. Subsequently, after the mask substrate for use in the product mask is set on the sample stage E11 of the exposure apparatus EXP, the mask substrate is exposed while setting the IP masks in turn on the mask stage E10 of the exposure apparatus EXP (step 103). Here, KrF excimer laser, ArF excimer laser, or $F_2$ laser is used as the exposure light in this exposure. The product mask in this step is shown in FIG. 24. The light-shielding pattern 2e is written on the electron beam resist film R on the first main surface of the mask substrate 1 of the product mask Md5. The light-shielding pattern 2e is in a state of a latent image because the development is not performed yet. The different pattern transfer regions 12a and 12b are separated from each other at the distance of Xa similarly to those in the first and second embodiments.

Next, on the first main surface of the mask substrate 1 of the product mask Md5, the energy beam EB is selectively irradiated onto the connection region J between the adjacent pattern transfer regions 12a to 12e as shown in FIG. 25. The electron beam, the laser writer (wavelength: 365 nm), and the like are possibly used as the energy beam EB, and the electron beam is employed in this case. The reason therefor is as follows. Since KrF excimer laser or the like is used when transferring the patterns of the IP masks to form the patterns of the pattern transfer regions 12a to 12e by the exposure using the IP masks, the electron beam is more preferably used than the laser writer to achieve the faster writing speed in terms of compatibility to the material of the resist film. On the other hand, in the case where i-beam is used in the exposure using the IP masks, the laser writer is more preferably used as the energy beam than the electron beam because the photosensitivity of the resist film can be improved, thereby enabling to achieve the faster writing speed.

Thereafter, the mask substrate 1 for use in the product mask is developed (step 105). Consequently, the light-shielding patterns 2e are formed in the pattern transfer regions 12a to 12e, and the light-shielding patterns 2j are formed in the connection regions between the adjacent pattern transfer regions 12a to 12e so as to connect the light-shielding patterns 2e and 2e formed in the adjacent pattern transfer regions 12a to 12e as shown in FIG. 22B. Thus, the product mask Md5 exemplified in FIG. 22 is manufactured (step 106).

According to this embodiment, in addition to the advantages obtained in the first and second embodiments, the advantages as follows can be obtained. Specifically, since the step for etching the metal is completely unnecessary both in the manufacturing process of the IP mask and the manufacturing process of the product mask, a development period and a manufacturing time of the mixed device can be further reduced. Also, as described above, the dimensional precision of the pattern of the semiconductor integrated circuit device can be further improved. Furthermore, since the manufacturing cost of the mask can be reduced more than the cases described in the first and second embodiments, the manufacturing cost of the mixed device can be greatly reduced.
(Fourth Embodiment)

Figure 26:
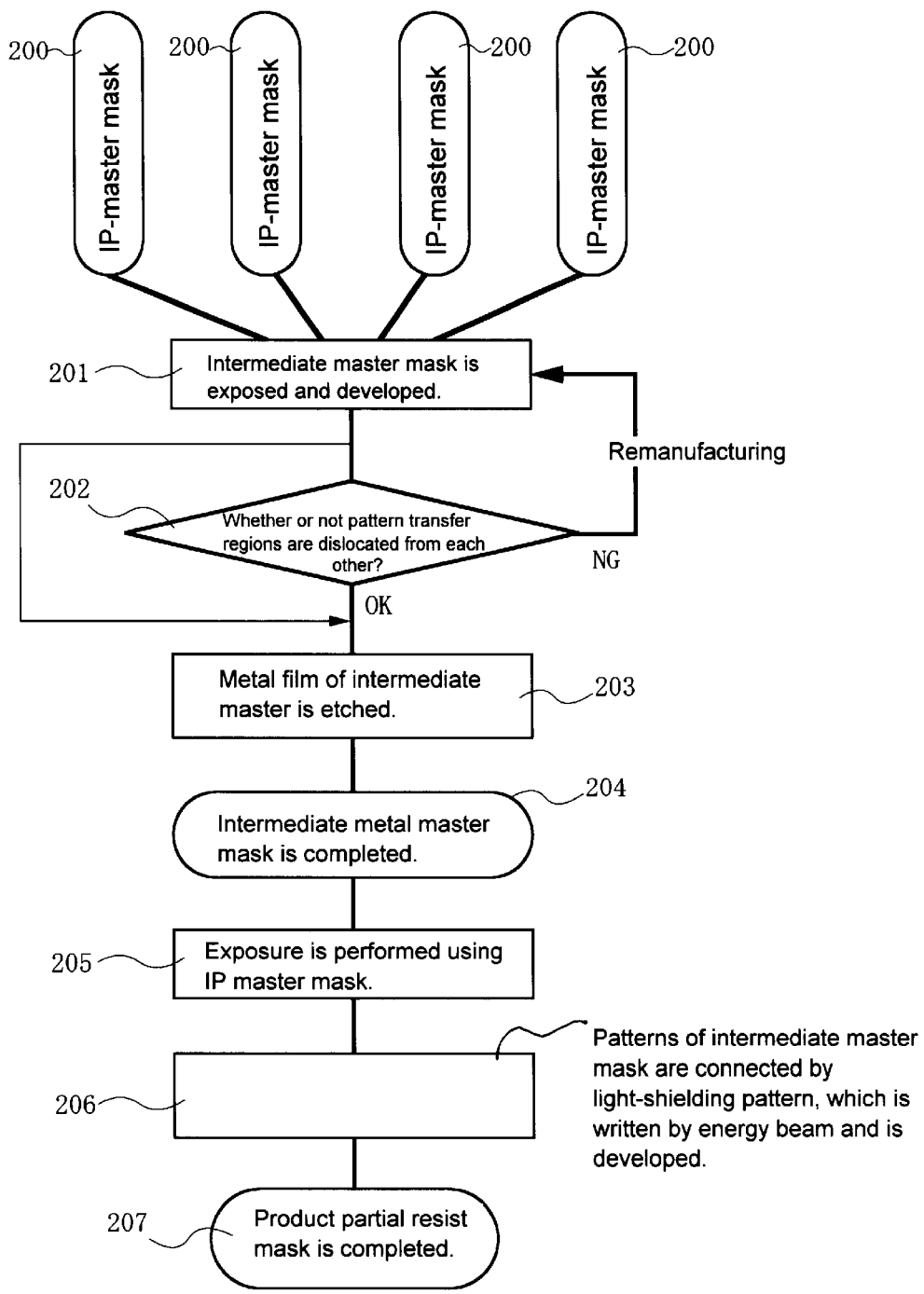
FIG. 26 is a flow chart showing a manufacturing process of the photomask used in the method of manufacturing a semiconductor integrated circuit device according to another embodiment of the present invention.

In this fourth embodiment, the case where a part of the product mask is modified will be described. FIG. 26 shows a concrete example of the manufacturing process according to the method of manufacturing the mixed device of FIG. 11.

First, as shown in FIG. 26, a set of IP masks are manufactured similarly to the second and third embodiments. The IP masks in this embodiment may be normal masks, resist masks, or the combination of the normal mask and the resist mask (step 200). Subsequently, the mask substrate for use in the product mask is set on the sample stage E11 of the exposure apparatus EXP. On this mask substrate, for example, the metal film similar to that described in FIG. 4 is deposited, and the resist film is coated thereon. Then, the mask substrate is exposed while setting the IP masks in turn on the mask stage E10 of the exposure apparatus EXP, thereby transferring the patterns of the IP masks onto the resist film of the mask substrate of the product mask. Then, the development is performed (step 201). Thereafter, the resist pattern formed on the mask substrate for use in the product mask is inspected. At this time, the existence of the dislocation in connection between the pattern transfer regions of the product mask is inspected (step 202). As a result of the inspection, if there is the dislocation in the connection therebetween, the product mask is manufactured again. On the other hand, if there is no dislocation inspected, the lower metal film is patterned by the etching method using the resist pattern as an etching mask, thus manufacturing an intermediate master mask (steps 203 and 204). Note that the step 202 may be eliminated in this embodiment. The elimination of the step 202 can reduce the manufacturing time of the product mask and the manufacturing cost of the mask.

Figure 27A:
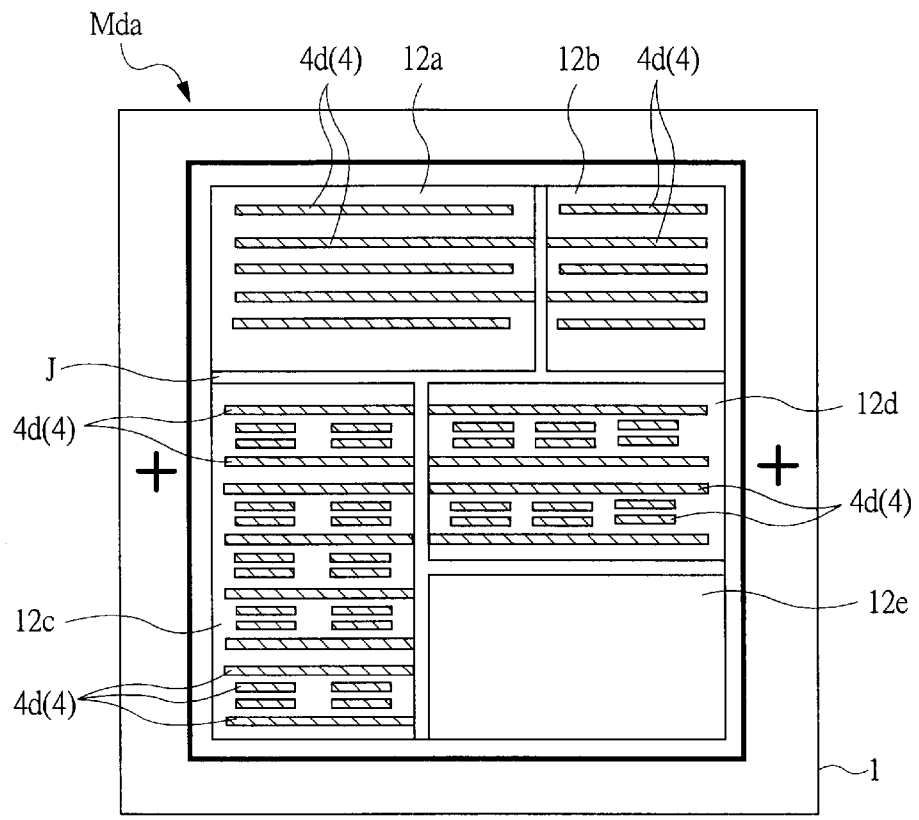
FIG. 27A is a general plan view of the photomask in the manufacturing process of FIG. 26.
Figure 27B:
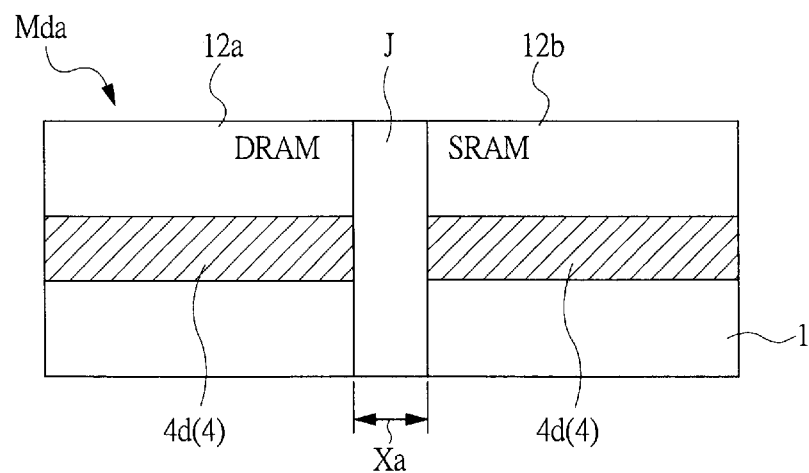
FIG. 27B is an enlarged plan view showing the principal portion of FIG. 27A.

An example of the intermediate master mask is shown in FIG. 27. FIG. 27A is a general plan view of the intermediate master mask, and FIG. 27B is an enlarged plan view of the connection region J between the different pattern transfer regions 12a to 12e. Note that the light-shielding pattern made of metal in FIG. 27 is hatched.

This intermediate master mask Mda is not completed as the product mask, that is, an incomplete mask. In the pattern transfer regions 12a to 12d of the intermediate master mask Mda, the light-shielding pattern 4 (4d) made of, for example, a metal film is formed. However, in the pattern transfer region 12e used in the transfer of the pattern of, for example, the user logic circuit section, no light-shielding pattern (neither light-shielding pattern made of metal nor that made of organic film) is formed. Also in this intermediate master mask Mda, the boundaries of the adjacent pattern transfer regions 12a to 12e are separated from each other at a distance of Xa (i. e., at the distance equal to the width of the connection region J).

Figure 28A:
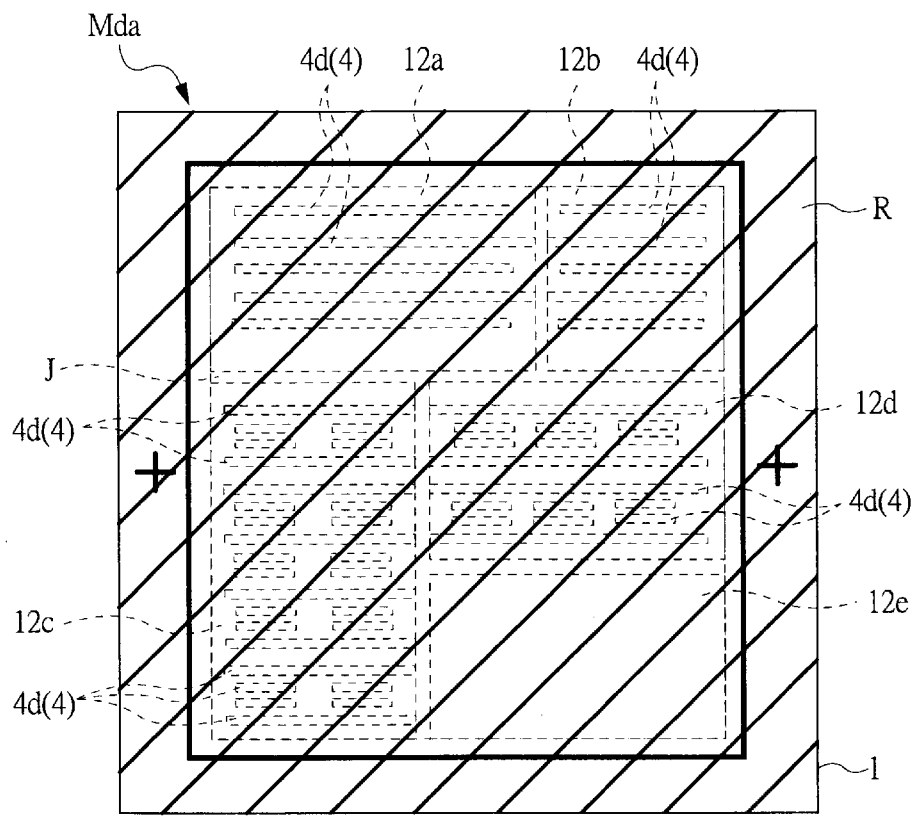
FIG. 28A is a plan view of the principal portion of the photomask in the manufacturing process of FIG. 26, which shows the next step of the step of FIG. 27.
Figure 28B:
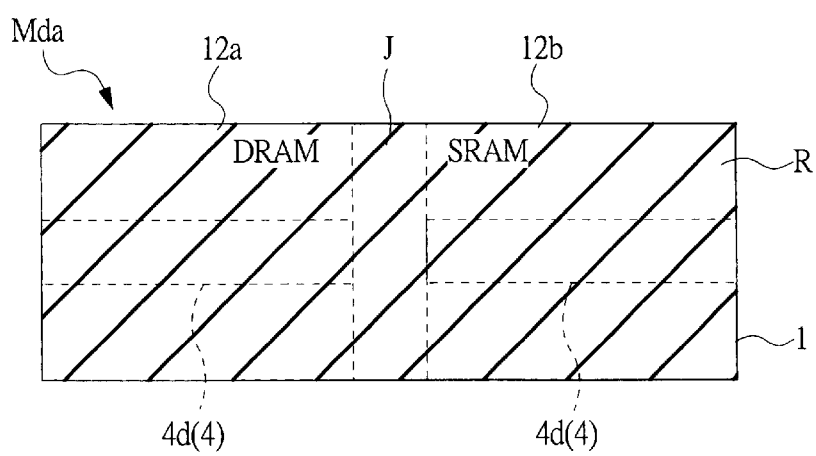
FIG. 28B is a cross-sectional view showing the principal portion of FIG. 28A.
Figure 29A:
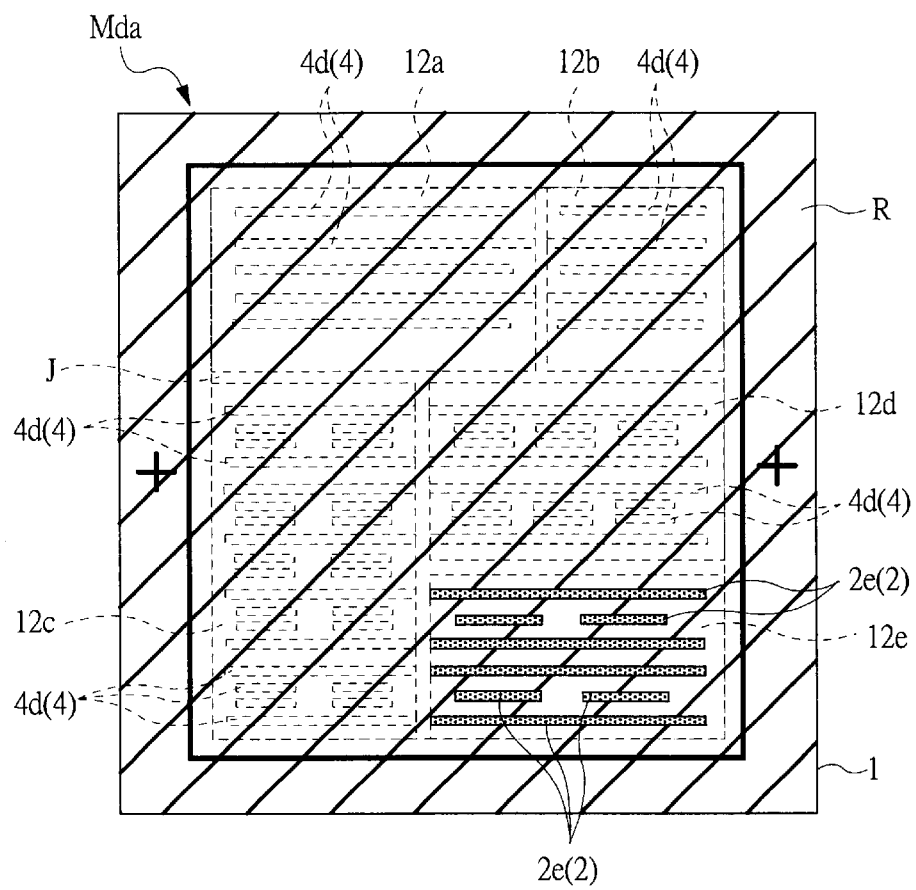
FIG. 29A is a plan view of the principal portion of the photomask in the manufacturing process of FIG. 26, which shows the next step of the step of FIG. 28.
Figure 29B:
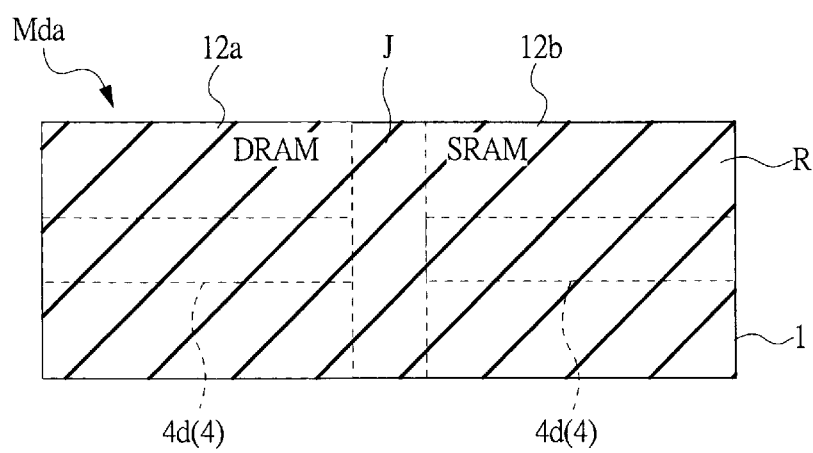
FIG. 29B is a cross-sectional view showing the principal portion of FIG. 29A.

Subsequently, as shown in FIG. 28, the electron beam resist film R is coated on a first main surface of the mask substrate 1 of the intermediate master mask Mda. Note that FIG. 28A is a general plan view of the connection region J, and FIG. 28B is an enlarged plan view of the same. Next, the intermediate master mask Mda is set on the sample stage E11 of the exposure apparatus EXP, and the IP mask used to transfer the pattern onto the circuit region 10e shown in FIG. 11 is set on the mask stage E10. In this state, the exposure is performed (step 205). Consequently, as shown in FIG. 29, the light-shielding pattern 2e (2) made of an organic film (electron beam resist film R) is transferred onto the pattern transfer region 12e used to transfer the pattern onto the user logic circuit section of the intermediate master mask Mda. The light-shielding pattern 2e is in a state of a latent image because the development is not performed yet. In FIG. 29, the region to be the exposed light-shielding pattern 2e is hatched in the different way from the electron beam resist film R so as to make the drawings easy to see.

Figure 30A:
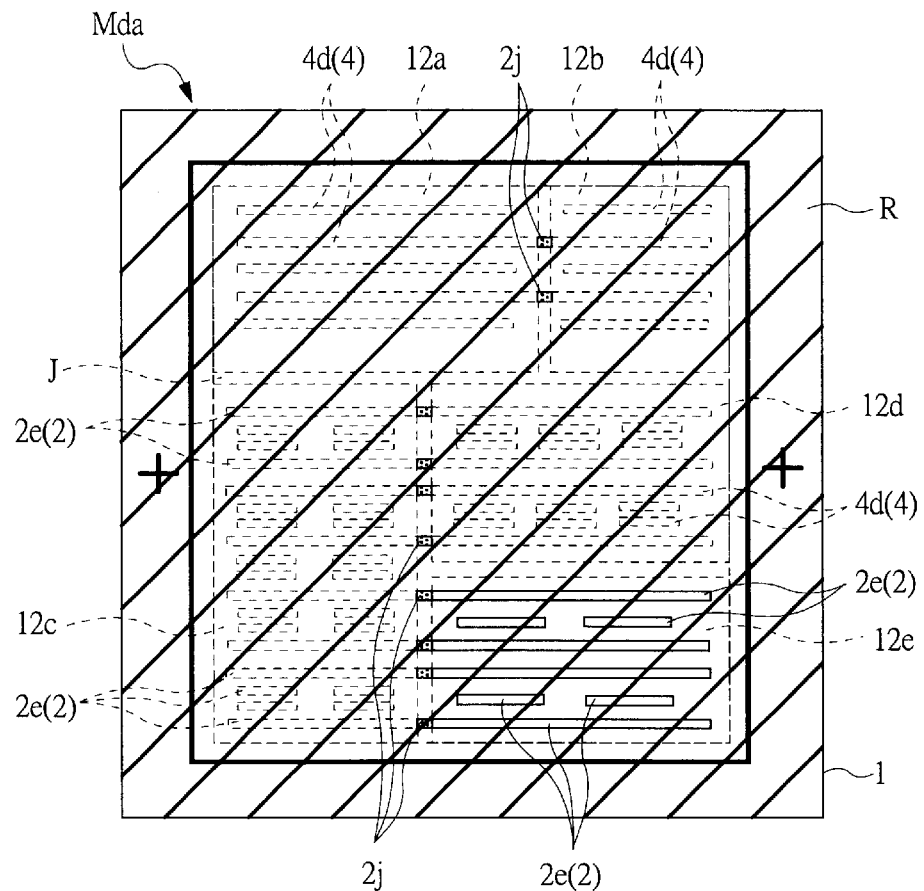
FIG. 30A is a plan view of the principal portion of the photomask in the manufacturing process of FIG. 26, which shows the next step of the step of FIG. 29.
Figure 30B:
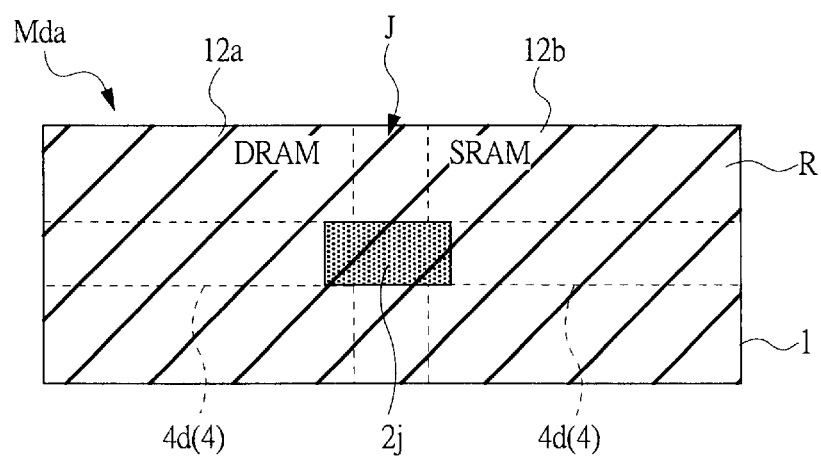
FIG. 30B is a cross-sectional view showing the principal portion of FIG. 30A.

Subsequently, similarly to the third embodiment, the energy beam such as the electron beam is selectively irradiated onto the connection region J between the pattern transfer regions 12a to 12e of the intermediate master mask Mda. By this irradiation, as shown in FIG. 30, the light-shielding patterns 2j (2) are formed in the connection regions J between the adjacent pattern transfer regions 12a to 12e so as to connect the light-shielding patterns 4d in the adjacent pattern transfer regions 12a to 12e. The light-shielding pattern 2j is made of the electron beam resist film R or the like. In FIG. 30, the region to be the exposed light-shielding pattern 2e is hatched in the different way from the electron beam resist film R so as to make the drawings easy to see.

As described above, the light-shielding pattern 2e (2) made of an organic film is formed in the pattern transfer region 12e used in the transfer of the pattern of the user logic circuit section (exposure using the IP mask), and the light-shielding patterns 2j made of the organic film are formed in the connection region J between the adjacent pattern transfer regions 12a to 12e so as to connect the light-shielding patterns 4d and 2e in the adjacent pattern transfer regions 12a to 12e (exposure using the energy beam).

Figure 31A:
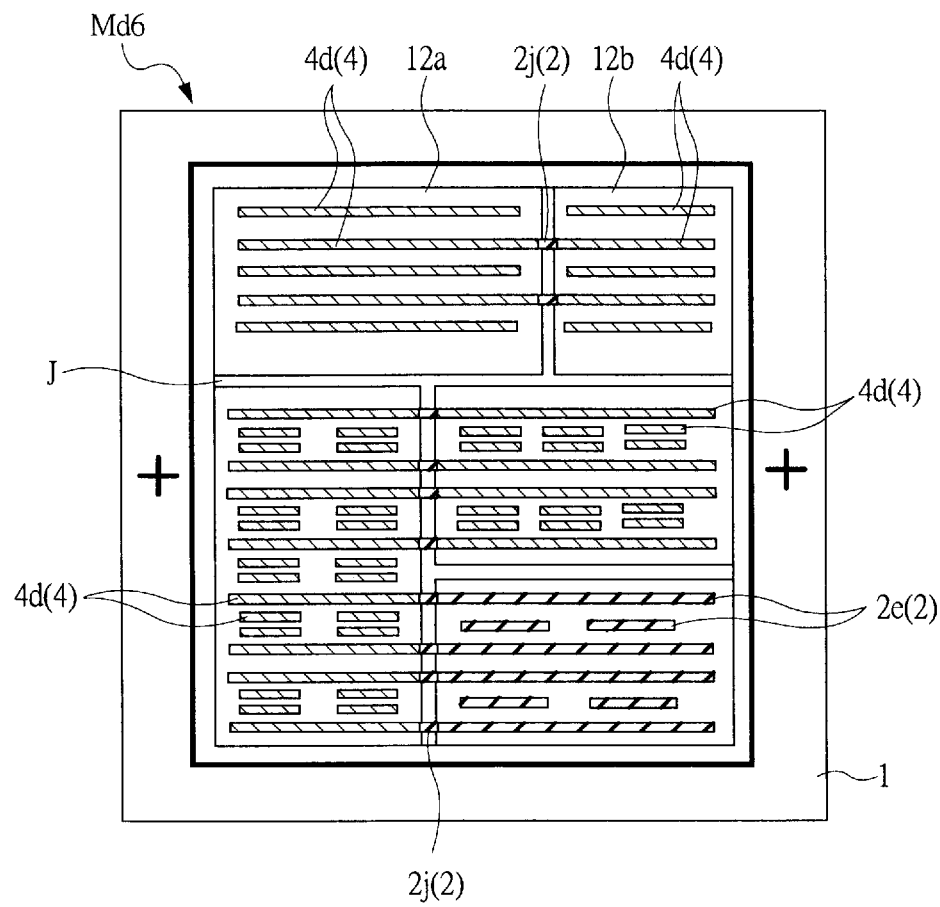
FIG. 31A is a plan view of the principal portion of the photomask in the manufacturing process of FIG. 26, which shows the next step of the step of FIG. 30.
Figure 31B:
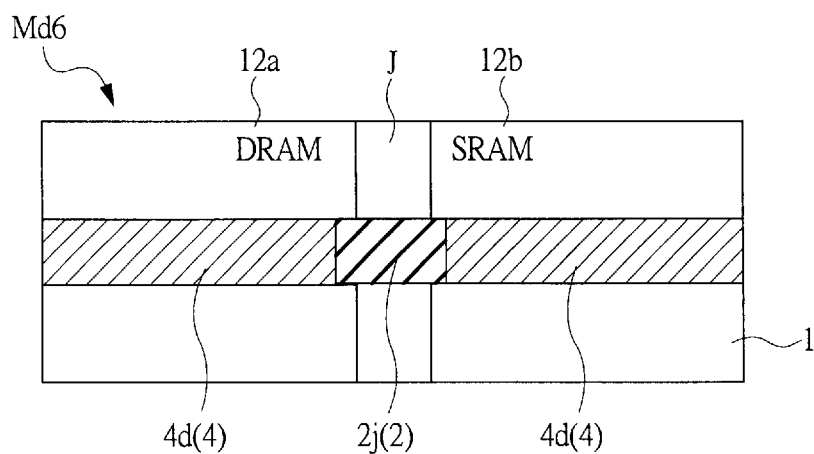
FIG. 31B is a cross-sectional view showing the principal portion of FIG. 31A.

After the exposure using the IP mask and the exposure using the energy beam as described above, the development is performed to the electron beam resist film R, whereby a product mask Md6 is manufactured as shown in FIG. 31. In this product mask Md6, the light-shielding pattern 4d (4) made of metal is formed in the pattern transfer regions 12a to 12d, the light-shielding pattern 2e (4) made of an organic film is formed in the pattern transfer region 12e, and the light-shielding pattern 2j (2) made of an organic film is formed in the connection region J between the pattern transfer regions 12a to 12e (step 206). In FIG. 31, the light-shielding patterns made of metal are hatched with thin lines and the light-shielding pattern made of an organic film is hatched with thick lines so as to make the drawings easy to see. Also, the technique of the partial resist mask, in which the light-shielding pattern made of an organic film is partially arranged as described above, is disclosed in the Japanese Patent Applications No. 2000-206728 and No. 2000-206729 by the inventors of this application (both filed on Jul. 7, 2000).

Figure 32A:
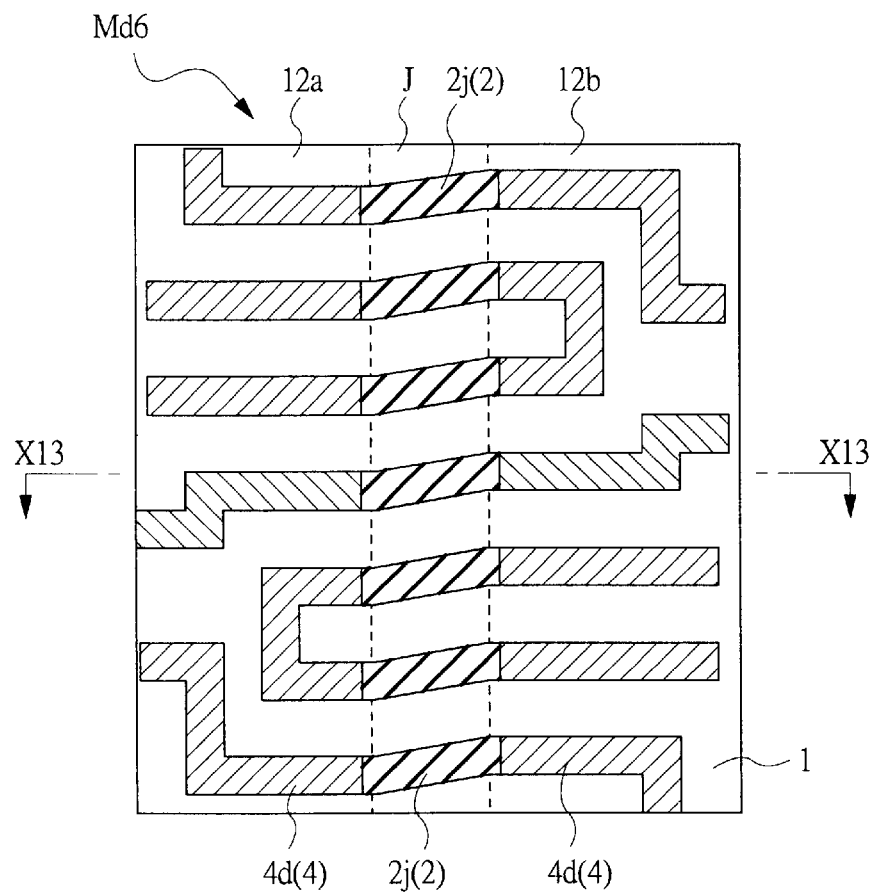
FIG. 32A is a plan view showing the principal portion of the photomask manufactured in the manufacturing process of FIG. 26.
Figure 32B:
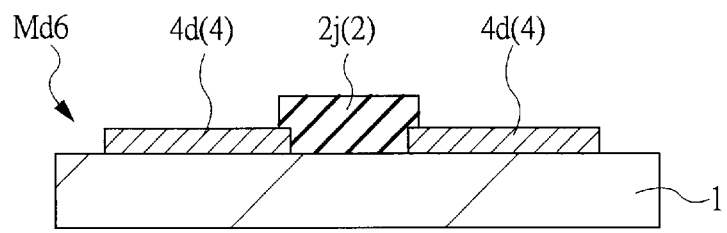
FIG. 32B is a cross-sectional view taken along the line X13—X13 of FIG. 32A.

FIG. 32 exemplifies a result obtained by applying the present invention to the case where the positions of the pattern transfer regions 12a and 12b in two dimensions are dislocated from each other. FIG. 32A is an enlarged plan view of the connection region J of the product mask Md6, and FIG. 32B is a cross-sectional view taken along the line X13—X13 of FIG. 32A.

The positions of the light-shielding patterns 4d in the pattern transfer regions 12a and 12b in two dimensions are dislocated from each other in the longitudinal direction of FIG. 32. In this embodiment, however, the light-shielding patterns 2j (2) made of an organic film are arranged in the connection region J between the pattern transfer regions 12a and 12b. Thus, the light-shielding patterns 4d and 4d of the pattern transfer regions 12a and 12b are appropriately connected. Therefore, if the pattern is transferred onto the resist film on the wafer using this product mask Md6, the resist pattern can be transferred onto the wafer without creating any thinner portion and thicker portion in the position corresponding to the connection region J.

Also in this example, the case where the light-shielding pattern 2j connecting the light-shielding patterns 4d and 4d of the pattern transfer regions 12a and 12b has an approximately linear shape is exemplified. However, more complicated connection by the light-shielding pattern 2j can be also realized by expanding the width of the connection region J. Specifically, it is also possible to change the connection state of the circuit by the light-shielding pattern 2j formed in the connection region J. Therefore, it becomes possible to deal with the small change in the connection quickly and at low cost. Accordingly, prompt delivery and the cost reduction of the semiconductor integrated circuit device can be realized.

Figure 33:
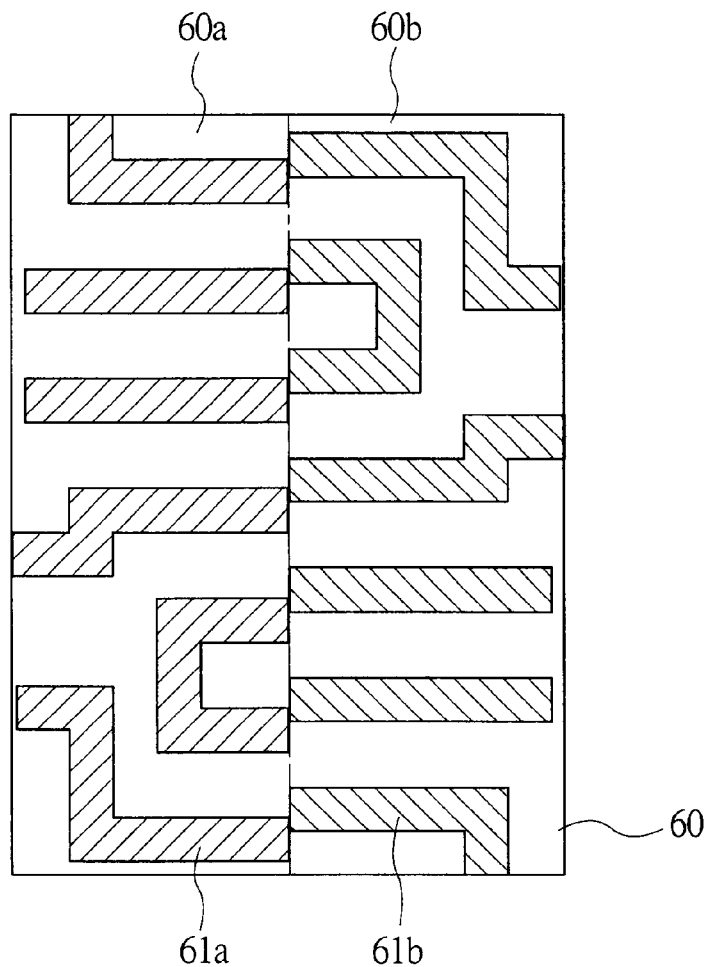
FIG. 33 shows a technique studied by the inventors of this invention and is a plan view showing the principal portion of the photomask corresponding to the portion shown in FIG. 32, to which the present invention is not applied.

On the other hand, FIG. 33 exemplifies the case to which the present invention is not applied. Light-shielding patterns 61a and 61b of pattern transfer regions 60a and 60b on a mask substrate 60 are arranged in such a state that the positions thereof are dislocated from each other. Therefore, if a pattern is transferred onto a wafer using this mask substrate, the failure such as disconnection occurs at the position corresponding to the connection region. In this example, the case where the pattern transfer regions 60a and 60b are dislocated from each other simply in the longitudinal direction of FIG. 33 is exemplified. However, the arrangement of the dislocated patterns is not limited to this, and the variety of cases such as the case where the patterns are separated from each other, the case where the patterns are overlapped on each other, the patterns are dislocated in the orthogonal direction, and the combination thereof are enumerated.

Figure 34:
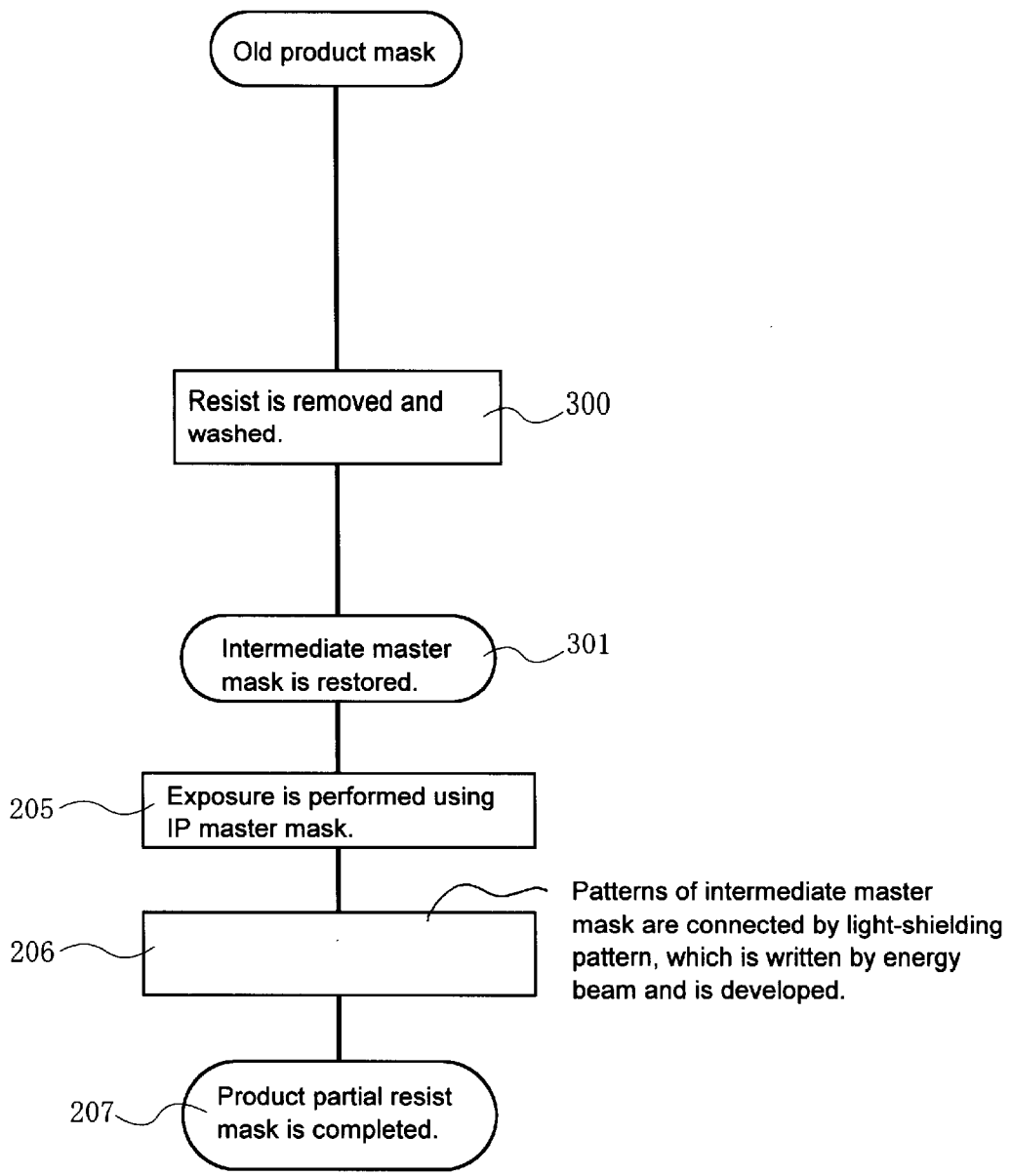
FIG. 34 is a flow chart showing the manufacturing process of the photomask used in the method of manufacturing a semiconductor integrated circuit device according to another embodiment of the present invention.

Next, the method of reproducing the product mask Md6 like this will be described. FIG. 34 shows an example of the process of the modification method. For example, in the modification of the pattern in the user logic circuit section, firstly, the light-shielding patterns 2e and 2j (2) made of an organic film in the pattern transfer region 12e and the connection region J of the product mask Md6 are removed to wash the product mask Md6 (step 300). Thus, the product mask Md6 returns to the intermediate master mask Mda shown in FIG. 27. Specifically, the light-shielding pattern 4d made of metal is only left in the integrated circuit pattern region CA on the first main surface of the mask substrate 1 in this step. In this method, since the etching step of the metal film used to manufacture the intermediate master mask Mda is unnecessary, the QTAT (Quick Turn Around Time) of the product mask can be realized (step 301). Thereafter, for example, the pattern of the pattern transfer region 12e for the user logic circuit section is modified through the steps identical to the steps 205 to 207 described in FIG. 26, thus reproducing the product mask. Therefore, a mixed device having different circuit structure can be manufactured in a short time at low cost. The method of manufacturing the product mask like this is also suitable to the case of providing a plurality of mixed devices of the same type but having a little different electrical properties in series. The method of manufacturing the product mask like this is also suitable to the case where mixed devices having various electrical properties for use in experiments are manufactured so as to select the optimum one among such electrical properties during the development of such devices. This is because the large amount of data can be obtained in a short time. Of course, the same pattern may be formed again in the reproduction of the product mask.

(Fifth Embodiment)

Figure 35:
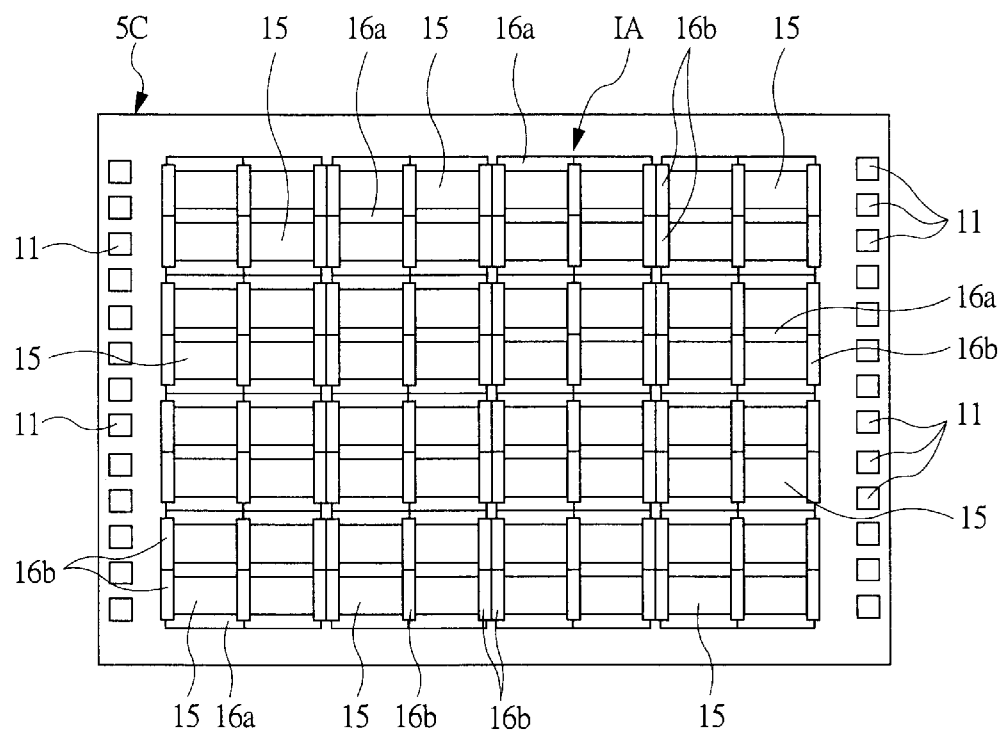
FIG. 35 is a general plan view of an example of the semiconductor chip constituting the semiconductor integrated circuit device according to still another embodiment of the present invention.

In this embodiment, the case where the present invention is applied to, for example, DRAM will be exemplified. An example of the DRAM is shown in FIG. 35.

A plurality of memory mats 15 are regularly arranged in an inner circuit region IA positioned at the center of the chip 5C. A plurality of memory cells each having, for example, one MISFET (Metal Insulator Semiconductor Field Effect Transistor) and one capacitor are regularly arranged in each of the memory mats 15. Each of the memory cells is arranged in the vicinity of the intersection point between a word line and a data line laid so as to cross the word line. In addition, peripheral circuit regions 16a and 16b are arranged in the vicinity of each of the memory mats 15. Various peripheral circuits such as a decoder circuit, a sense amplifier circuit, and a driver circuit are arranged in the peripheral circuit regions 16a and 16b. Moreover, a plurality of outer terminals 11 are arranged in an outer peripheral areas near the shorter sides of the inner circuit region IA.

Figure 36:
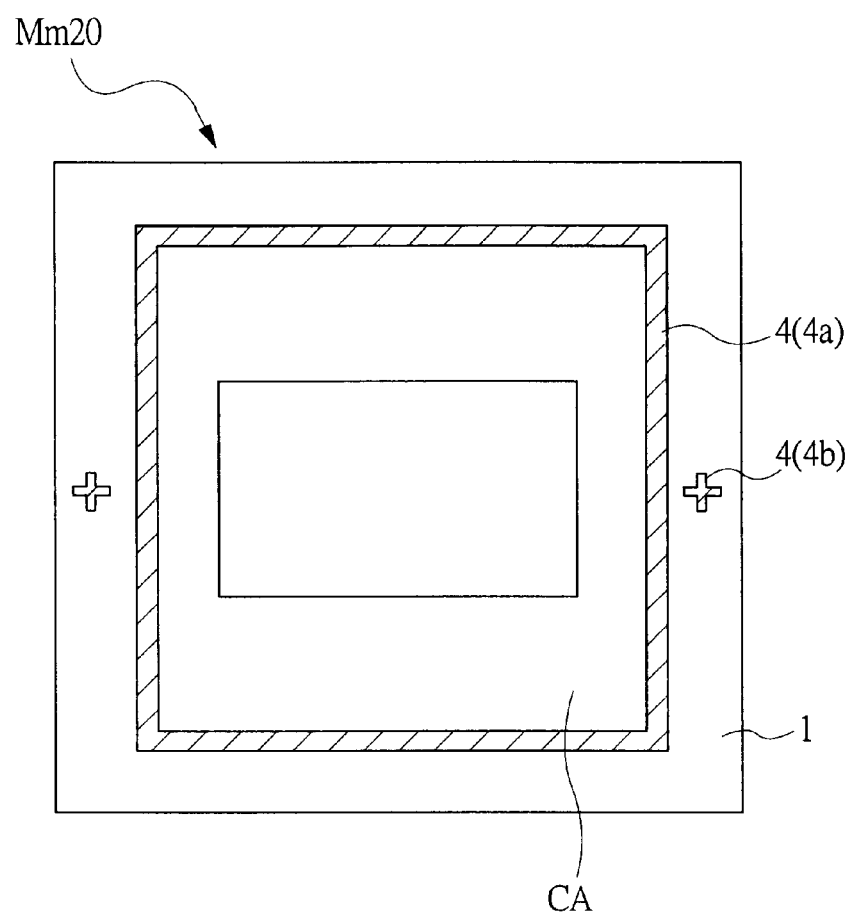
FIG. 36 is a general plan view of an example of the photomask used for manufacturing the semiconductor integrated circuit device of FIG. 35.

Next, an example of an IP mask used in this embodiment will be described. In this embodiment, an IP mask (first IP mask) for transferring the pattern onto the memory mat 15 is prepared. FIG. 36 shows an IP mask Mm20 as an example of the IP mask for transferring the pattern onto the memory mat 15.

Both of the normal mask and the resist mask may be used as the IP mask Mm20. In this example, one IP mask Mm20 is provided with one region for the transfer of the memory mat. However, the IP mask is not limited to this, and a plurality of regions (block unit or chip unit) for the transfer of the patterns onto the memory mats may be provided on one IP mask Mm20.

Figure 37:
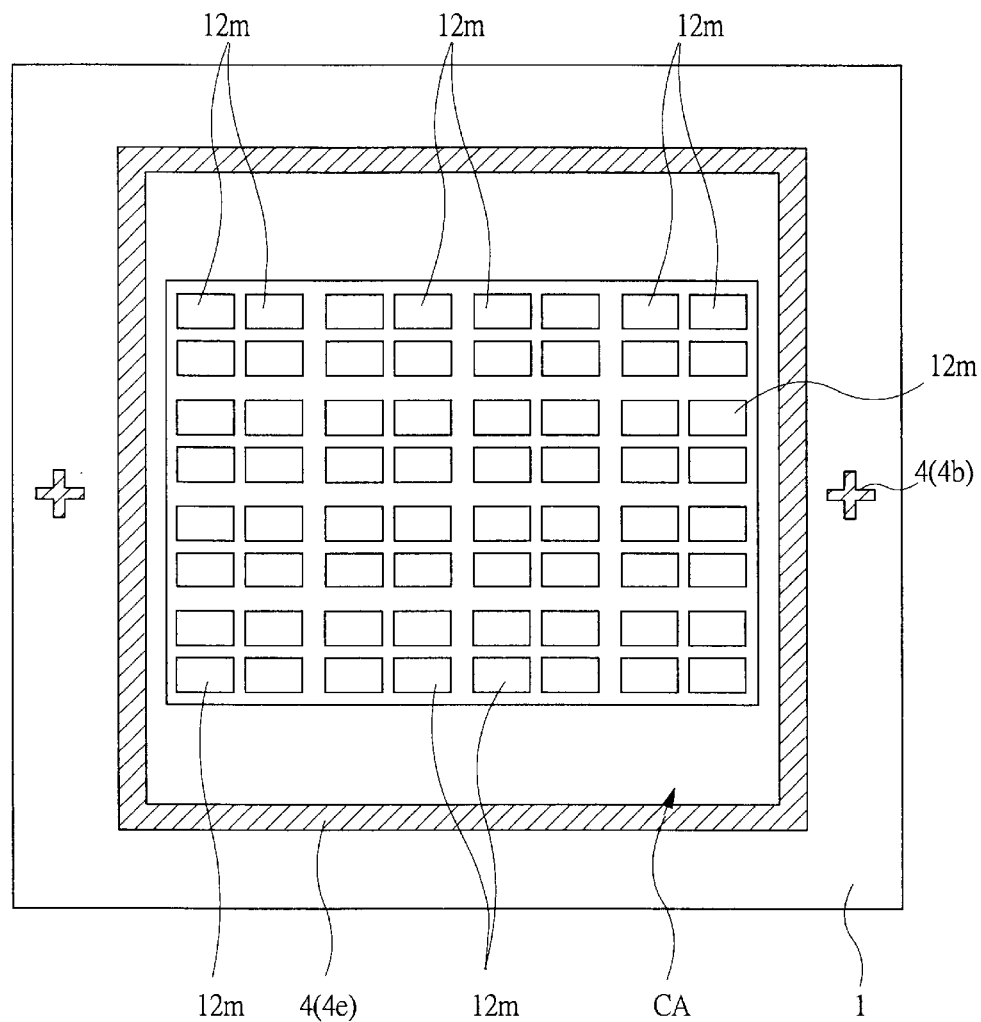
FIG. 37 is a general plan view of an example of the photomask in the manufacturing process, which is used for manufacturing the semiconductor integrated circuit device of FIG. 35.

Next, a method of manufacturing the product mask according to this embodiment will be described. First, a mask substrate for use in the product mask is prepared. In this embodiment, a metal film is not deposited on the integrated circuit pattern region of the mask substrate but the resist film is coated thereon. Subsequently, as shown in FIG. 37, similarly to the first to fourth embodiments, the exposure is performed using the IP mask Mm20 to transfer the pattern of the memory mat onto the resist film of the integrated circuit pattern region CA on the first main surface of the mask substrate 1 for use in the product mask. Pattern transfer regions 12m in FIG. 37 show the regions onto which the pattern of the memory mat is transferred. In this step, the resist film is left as it stands without performing the development.

Figure 38:
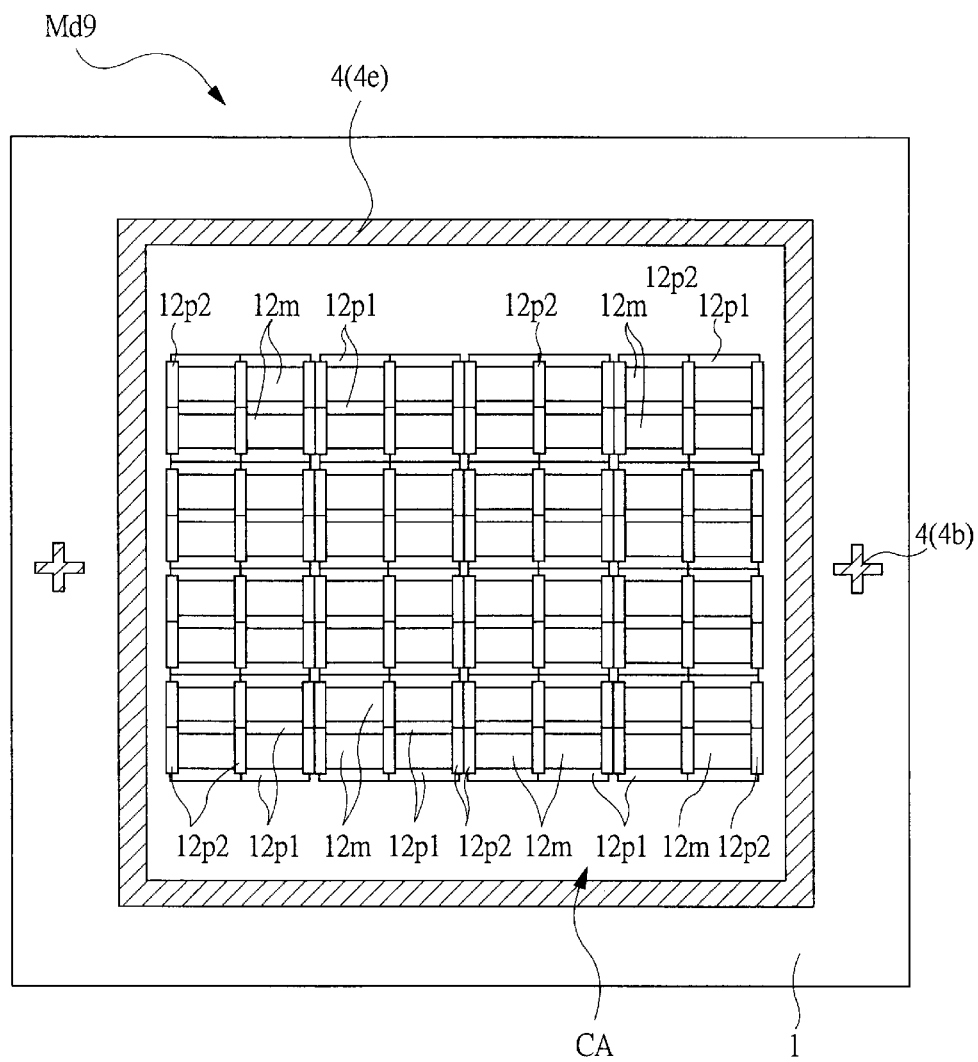
FIG. 38 is a general plan view of an example of the photomask used for manufacturing the semiconductor integrated circuit device of FIG. 35.

Subsequently, as shown in FIG. 38, similarly to the first to fourth embodiments, the patterns of the peripheral circuit regions are written on the resist film on the mask substrate 1 by the exposure using the energy beam such as the electron beam. At the same time, the patterns for connecting the patterns of the peripheral circuit regions to the memory mats are written. Since this exposure is performed to a small area, the manufacturing time is not increased so much and the amount of the writing data can be greatly reduced in comparison to the case where all of the patterns on the mask substrate 1 are written. Pattern transfer regions 12p1 and 12p2 show the regions onto which the patters of the peripheral circuit regions are transferred. Thereafter, by performing the development, the product mask Md9 constituted of the resist mask is manufactured.

According to the embodiment as described above, the following advantages can be obtained in addition to the advantages obtained in the first to third embodiments.

That is, since the pattern of the memory mat 15 is formed by the exposure using the IP mask and the patterns of the peripheral circuit regions 16a and 16b are written using the energy beam such as the electron beam, the space between the memory mat 15 and the peripheral circuit regions 16a and 16b (space to be prepared in advance with taking into consideration the positional dislocation between both of the patterns) can be set small. Specifically, since the memory mats and the peripheral circuit regions can be arranged closely to each other, the chip 5C having the DRAM can be reduced in size.

(Sixth Embodiment)

Figure 39:
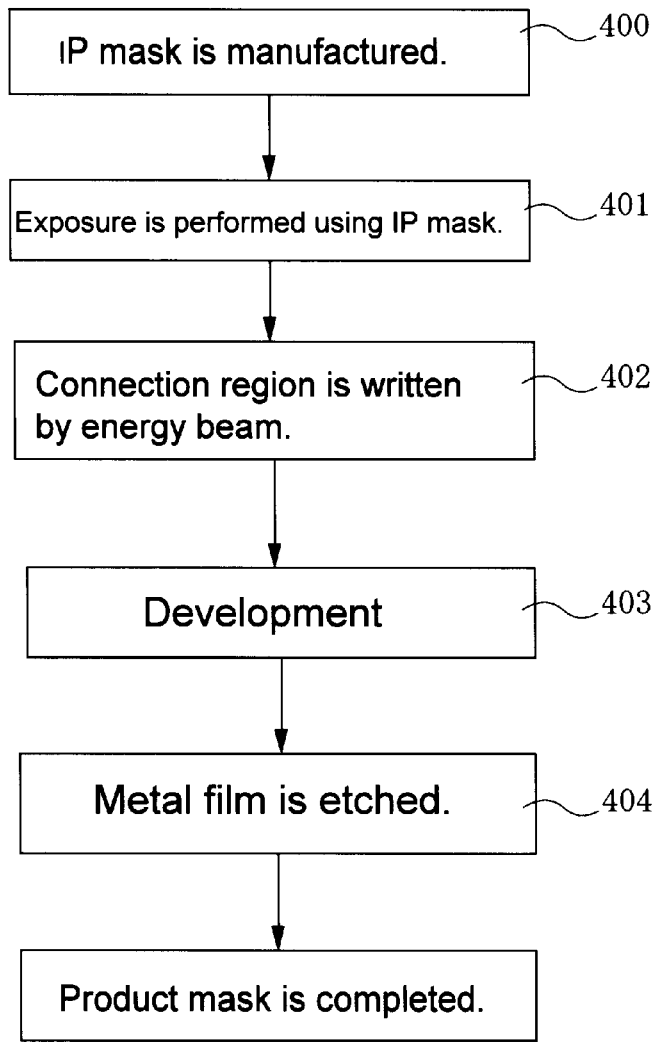
FIG. 39 is a flow chart showing a manufacturing process of the photomask according to still another embodiment of the present invention.
Figure 40A:
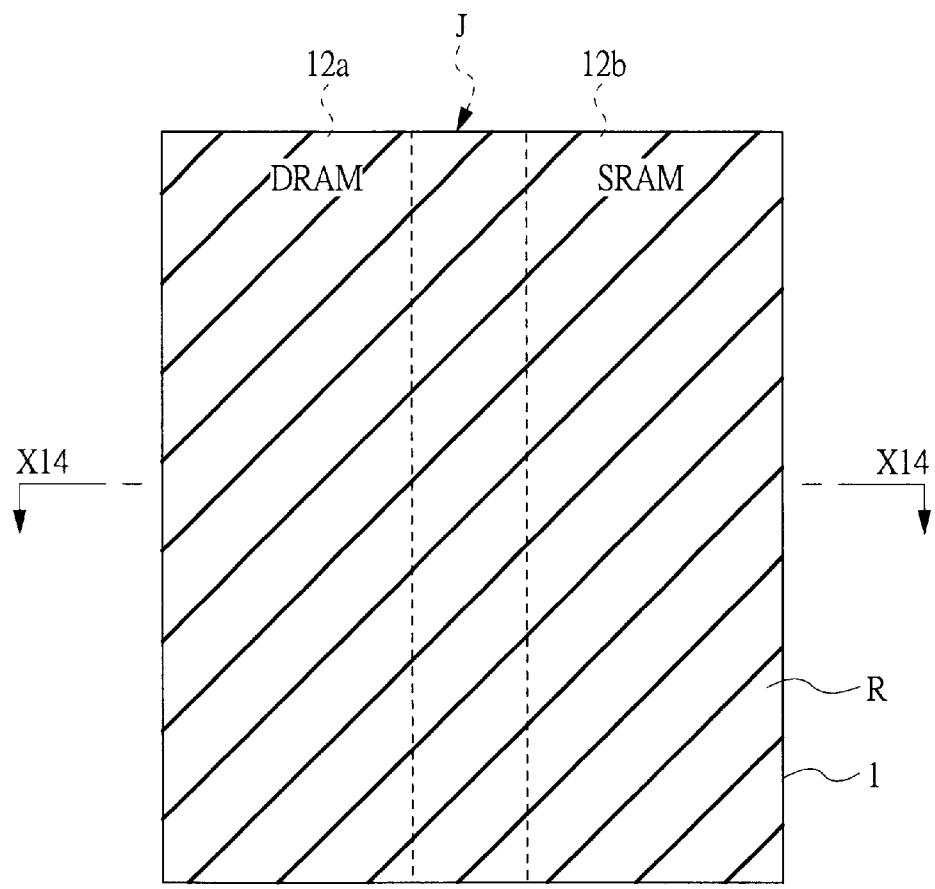
FIG. 40A is a plan view showing the principal portion of the photomask in the manufacturing process of FIG. 39.
Figure 40B:
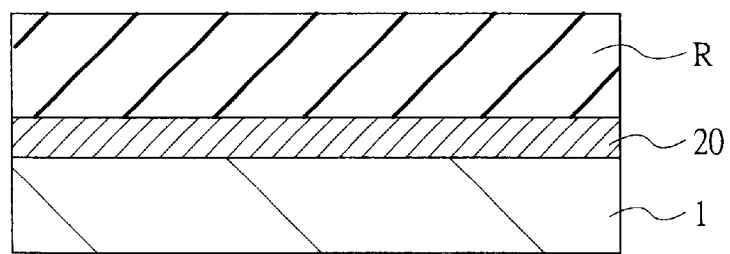
FIG. 40B is a cross-sectional view taken along the line X14—X14 of FIG. 40A.
Figure 41A:
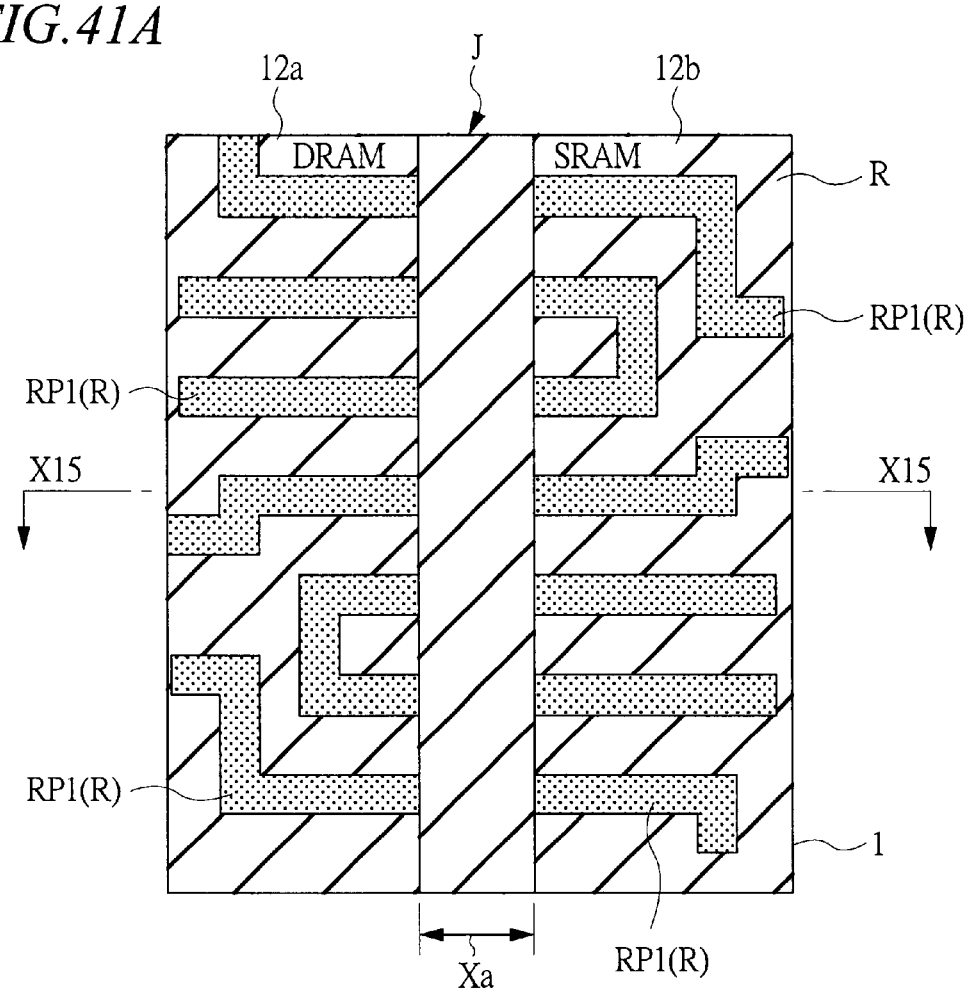
FIG. 41A is a plan view of the principal portion of the photomask in the manufacturing process of FIG. 39, which shows the next step of the step of FIG. 40.
Figure 41B:
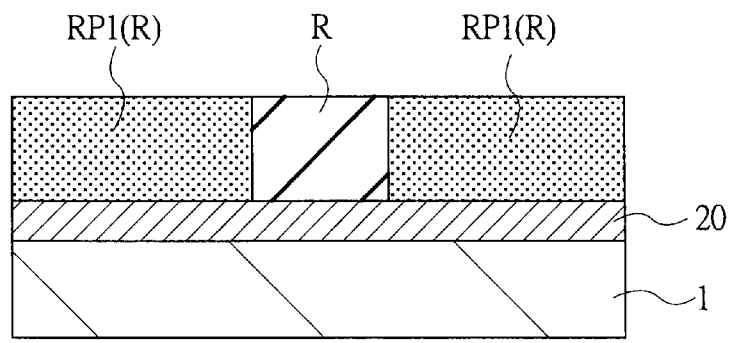
FIG. 41B is a cross-sectional view taken along the line X15—X15 of FIG. 41A.
Figure 42A:
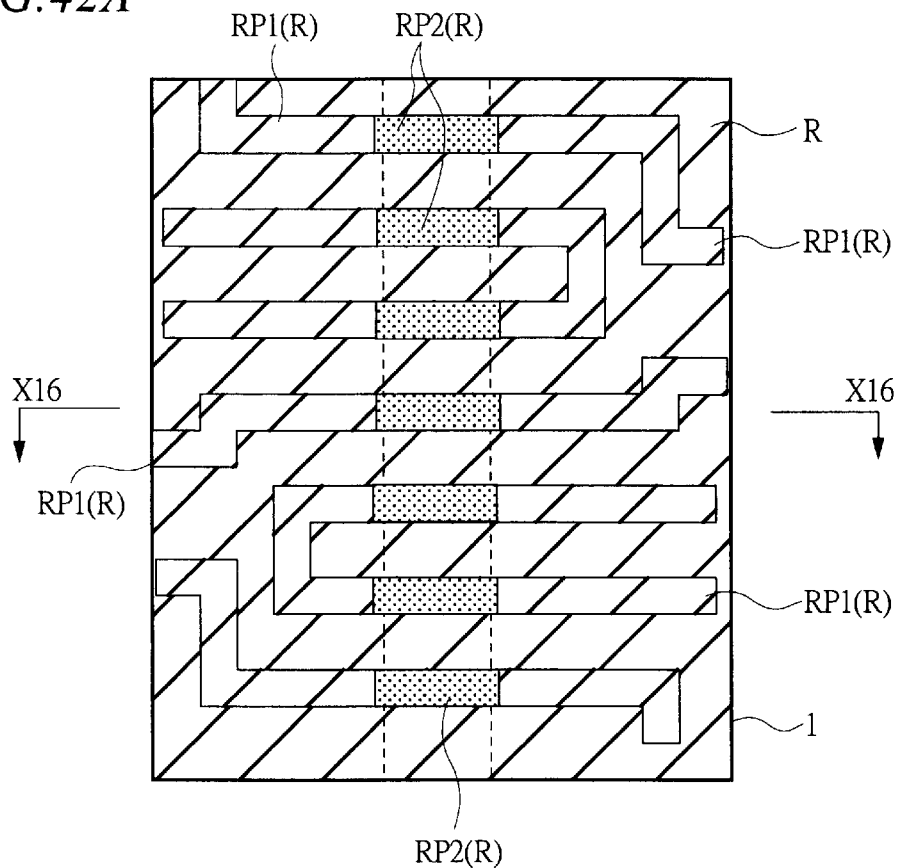
FIG. 42A is a plan view of the principal portion of the photomask in the manufacturing process of FIG. 39, which shows the next step of the step of FIG. 41.
Figure 42B:
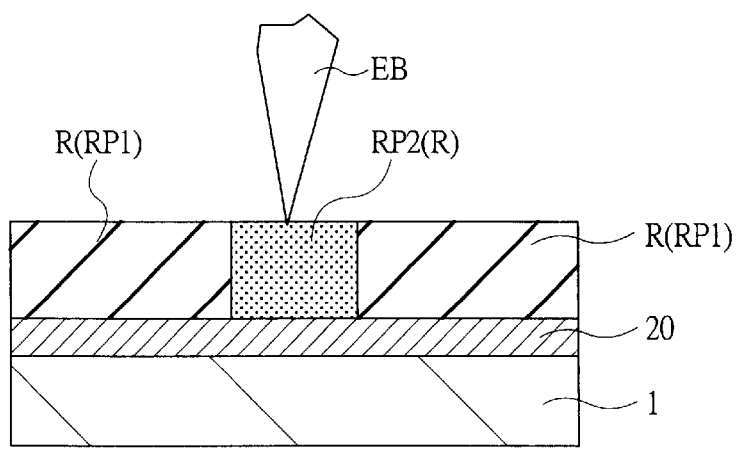
FIG. 42B is a cross-sectional view taken along the line X16—X16 of FIG. 42A.
Figure 43A:
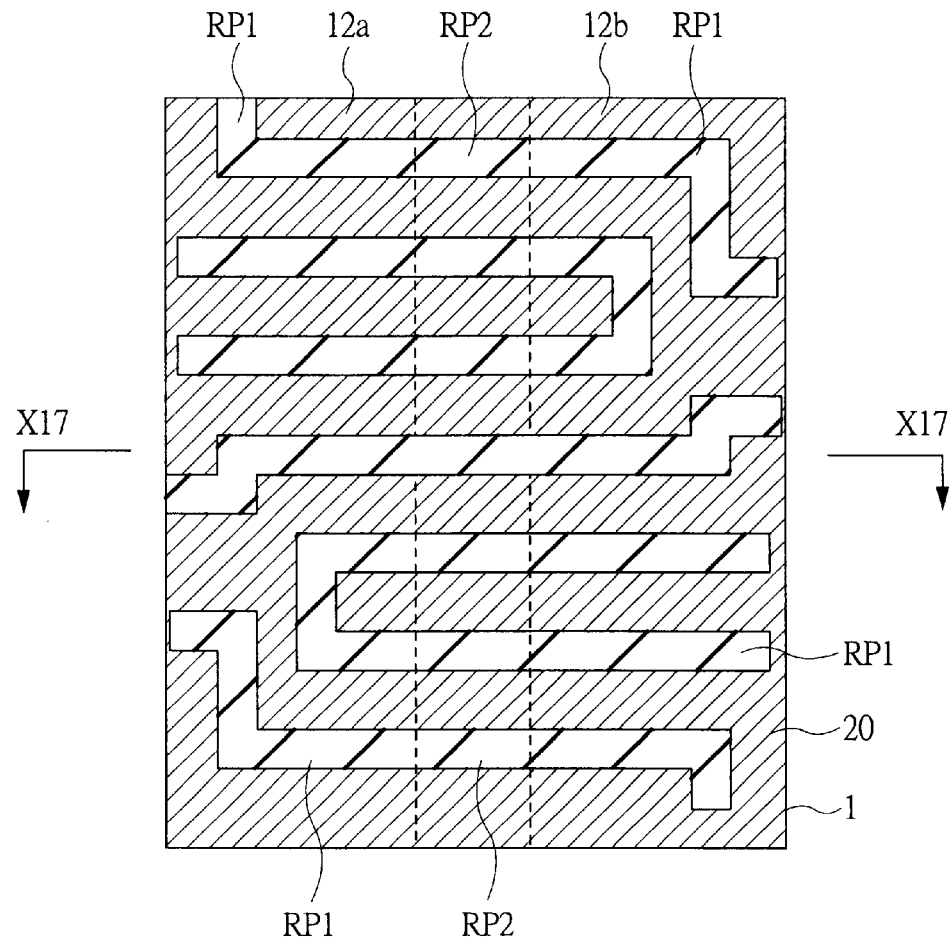
FIG. 43A is a plan view of the principal portion of the photomask in the manufacturing process of FIG. 39, which shows the next step of the step of FIG. 42.
Figure 43B:
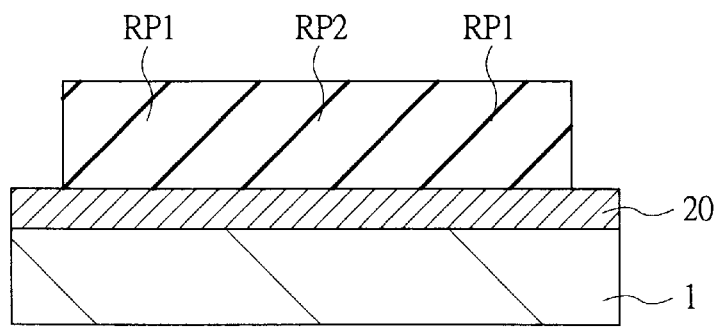
FIG. 43B is a cross-sectional view taken along the line X17—X17 of FIG. 43A.
Figure 44A:
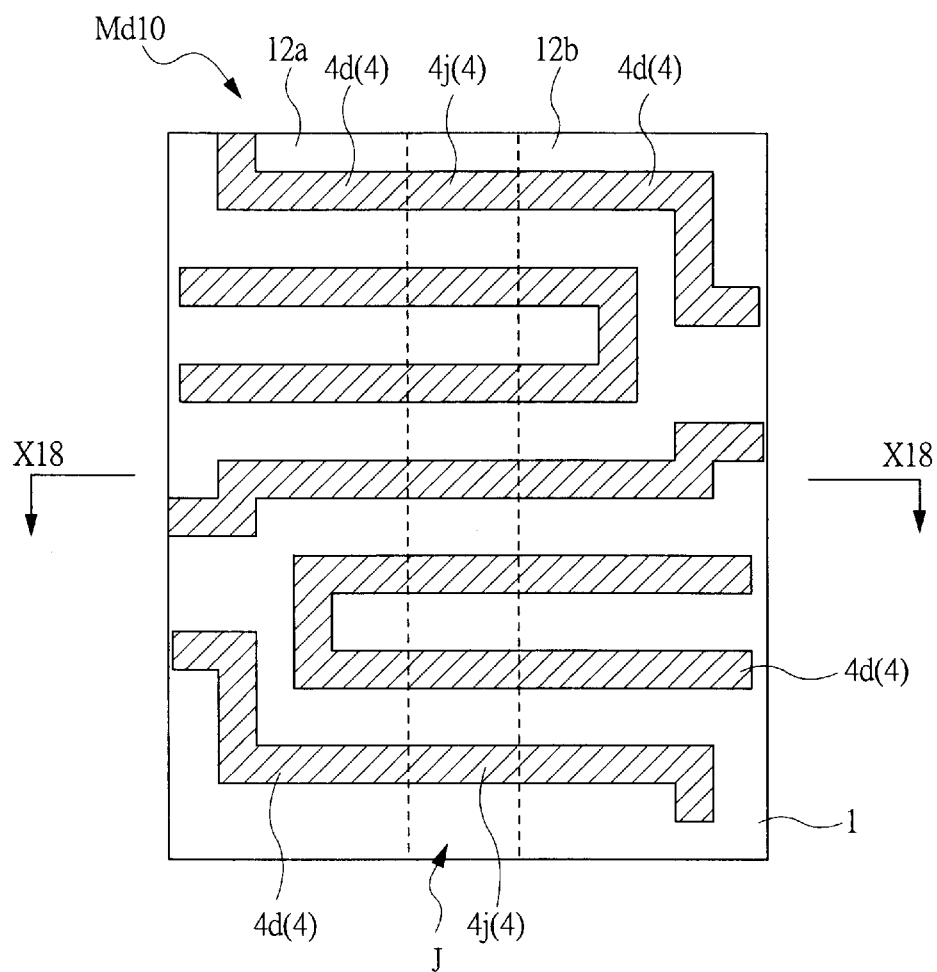
FIG. 44A is a plan view of the principal portion of the photomask in the manufacturing process of FIG. 39, which shows the next step of the step of FIG. 43.
Figure 44B:
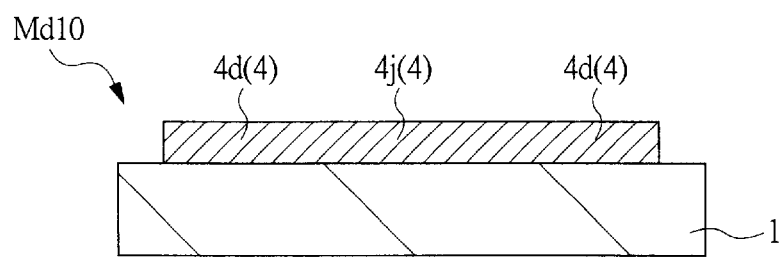
FIG. 44B is a cross-sectional view taken along the line X18—X18 of FIG. 44A.

In this embodiment, the case where the product mask is constituted of the normal mask will be described along the process shown in FIG. 39 with reference to FIGS. 40 to 45. Note that FIGS. 40A, 41A, 42A, 43A, and 44A are enlarged plan views of the connection region J of the product mask under fabrication, and FIGS. 40B, 41B, 42B, 43B, and 44B are cross-sectional views taken along the lines X14—X14, X15—X15, X16—X16, X17—X17, and X18—X18 of FIGS. 40A, 41A, 42A, 43A, and 44A, respectively. Also, in FIGS. 40 to 45, metal films are hatched with the relatively thin lines, and organic films are hatched with the relatively thick lines even in the plan views so as to make the drawings easy to see.

First, similarly to the first to fifth embodiments, a set of IP masks are manufactured. The set of IP masks may be the set of the resist masks, the normal masks, or the combination thereof (step 400).

Next, the mask substrate for use in the product mask is prepared. FIG. 40 shows the mask substrate. A light-shielding film 20 made of the metal film is deposited on the entire surface of the first main surface of the mask substrate 1, and for example, the electron beam resist film R is coated thereon.

Thereafter, the mask substrate 1 is placed on the sample stage E11 of the exposure apparatus EXP, and the set of IP masks are set in turn on the mask stage E10 of the exposure apparatus EXP. Then, the electron beam resist film R of the mask substrate 1 is subject to the exposure similarly to the foregoing. FIG. 41 shows the state after this exposure. Resist pattern RP1 hatched in different way on the electron beam resist film R indicates the portion to which the exposure is performed. In this exposure, similarly to the first to fifth embodiments, the adjacent pattern transfer regions 12a and 12b are arranged so as to form a space (connection region J) of distance Xa therebetween (between the boundaries thereof) (step 401).

Subsequently, the mask substrate 1 is set on the electron beam writing apparatus and the energy beam such as the electron beam is selectively irradiated onto the connection region J similarly to the first to fifth embodiments, thereby writing the pattern serving as the connection pattern between the patterns of the adjacent pattern transfer regions. FIG. 42 shows the state in this step. Resist pattern RP2 hatched in the different way on the electron beam resist film R indicates the portion where the pattern is written by the energy beam EB (step 402).

Next, the electron beam resist film R on this mask substrate 1 is subject to the development, thereby forming the resist patterns RP1 and RP2 on the light-shielding film 20 of the mask substrate 1 as shown in FIG. 43 (step 403). Thereafter, the lower light-shielding film 20 is patterned using the resist patterns RP1 and RP2 as etching masks, thereby forming the light-shielding patterns 4d and 4j made of metal on the first main surface of the mask substrate 1 as shown in FIG. 44 (step 404). Thus, a product mask Md10 is manufactured.

Figure 45:
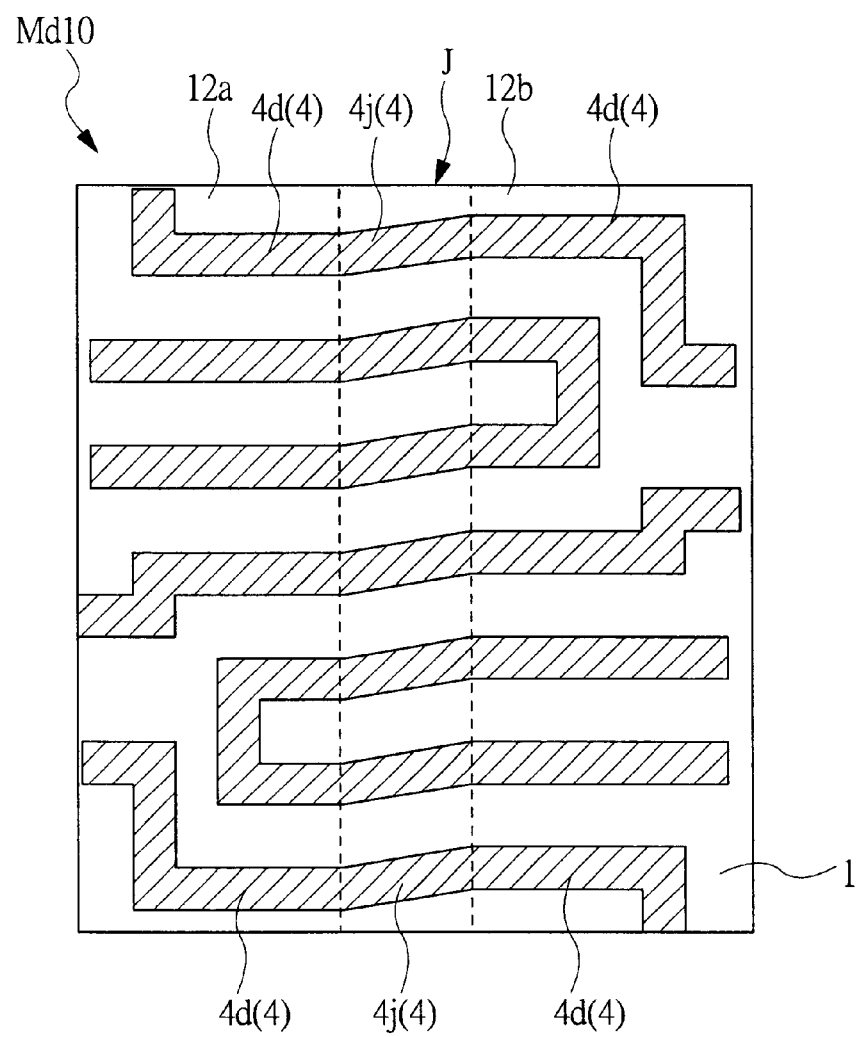
FIG. 45 is an enlarged plan view showing the principal portion of the photomask manufactured in the manufacturing process of FIG. 39.

According to the embodiment as described above, even if the different pattern transfer regions 12a and 12b of the product mask Md10 are dislocated from each other, the pattern for compensating the dislocation is written by the energy beam. Therefore, the light-shielding patterns 4d and 4d of the pattern transfer regions 12a and 12b can be appropriately connected to each other. FIG. 45 shows an example where the present invention is applied to the case where the pattern transfer regions 12a and 12b are dislocated from each other in two dimensions. FIG. 45A is an enlarged plan view of the connection region J of the product mask Md10. In this example, the two-dimensional positions of the light-shielding patterns 4d and 4d of the pattern transfer regions 12a and 12b are dislocated from each other in the longitudinal direction of FIG. 45. However, the light-shielding patterns 4d are appropriately connected to each other by the light-shielding patterns 4j (4) in the connection region J. Therefore, if the pattern is transferred onto the resist film on the wafer using this product mask Md10, the resist pattern can be transferred onto the wafer without creating any thinner portion and thicker portion in the position corresponding to the connection region J.

In the foregoing, the invention made by the inventors of the present invention has been concretely described based on the embodiments. However, it is needless to say that the present invention is not limited to the foregoing embodiments and various modifications and alterations can be made without departing from the scope of the present invention.

For example, after forming the light-shielding pattern made of an organic film by the development, a so-called hardening treatment such as heat treatment and irradiation of the intense ultraviolet rays in advance may be performed to the resist film with the aim to improve the resistance to the exposure light irradiation.

Also, in the foregoing first to sixth embodiments, the case where the pattern made of an organic film on the mask substrate is used as the light-shielding pattern has been described. However, the present invention is not limited to this. Specifically, the pattern made of an organic film can be used as a light-reducing pattern or a halftone pattern.

Also, in the fifth embodiment, the case where the present invention is applied to the method of manufacturing DRAM has been described. However, the present invention is not limited to this. For example, the present invention can be applied to the methods of manufacturing other memories such as SRAM, mask ROM, and flash memory (EEPROM). Also in these cases, the memory mat and the peripheral circuit region are exposed in different ways as described in the fifth embodiment.

In the foregoing description, description has been made mainly to the case where the present invention made by the inventors thereof is applied to the method of manufacturing a semiconductor integrated circuit device, which is an application field of the present invention and is a background of the same. However, the present invention is not limited to this and the present invention can be applied to, for example, the methods of manufacturing a liquid crystal panel, a disk array, or a micro machine.

The advantages achieved by the typical ones of the inventions disclosed in this application will be briefly described as follows.

(1) According to the present invention, since a step of transferring a first pattern onto a photosensitive organic film of a second mask by the reduced projection exposure using a first mask and a step of transferring a second pattern by the exposure using an energy beam onto the photosensitive organic film of the second mask between the regions transferred using the first mask are performed, the pattern for connecting the patterns transferred using the first mask can be formed by the exposure using the energy beam. Therefore, the reliability of the connection between the patterns can be improved, which makes it possible to provide the second mask having the improved reliability.

(2) According to the present invention, since a step of transferring a first pattern onto a photosensitive organic film of a second mask by the reduced projection exposure using a first mask and a step of transferring a second pattern by the exposure using an energy beam onto the photosensitive organic film of the second mask between the regions transferred using the first mask are performed, it becomes possible to provide the second mask having the improved reliability. Therefore, the reliability of the connection between the patterns of the different circuit regions can be improved. Consequently, the reliability of the semiconductor integrated circuit device can be improved.

(3) According to the present invention, since a step of transferring a first pattern onto a photosensitive organic film of a second mask by the reduced projection exposure using a first mask and a step of transferring a second pattern by the exposure using an energy beam onto the photosensitive organic film of the second mask between the regions transferred using the first mask are performed, it becomes possible to provide the second mask having the improved reliability. Therefore, the reliability of the connection between the patterns of the different circuit regions can be improved. Consequently, the defect rate of the semiconductor integrated circuit device can be improved.

What is claimed is:

1. A method of manufacturing a photomask, comprising:
   (a) a step of preparing one or more first photomasks;
   (b) a step of preparing one mask substrate of a second photomask;
   (c) a step of depositing a photosensitive organic film on said one mask substrate of the second photomask;
   (d) a first exposure step in which the reduced projection exposure using each of said one or more first photomasks is performed to said photosensitive organic film on said one mask substrate of the second photomask, thereby transferring a first pattern onto each of a plurality of first regions arranged in integrated circuit pattern regions of said photosensitive organic film on said second photomask;
   (e) a second exposure step in which an energy beam is selectively irradiated onto each of second regions arranged around said plurality of first regions on said photosensitive organic film, thereby transferring a second pattern onto said photosensitive organic film; and
   (f) a step of performing the development to said photosensitive organic firm, thereby forming said first and second patterns made of said photosensitive organic films on said second photomask.

2. The method of manufacturing a photomask according to claim 1, wherein said second pattern in the second region is a pattern for connecting said first patterns of said first regions adjacent to each other.

3. The method of manufacturing a photomask according to claim 1, wherein said first pattern in the first region is a pattern to be transferred to form a pattern of a memory region, and said second pattern in the second region comprises a pattern to be transferred to form a pattern of a peripheral circuit region of said memory region; and a pattern for connecting the first patterns in said first regions adjacent to each other.

4. The method of manufacturing a photomask according to claim 1, wherein a pattern made of an organic film having light-shielding properties or light-reducing properties to said exposure light in the first exposure step is arranged in each of integrated circuit pattern regions of said one or more first photomasks.

5. The method of manufacturing a photomask according to claim 1, wherein light having a wavelength of 248 nm or shorter is used as said exposure light in the first exposure step.

6. The method of manufacturing a photomask according to claim 5, wherein said energy beam is an electron beam.

7. The method of manufacturing a photomask according to claim 1, wherein i-beam is used as said exposure light in the first exposure step.

8. The method of manufacturing a photomask according to claim 7, wherein said energy beam is a laser.

9. A method of manufacturing a photomask, comprising:
   (a) a step of preparing a set of one or more first photomasks;
   (b) a step of preparing one mask substrate of a second photomask;
   (c) a step of depositing a metal film on said one mask substrate of the second photomask;
   (d) a step of depositing a photosensitive first organic film on said metal film;
   (e) a first exposure step in which reduced projection exposure using each of said one or more first photomasks is performed to said first organic film on said one mask substrate of the second photomask, thereby transferring a first pattern onto each of a plurality of first regions arranged in integrated circuit pattern regions of said organic film on said second photomask;
   (f) a step of performing development to said first organic film, thereby forming a pattern of said first organic film;
   (g) a step of performing etching to said metal film using said pattern of the first organic film as a mask, thereby forming a light-shielding pattern made of a metal film in at least one of said plurality of first regions;
   (h) a step of depositing a photosensitive second organic film on said mask substrate of the second photomask after said step (g);
   (i) a second exposure step in which an energy beam is selectively irradiated onto second regions arranged around said plurality of first regions on said second organic film, thereby transferring a second pattern onto said second organic film; and
   (j) a step of performing development to said second organic film, thereby forming a pattern of said second organic film on said second photomask.

10. The method of manufacturing a photomask according to claim 9, wherein said second pattern in the second region is a pattern for connecting the first patterns in said first regions adjacent to each other.

11. The method of manufacturing a photomask according to claim 9, wherein said first pattern in the first region is a pattern to be transferred to form a pattern of a memory region, and said second pattern in the second region comprises a pattern to be transferred to form a pattern of a peripheral circuit region of said memory region; and a pattern for connecting the first patterns in said first regions adjacent to each other.

12. The method of manufacturing a photomask according to claim 9, wherein a pattern made of an organic film having light-shielding properties or light-reducing properties to said exposure light in the first exposure step is arranged in each of integrated circuit pattern regions of said one or more first photomasks.

13. The method of manufacturing a photomask according to claim 9, wherein light having a wavelength of 248 nm or shorter is used as said exposure light in the first exposure step.

14. The method of manufacturing a photomask according to claim 13, wherein said energy beam is an electron beam.

15. The method of manufacturing a photomask according to claim 9, wherein i-beam is used as said exposure light in the first exposure step.

16. The method of manufacturing a photomask according to claim 15, wherein said energy beam is a laser.

17. A method of manufacturing a photomask, comprising:

(a) a step of preparing a set of first photomasks;

(b) a step of preparing one mask substrate of a second photomask;

(c) a step of depositing a metal film on said one mask substrate of the second photomask;

(d) a step of depositing a photosensitive first organic film on said metal film; p1 (e) a first mask-exposure step in which reduced projection exposure using each of said one or more first photomasks is performed to said first organic film on said one mask substrate of the second photomask, thereby transferring a pattern onto each of a plurality of first regions arranged in integrated circuit pattern regions of said first organic film on said second photomask;

(f) a step of performing development to said first organic film, thereby forming a pattern of said first organic film;

(g) a step of performing etching to said metal film using said pattern of the first organic film as a mask, thereby forming a light-shielding pattern made of a metal film in at least one of said plurality of first regions, and forming a third region, in which the mask substrate having no metal film is exposed, in at least one of said plurality of first regions;

(h) a step of depositing a photosensitive second organic film on said mask substrate of the second photomask after said step (g);

(i) a second mask-exposure step in which reduced projection exposure using a predetermined one of said plurality of first photomask is performed to said second organic film on said one mask substrate of the second photomask, thereby transferring a first pattern onto said second organic film in said third region of said second photomask;

(j) a beam exposure step in which an energy beam is selectively irradiated onto second regions arranged around said plurality of first regions on said second organic film, thereby transferring a second pattern onto said second organic film; and (k) a step of performing development to said second organic film, thereby forming a pattern of said second organic film on said second photomask.

18. The method of manufacturing a photomask according to claim 17, wherein said steps (h) to (k) are performed again after removing the first and second patterns of said second organic film.

19. The method of manufacturing a photomask according to claim 17, wherein the second pattern of the second organic film formed in said second region is a pattern for connecting the first and third patterns adjacent to each other.

20. The method of manufacturing a photomask according to claim 17, wherein said pattern in the first region is a pattern to be transferred to form a pattern of a first circuit, the first pattern in said third region is a pattern to be transferred to form a pattern of a second circuit, and the second pattern in said second region is a pattern for connecting the patterns of said first and third regions adjacent to each other.

21. The method of manufacturing a photomask according to claim 17, wherein a pattern made of an organic film having light-shielding properties or light-reducing properties to said exposure light in the first exposure step is arranged in each of integrated circuit pattern regions of said one or more first photomasks.

22. The method of manufacturing a photomask according to claim 17, wherein light having a wavelength of 248 nm or shorter is used as said exposure light in the first exposure step.

23. The method of manufacturing a photomask according to claim 22, wherein said energy beam is an electron beam.

24. The method of manufacturing a photomask according to claim 17, wherein i-beam is used as said exposure light in the second exposure step.

25. The method of manufacturing a photomask according to claim 24, wherein said energy beam is a laser.

26. A method of manufacturing a photomask, comprising:

(a) a step of preparing a set of first photomasks;

(b) a step of preparing one mask substrate of a second photomask;

(c) a step of depositing a metal film on said one mask substrate of the second photomask;

(d) a step of depositing a photosensitive organic film on said metal film;

(e) a first exposure step in which reduced projection exposure using each of said one or more first photomasks is performed to said organic film on said one mask substrate of the second photomask, thereby transferring a first pattern onto each of a plurality of first regions arranged in integrated circuit pattern regions of said organic film on said second photomask;

(f) a second exposure step in which an energy beam is selectively irradiated onto each of second regions arranged around said plurality of first regions on said organic film, thereby transferring a second pattern onto said organic film;

(g) a step of performing development to said organic film, thereby forming the first and second patterns of said organic film; and (h) a step of performing etching to said metal film using the first and second patterns of said organic film as masks, thereby forming a light-shielding pattern made of a metal film in said first and second regions.

27. The method of manufacturing a photomask according to claim 26, wherein the light-shielding pattern formed in said second region is a pattern for connecting the light-shielding patterns in said first regions adjacent to each other.

28. The method of manufacturing a photomask according to claim 26, wherein said light-shielding pattern in the first region is a pattern to be transferred to form a pattern of a memory region, and said light-shielding pattern in the second region comprises a pattern to be transferred to form a pattern of a peripheral circuit region of said memory region; and a pattern for connecting the light-shielding patterns in said first regions adjacent to each other.

29. The method of manufacturing a photomask according to claim 26, wherein a pattern made of an organic film having light-shielding properties or light-reducing properties to said exposure light in the first exposure step is arranged in each of integrated circuit pattern regions of said one or more first photomasks.

30. The method of manufacturing a photomask according to claim 26, wherein light having a wavelength of 248 nm or shorter is used as said exposure light in the first exposure step.

31. The method of manufacturing a photomask according to claim 30, wherein said energy beam is an electron beam.

32. The method of manufacturing a photomask according to claim 26, wherein i-beam is used as said exposure light in the first exposure step.

33. The method of manufacturing a photomask according to claim 32, wherein said energy beam is a laser.

34. A method of manufacturing a semiconductor integrated circuit device, comprising:

(a) a step of preparing one or more first photomasks;

(b) a step of preparing one mask substrate of a second photomask;

(c) a step of depositing a photosensitive organic film on said one mask substrate of the second photomask;

(d) a first exposure step in which reduced projection exposure using each of said one or more first photomasks is performed to said photosensitive organic film on said one mask substrate of the second photomask, thereby transferring a first pattern onto each of a plurality of first regions arranged in integrated circuit pattern regions of said photosensitive organic film on said second photomask;

(e) a second exposure step in which an energy beam is selectively irradiated onto each of second regions arranged around said plurality of first regions on said photosensitive organic film, thereby transferring a second pattern onto said photosensitive organic film;

(f) a step of performing development to said photosensitive organic firm, thereby forming said first and second patterns made of said photosensitive organic films on said second photomask; and (g) a step of transferring the pattern of said second photomask onto a semiconductor wafer by the reduced projection exposure.

35. A method of manufacturing a semiconductor integrated circuit device, comprising:

(a) a step of preparing a set of one or more first photomasks;

(b) a step of preparing one mask substrate of a second photomask;

(c) a step of depositing a metal film on said one mask substrate of the second photomask;

(d) a step of depositing a photosensitive first organic film on said metal film;

(e) a first exposure step in which reduced projection exposure using each of said one or more first photomasks is performed to said first organic film on said one mask substrate of the second photomask, thereby transferring a first pattern onto each of a plurality of first regions arranged in integrated circuit pattern regions of said first organic film on said second photomask;

(f) a step of performing development to said first organic film, thereby forming a pattern of said first organic film;

(g) a step of performing etching to said metal film using said pattern of the first organic film as a mask, thereby forming a light-shielding pattern made of a metal film in at least one of said plurality of first regions;

(h) a step of depositing a photosensitive second organic film on said mask substrate of the second photomask after said step (g);

(i) a second exposure step in which an energy beam is selectively irradiated onto second regions arranged around said plurality of first regions on said second organic film, thereby transferring a second pattern onto said second organic film;

(j) a step of performing development to said second organic film, thereby forming a pattern of said second organic film on said second photomask; and (k) a step of transferring the pattern of said second photomask onto a semiconductor wafer by reduced projection exposure.

36. A method of manufacturing a semiconductor integrated circuit device, comprising:

(a) a step of preparing a set of first photomasks;

(b) a step of preparing one mask substrate of a second photomask;

(c) a step of depositing a metal film on said one mask substrate of the second photomask;

(d) a step of depositing a photosensitive first organic film on said metal film;

(e) a first mask-exposure step in which reduced projection exposure using each of said one or more first photomasks is performed to said first organic film on said one mask substrate of the second photomask, thereby transferring a pattern onto each of a plurality of first regions arranged in integrated circuit pattern regions of said first organic film on said second photomask;

(f) a step of performing development to said first organic film, thereby forming a pattern of said first organic film;

(g) a step of performing etching to said metal film using said pattern of the first organic film as a mask, thereby forming a light-shielding pattern made of a metal film in at least one of said plurality of first regions, and forming a third region, in which the mask substrate having no metal film is exposed, in at least one of said plurality of first regions;

(h) a step of depositing a photosensitive second organic film on said mask substrate of the second photomask after said step (g);

(i) a second mask-exposure step in which reduced projection exposure using a predetermined one of said plurality of first photomask is performed to said second organic film on said one mask substrate of the second photomask, thereby transferring a first pattern onto said second organic film in said third region of said second photomask;

(j) a beam exposure step in which an energy beam is selectively irradiated onto second regions arranged around said plurality of first regions on said second organic film, thereby transferring a second pattern onto said second organic film;

(k) a step of performing development to said second organic film, thereby forming a pattern of said second organic film on said second photomask; and (l) a step of transferring the pattern of said second photomask onto a semiconductor wafer by the reduced projection exposure.

37. A method of manufacturing a semiconductor integrated circuit device, comprising:

(a) a step of preparing a set of first photomasks;

(b) a step of preparing one mask substrate of a second photomask;

(c) a step of depositing a metal film on said one mask substrate of the second photomask;

(d) a step of depositing a photosensitive first organic film on said metal film;

(e) a first exposure step in which reduced projection exposure using each of said one or more first photomasks is performed to said organic film on said one mask substrate of the second photomask, thereby transferring a first pattern onto each of a plurality of first regions arranged in integrated circuit pattern regions of said organic film on said second photomask;

(f) a second exposure step in which an energy beam is selectively irradiated onto each of second regions arranged around said plurality of first regions on said organic film, thereby transferring a second pattern onto said organic film;

(g) a step of performing development to said organic film, thereby forming the first and second patterns of said organic film;

(h) a step of performing etching to said metal film using the first and second patterns of said organic film as masks, thereby forming a light-shielding pattern made of a metal film in said first and second regions; and (i) a step of transferring the pattern of said second photomask onto a semiconductor wafer by the reduced projection exposure.

* * * * *